US011971383B1

(12) United States Patent
Claussen et al.

(10) Patent No.: US 11,971,383 B1
(45) Date of Patent: Apr. 30, 2024

(54) ENHANCED 3D POROUS ARCHITECTURED ELECTROACTIVE DEVICES VIA IMPREGNATED POROGENS

(71) Applicant: Iowa State University Research Foundation, Inc., Ames, IA (US)

(72) Inventors: Jonathan Claussen, Ames, IA (US); John Hondred, Ames, IA (US)

(73) Assignee: Iowa State University Research Foundation, Inc., Ames, IA (US)

( * ) Notice: Subject to any disclaimer, the term of this patent is extended or adjusted under 35 U.S.C. 154(b) by 978 days.

(21) Appl. No.: 16/602,691

(22) Filed: Nov. 20, 2019

Related U.S. Application Data

(60) Provisional application No. 62/769,953, filed on Nov. 20, 2018.

(51) Int. Cl.
*G01N 27/30* (2006.01)
*C23C 16/02* (2006.01)
(Continued)

(52) U.S. Cl.
CPC ....... *G01N 27/308* (2013.01); *C23C 16/0263* (2013.01); *C23F 1/02* (2013.01);
(Continued)

(58) Field of Classification Search
CPC .. G01N 27/308; G01N 27/3271; H01G 11/26; H01G 11/36; H01G 11/44;
(Continued)

(56) References Cited

U.S. PATENT DOCUMENTS 6,998,148 B1 * 2/2006 You ................. H01L 21/31695
427/372.2
7,923,064 B2 * 4/2011 Pelrine ............... H01L 41/047
427/282

(Continued)

FOREIGN PATENT DOCUMENTS

WO WO-2017173439 A2 * 10/2017 ............. A61K 47/02

OTHER PUBLICATIONS

Cheng et al., "3D nanostructured inkjet printed graphene via UV-pulsed laser irradiation enables paper-based electronics and electrochemical devices", Nanoscale, vol. 8, No. 35, pp. 15825-16074, Sep. 21, 2016.

(Continued)

*Primary Examiner* — Brian K Talbot
(74) *Attorney, Agent, or Firm* — McKee, Voorhees & Sease, PLC

(57) ABSTRACT

The invention relates to a method of patterning a substrate with graphene-based or other electroactive-material-based solution that includes solid-phase particles as hard templates, reducing the solution, and processing the reduced solution to expose the particles. The exposed hard template particles are removed to leave a three-dimensional (3D) porous architecture that can be beneficially used for a variety of applications, including but not limited to bio sensors and supercapacitors. In one example, the exposure is by etching with a $CO_2$ laser. The method can be practiced with scalable MEMS fabrication technologies.

24 Claims, 40 Drawing Sheets
(38 of 40 Drawing Sheet(s) Filed in Color)

(51) Int. Cl.

| | |
|---|---|
| *C23F 1/02* | (2006.01) |
| *G01N 27/327* | (2006.01) |
| *H01G 11/26* | (2013.01) |
| *H01G 11/36* | (2013.01) |
| *H01G 11/44* | (2013.01) |
| *H01G 11/86* | (2013.01) |
| *B05D 3/02* | (2006.01) |
| *B05D 3/06* | (2006.01) |
| *B05D 3/10* | (2006.01) |
| *B05D 5/02* | (2006.01) |

(52) U.S. Cl.
CPC ......... *G01N 27/3271* (2013.01); *H01G 11/26* (2013.01); *H01G 11/36* (2013.01); *H01G 11/44* (2013.01); *H01G 11/86* (2013.01); *B05D 3/0254* (2013.01); *B05D 3/065* (2013.01); *B05D 3/107* (2013.01); *B05D 5/02* (2013.01)

(58) Field of Classification Search
CPC .. H01G 11/86; C23C 16/0263; B05D 3/0254; B05D 3/065; B05D 3/107; B05D 5/02
USPC ........................................................ 427/455
See application file for complete search history.

(56) References Cited

U.S. PATENT DOCUMENTS

| | | | |
|---|---|---|---|
| 9,437,372 B1* | 9/2016 | Zhamu | C04B 38/02 |
| 11,456,463 B1* | 9/2022 | Lee | B33Y 10/00 |
| 2013/0180920 A1* | 7/2013 | Sivaniah | B01D 67/003 |
| | | | 210/500.21 |
| 2015/0279667 A1* | 10/2015 | Canaperi | H01L 21/02274 |
| | | | 438/778 |
| 2017/0290708 A1* | 10/2017 | Rapp | A61F 13/00055 |
| 2018/0142114 A1* | 5/2018 | Duan | C09D 11/322 |
| 2021/0387139 A1* | 12/2021 | Voskian | H01M 50/449 |

OTHER PUBLICATIONS

Claussen et al., "Nanostructuring Platinum Nanoparticles on Multilayered Graphene Petal Nanosheets for Electrochemical Biosensing", Advanced Functional Materials, vol. 22, pp. 3399-3405, 2012.
Hondred et al., "Printed Graphene Electrochemical Biosensors Fabricated by Inkjet Maskless Lithography for Rapid and Sensitive Detection of Organophosphates", ACS Appl. Mater. Interfaces, vol. 10, pp. 11125-11134, 2018.
Hondred et al., "High Resolution Graphene Films for Electrochemical Sensing via Inkjet Maskless Lithography", ACS Nano, vol. 11, pp. 9836-9845, 2017.
Hondred et al., "Enhanced electrochemical biosensor and supercapacitor with 3D porous architectured graphene via salt impregnated inkjet maskless lithography", Nanosclae Horizons, vol. 4, pp. 735-746, Jan. 31, 2019.
Hondred et al., "Enhanced electrochemical biosensor and supercapacitor with 3D porous architectured graphene via salt impregnated inkjet maskless lithography", Nanoscale Horizons, Supplemental Information, 9 pages, Jan. 31, 2019.
Li et al., "All-solid-state micro-supercapacitors based on inkjet printed graphene electrodes", Applied Physics Letters, vol. 109, 5 pages, 2016.
Pedrosa et al., "Enhanced stability of enzyme organophosphate hydrolase interfaced on the carbon nanotubes", Colloids and Surfaces B: Biointerfaces, vol. 77, pp. 69-74, Jan. 21, 2010.
Staros et al., "Enhancement by N-Hydroxysulfosuccinimide of Water-Soluble Carbodiimide-Mediated Coupling Reactions", Analytical Biochemistry, vol. 156, pp. 220-232, Feb. 20, 1986.

* cited by examiner

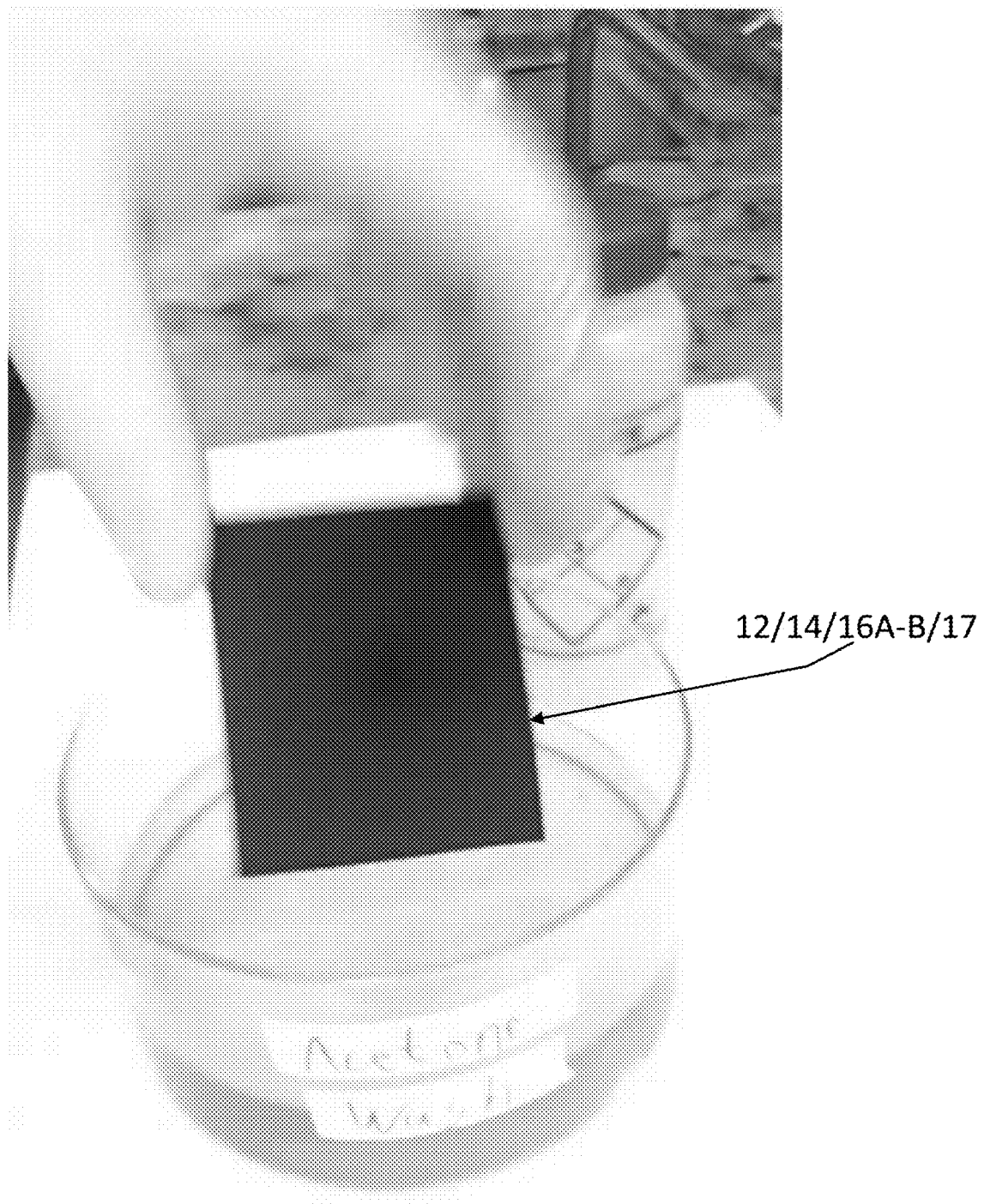
FIG. 16A (at frame 00:02)

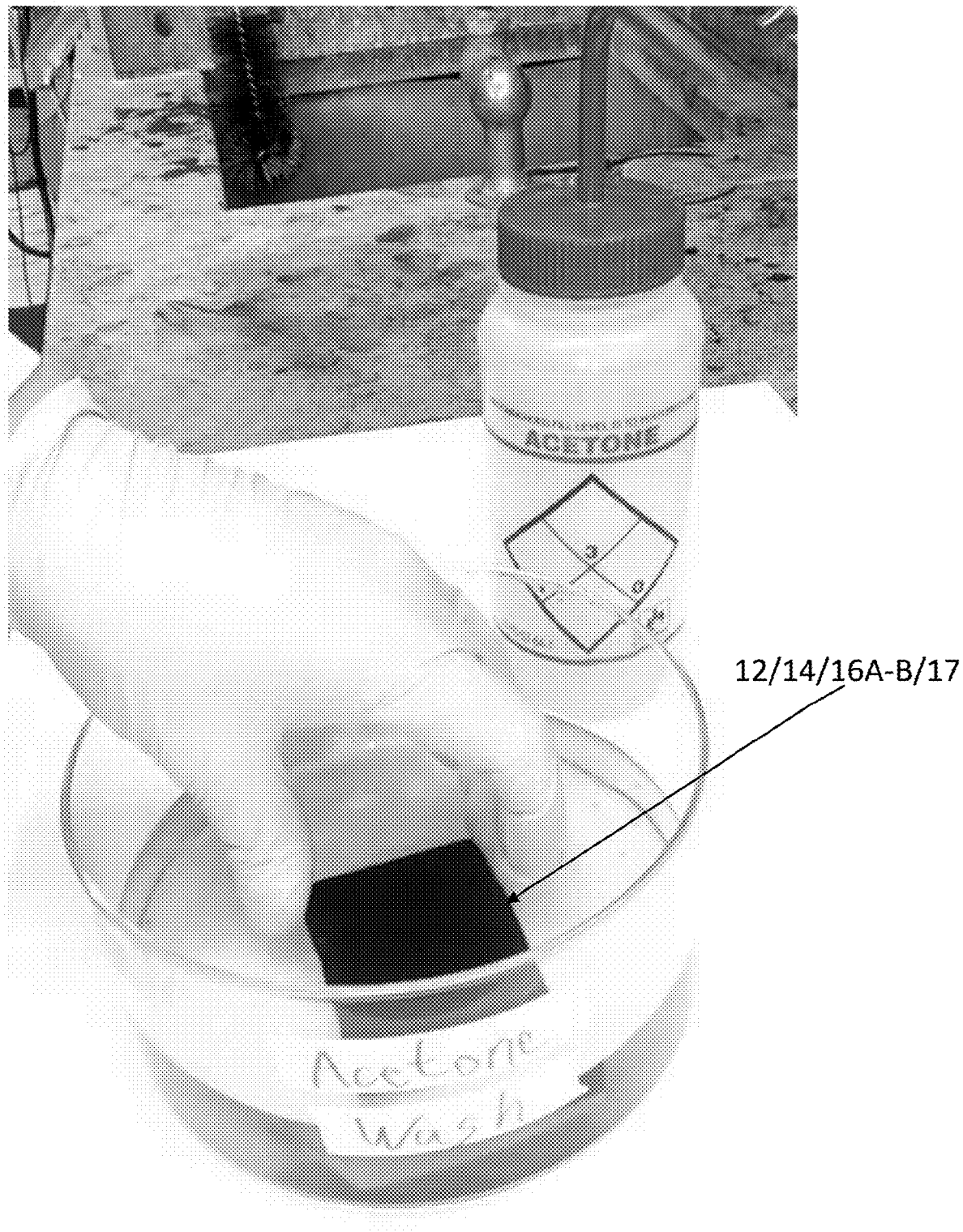
FIG. 16B (at 00:03)

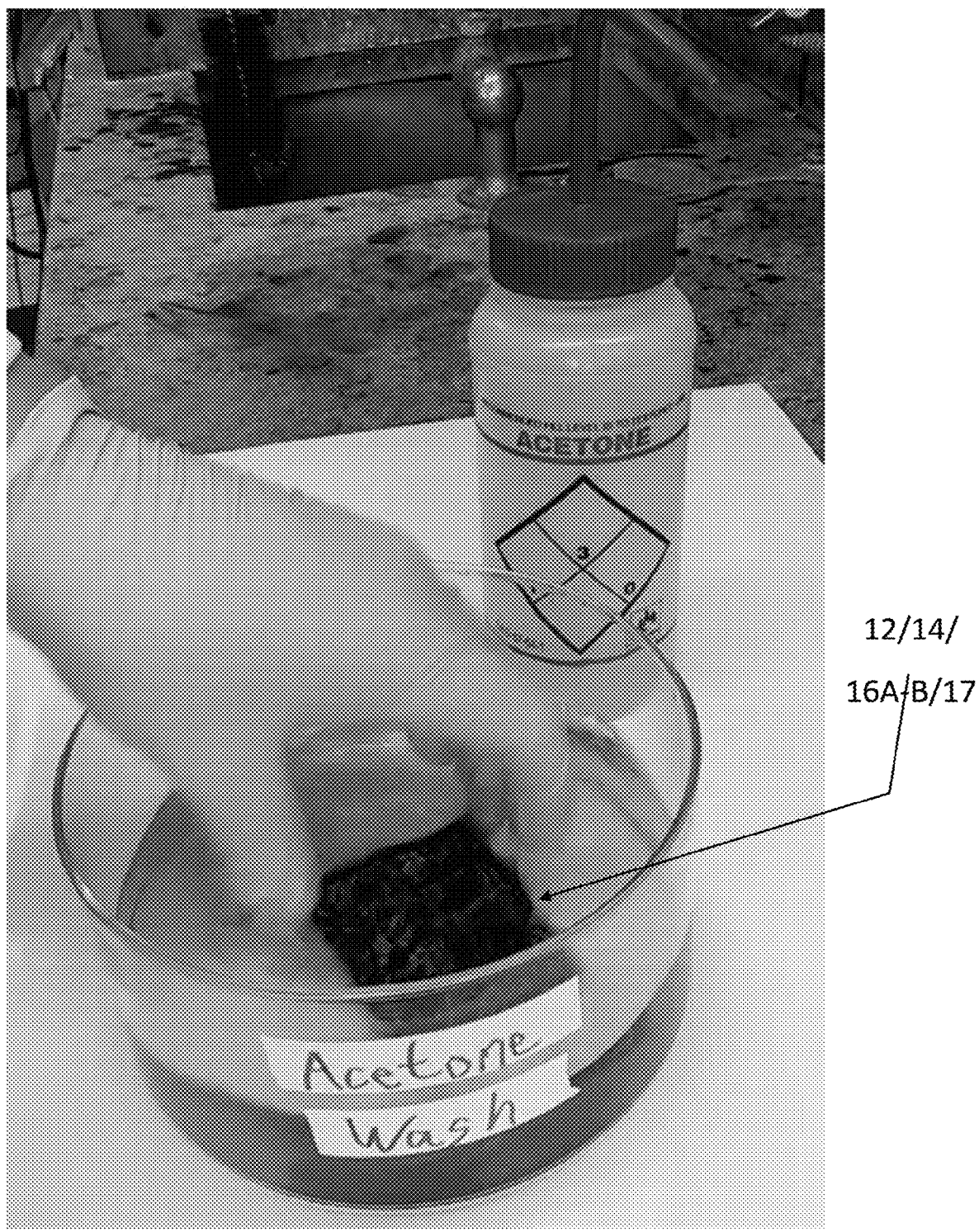
FIG. 16C (at 00:06)

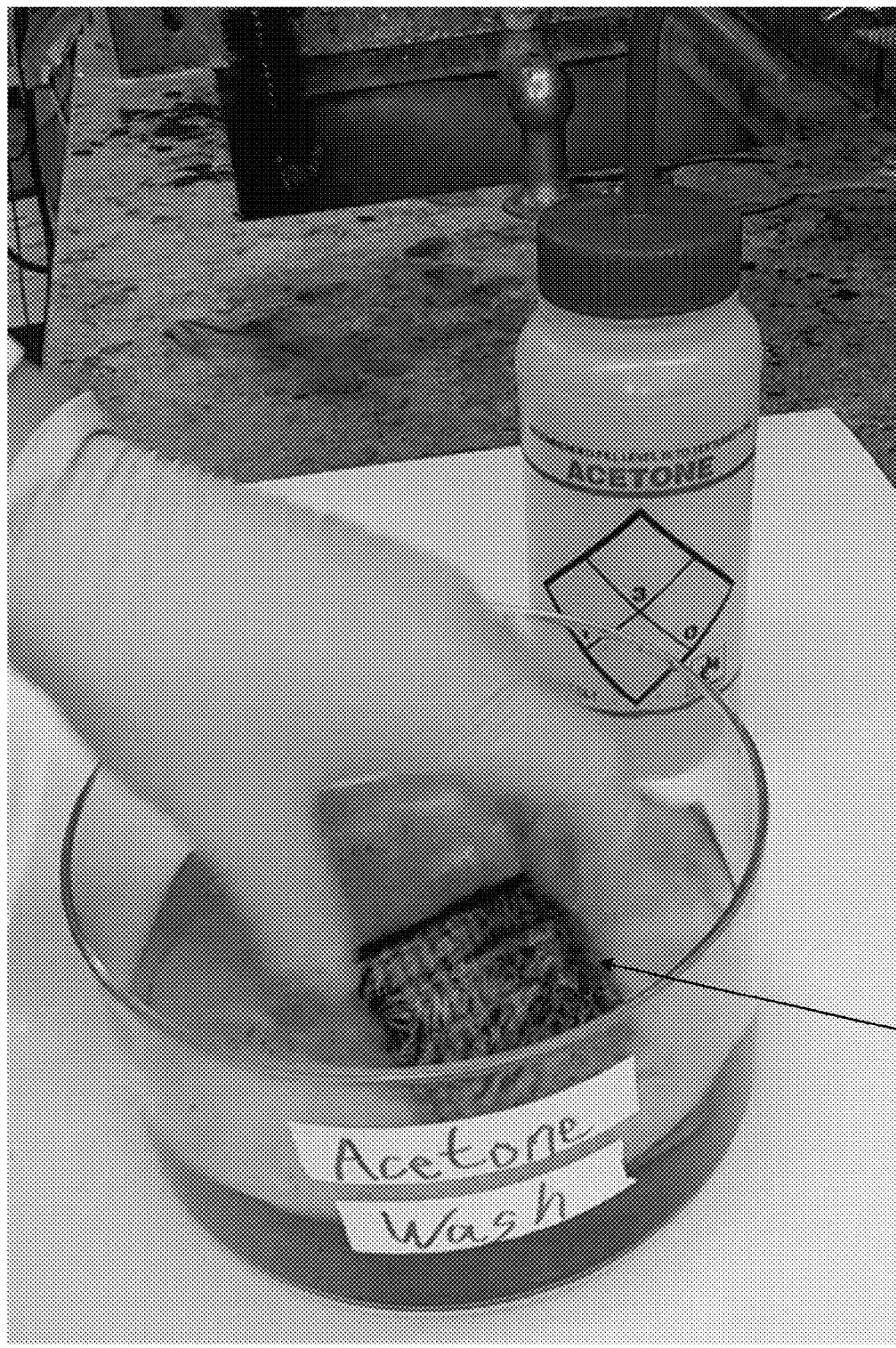
FIG. 16D (at 00:08)

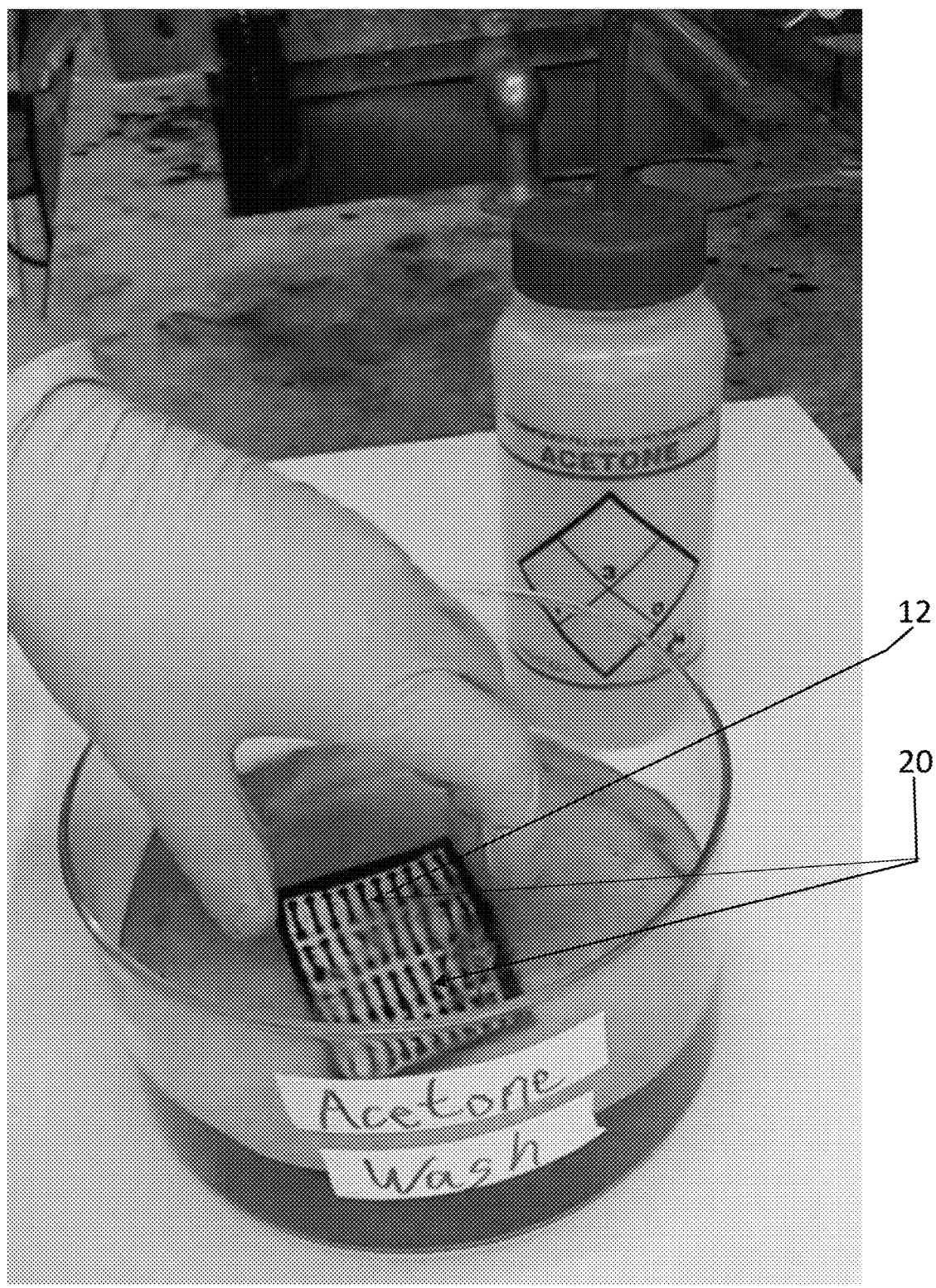
FIG. 16E (at 00:13)

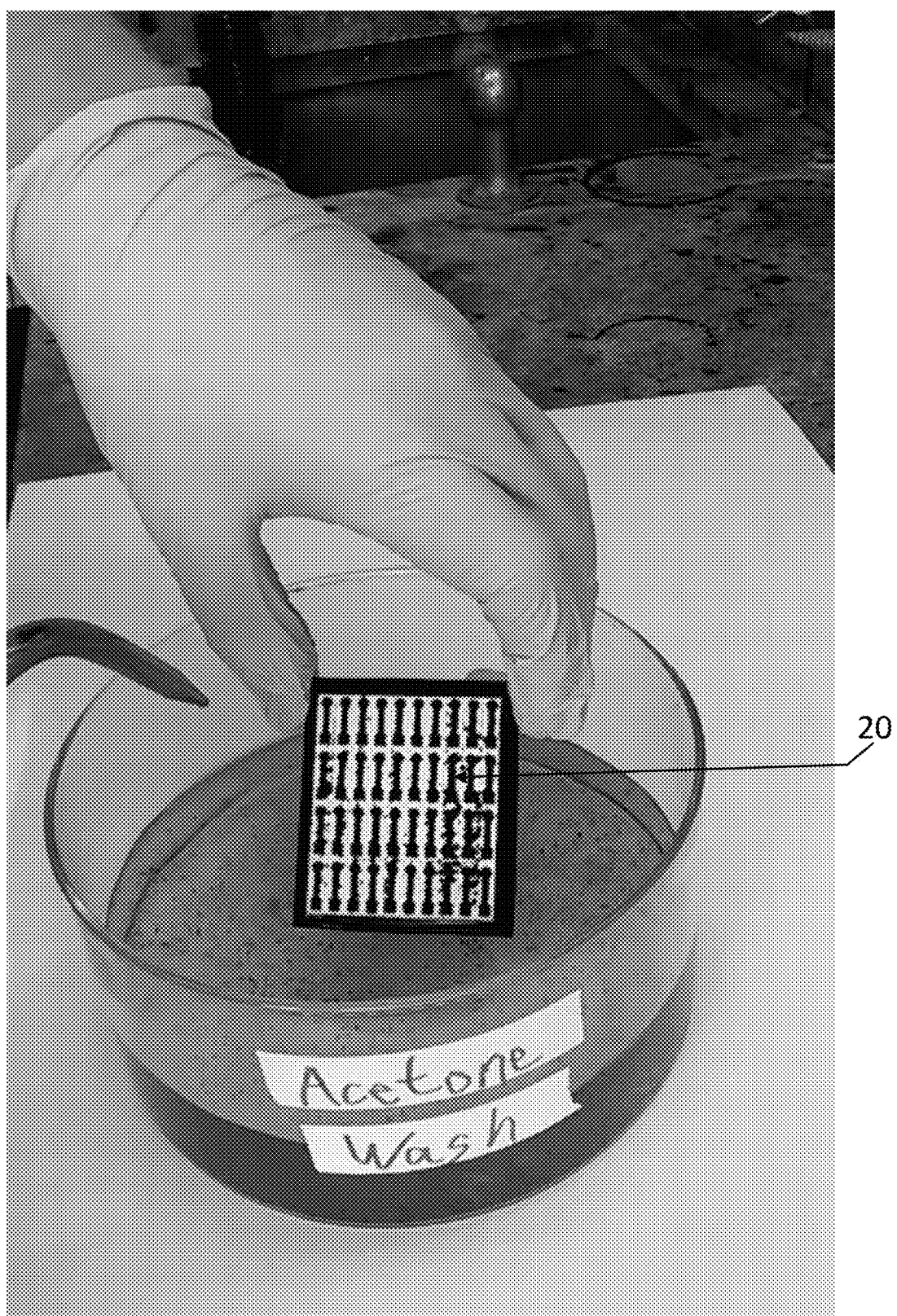
FIG. 16F (at 00:16)

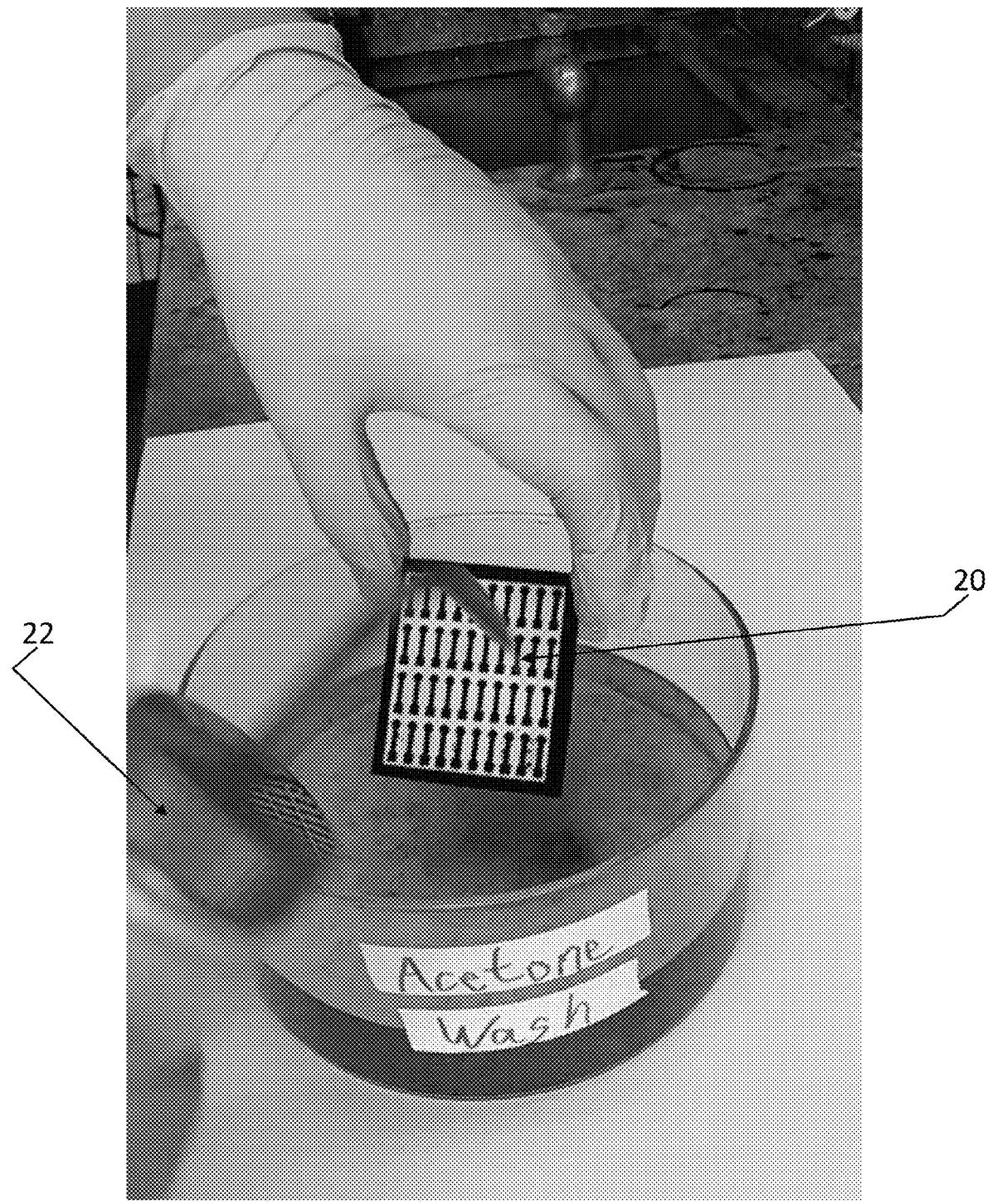
FIG. 16G (at 00:22)

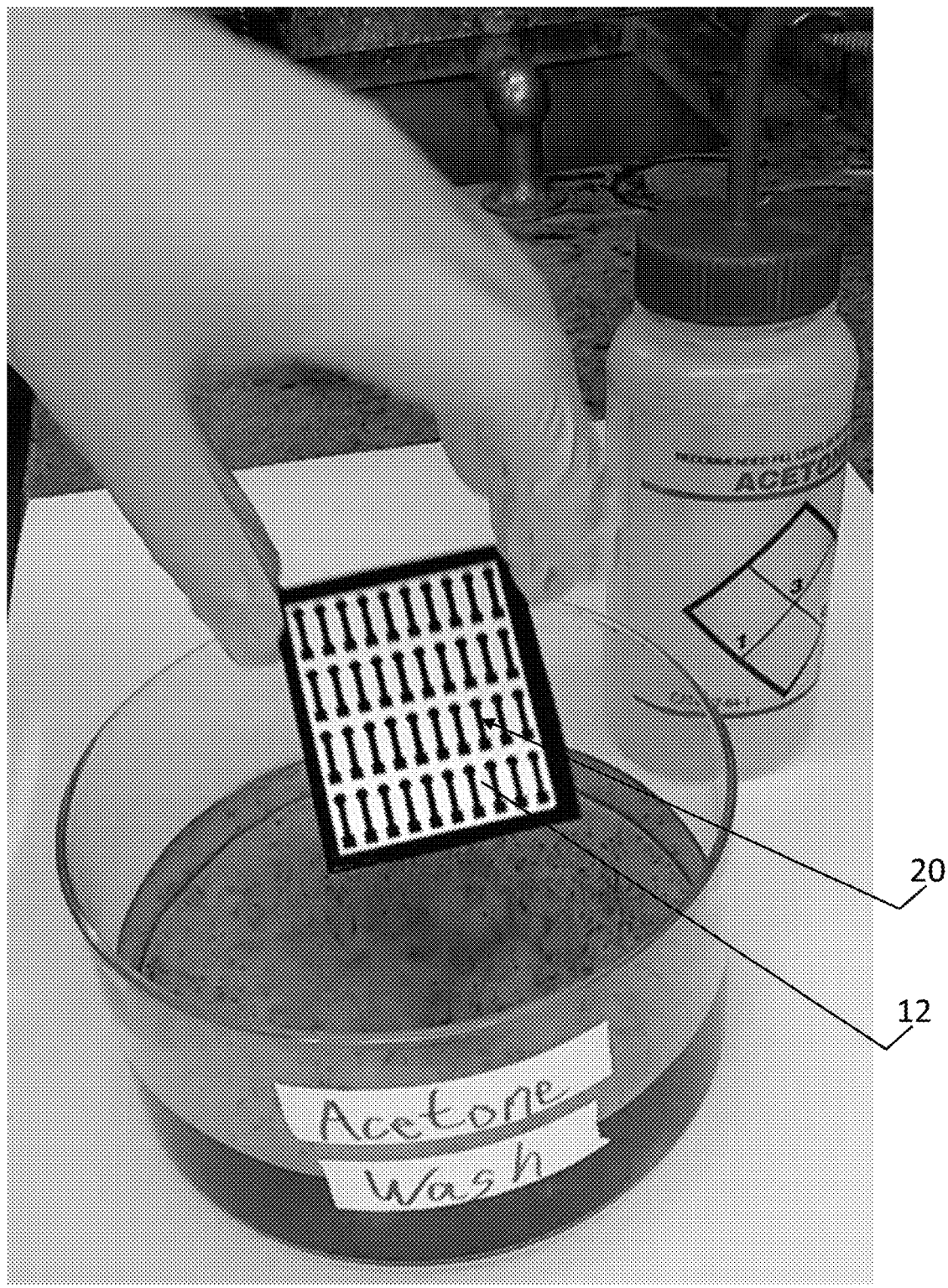
FIG. 16H (at 00:33)

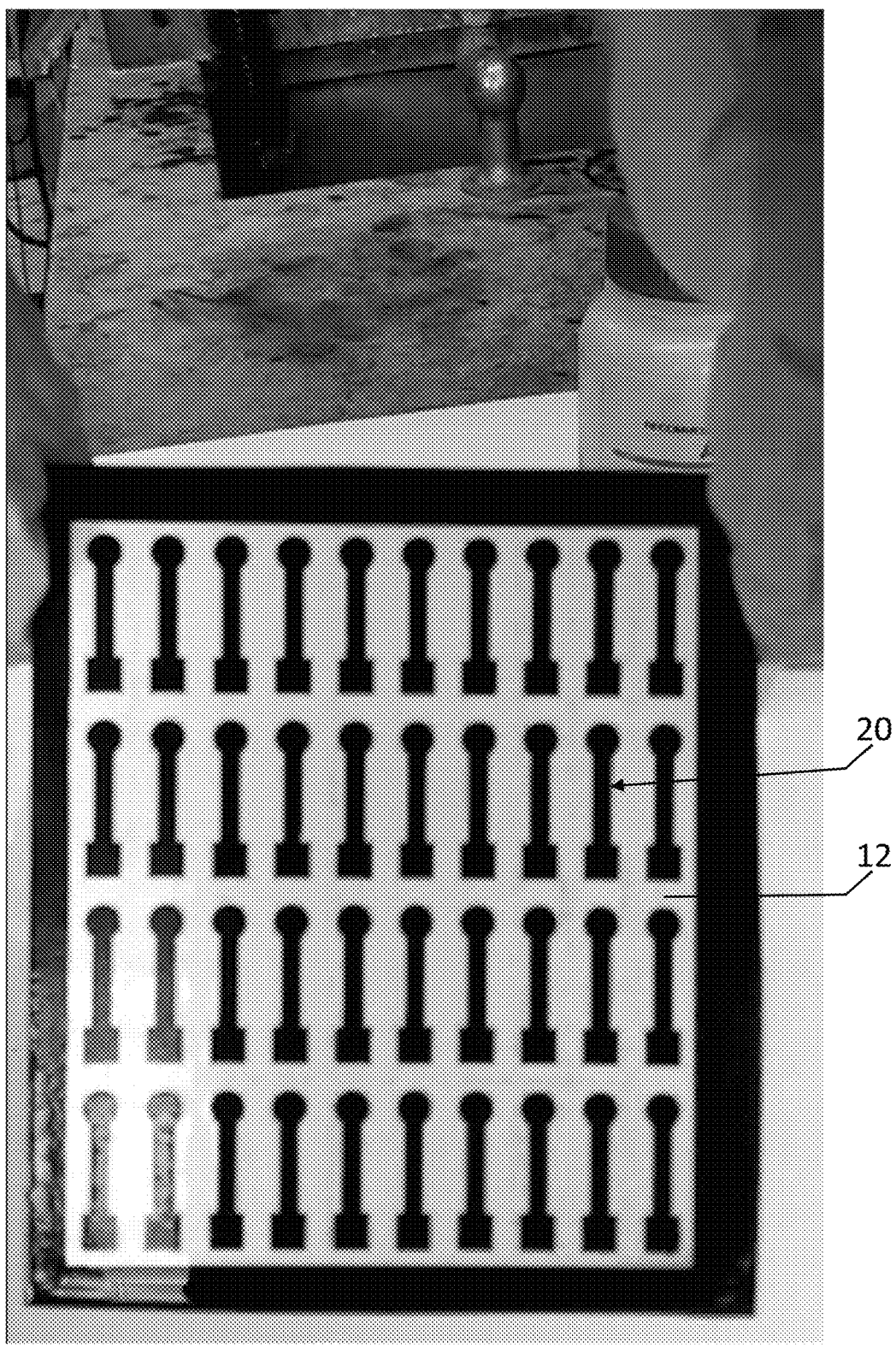
FIG. 16I (at 00:37)

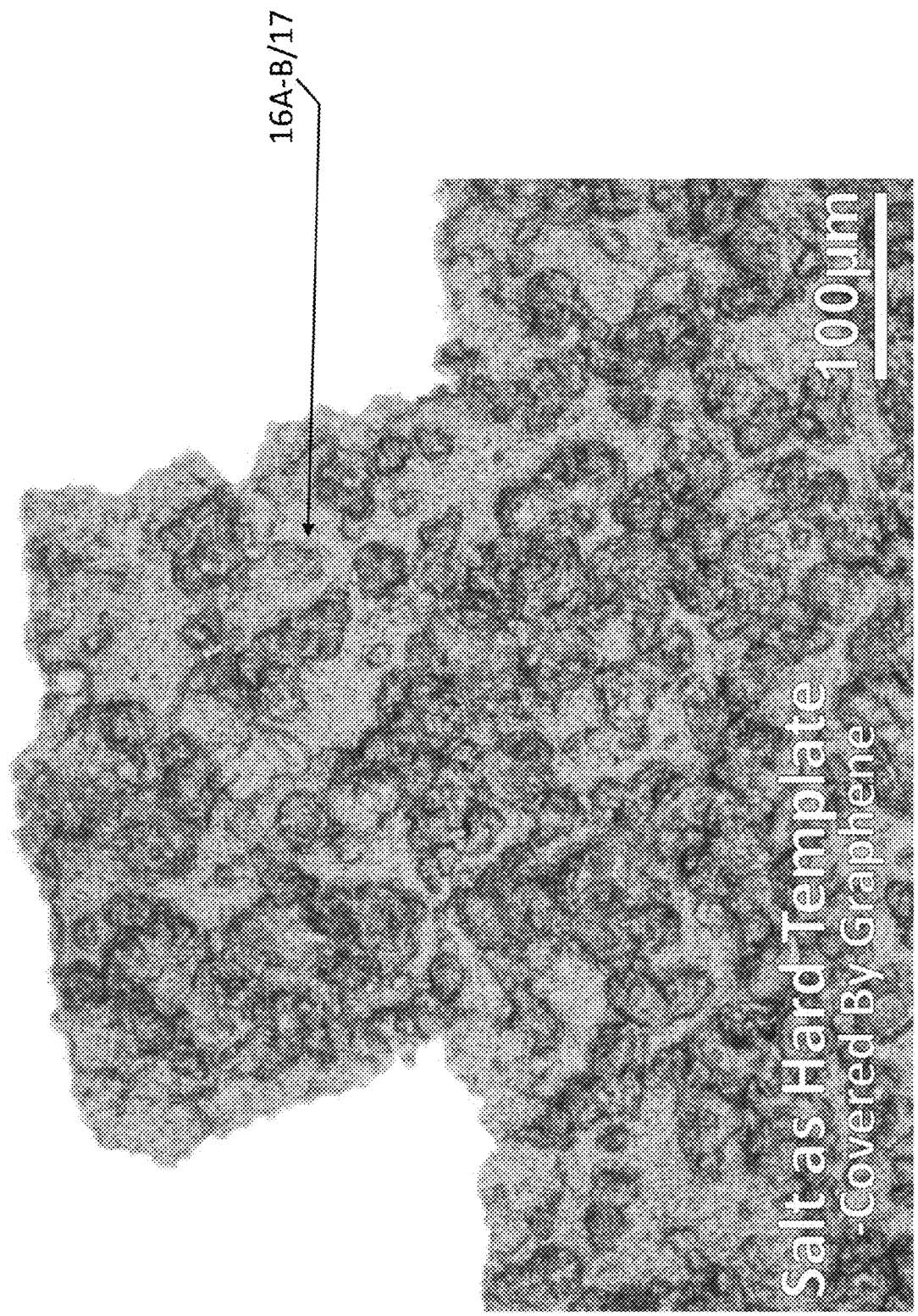
FIG. 17A (at 00:00)

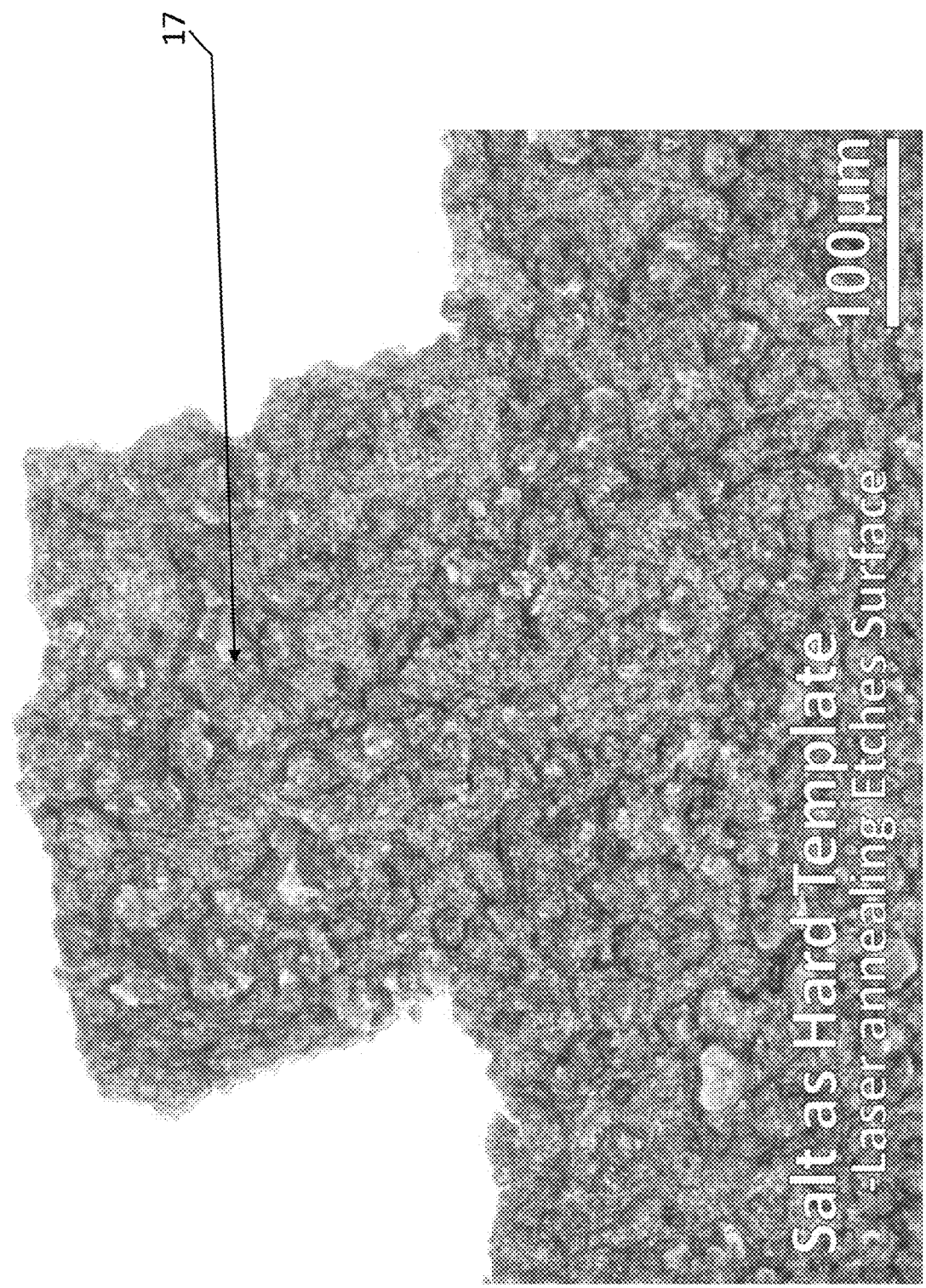
FIG. 17B (at 00:05)

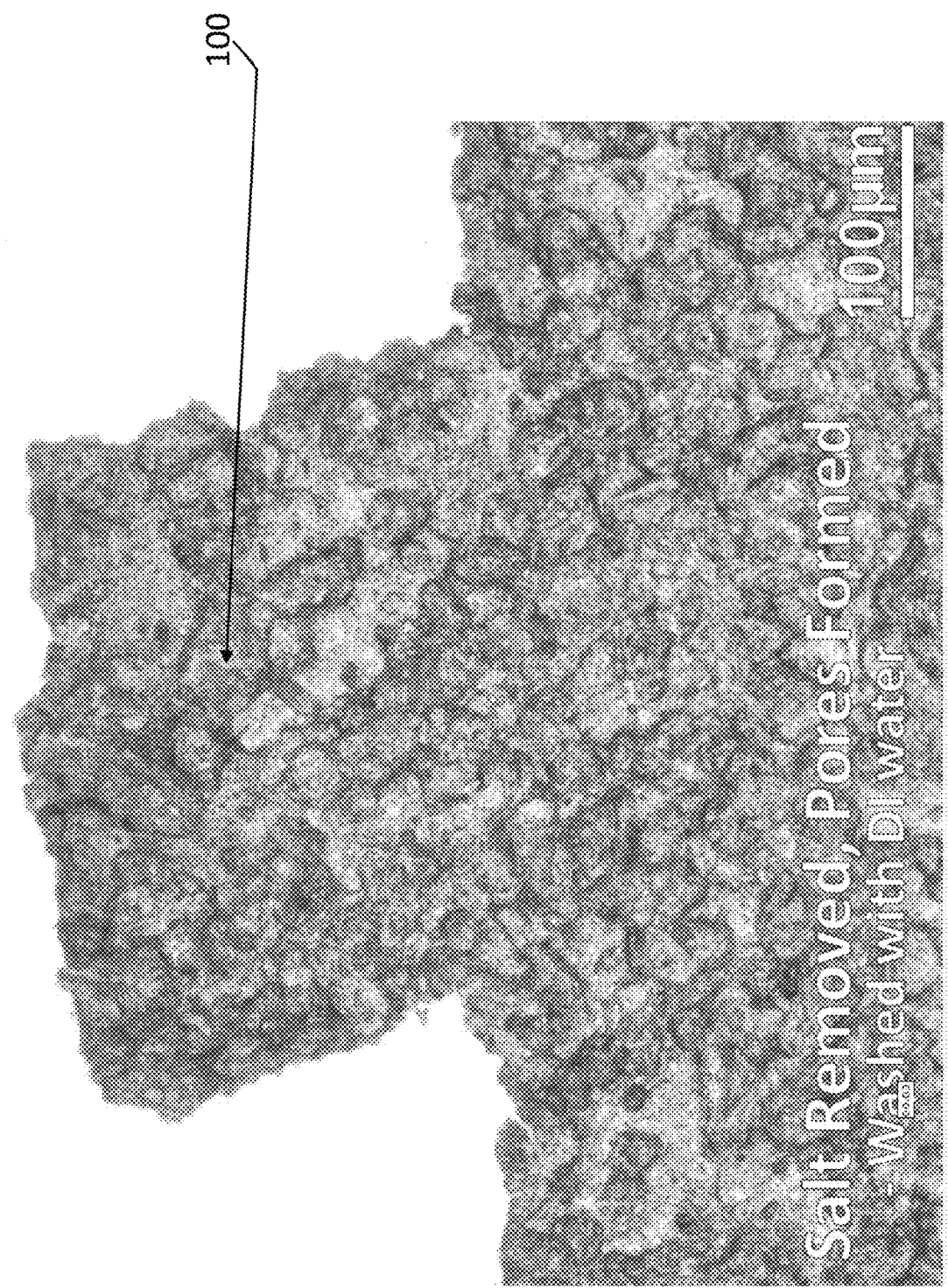
FIG. 17C (at 00:13)

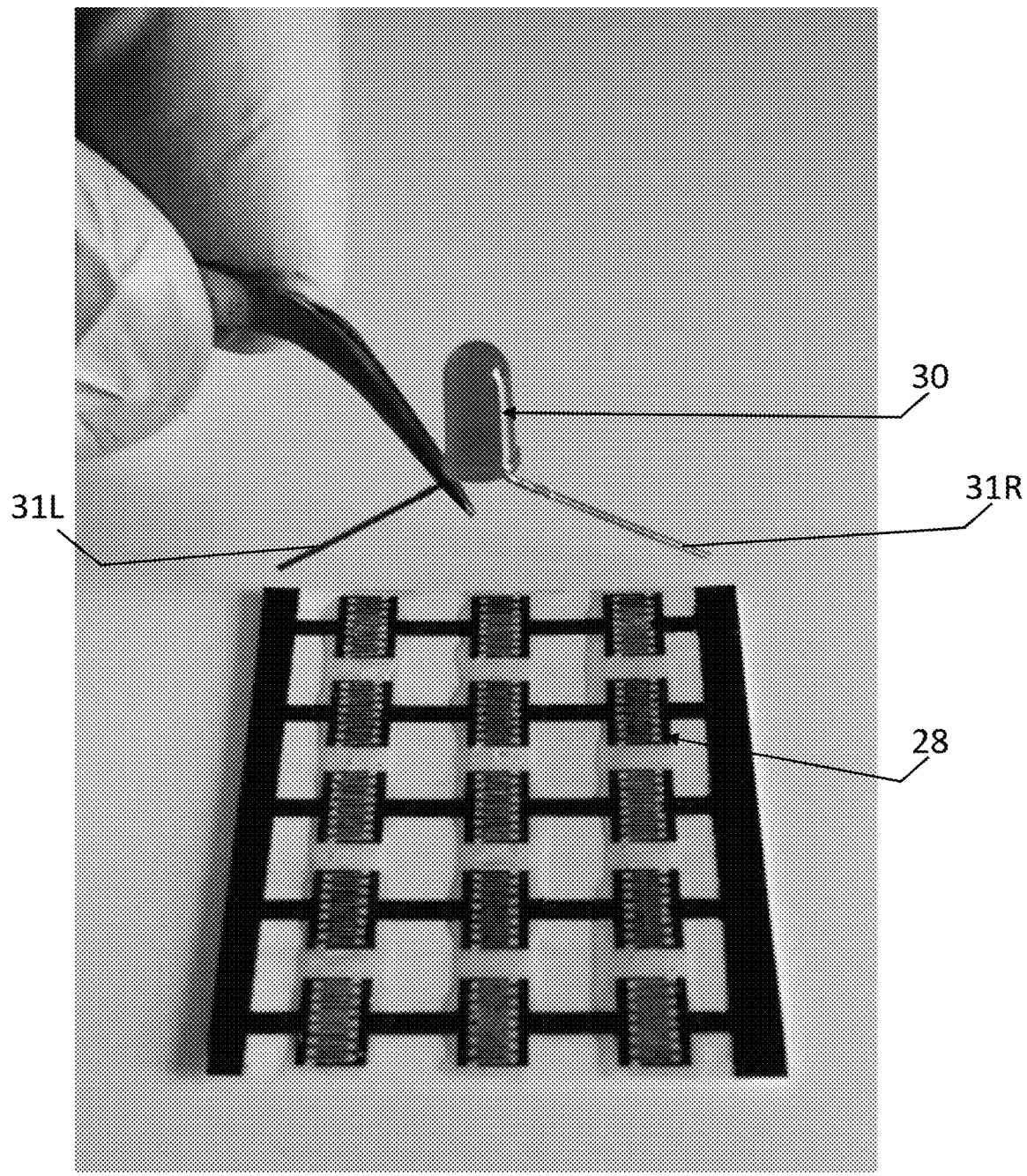
FIG. 18A (at 00:00)

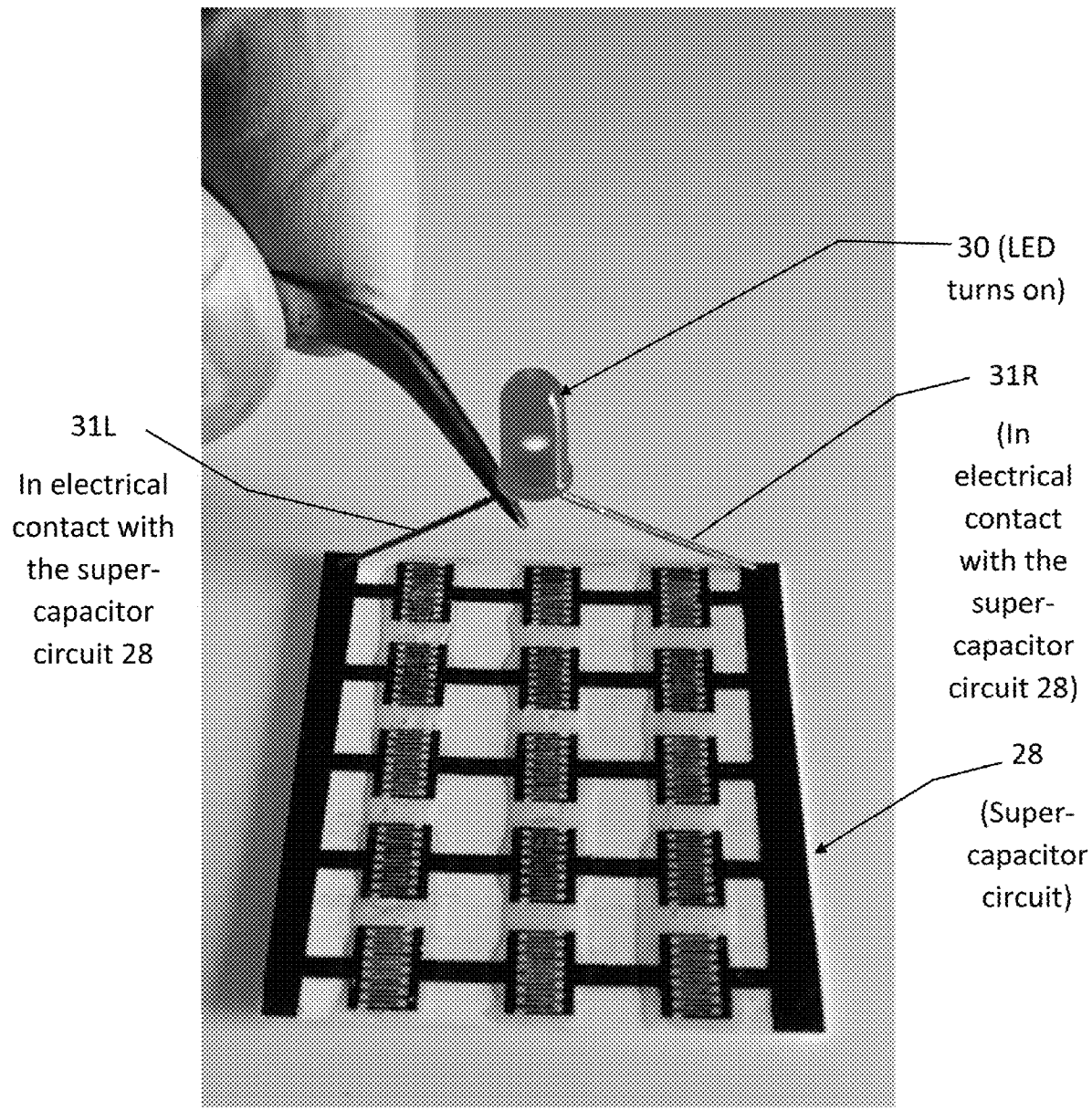
FIG. 18B (at 00:02)

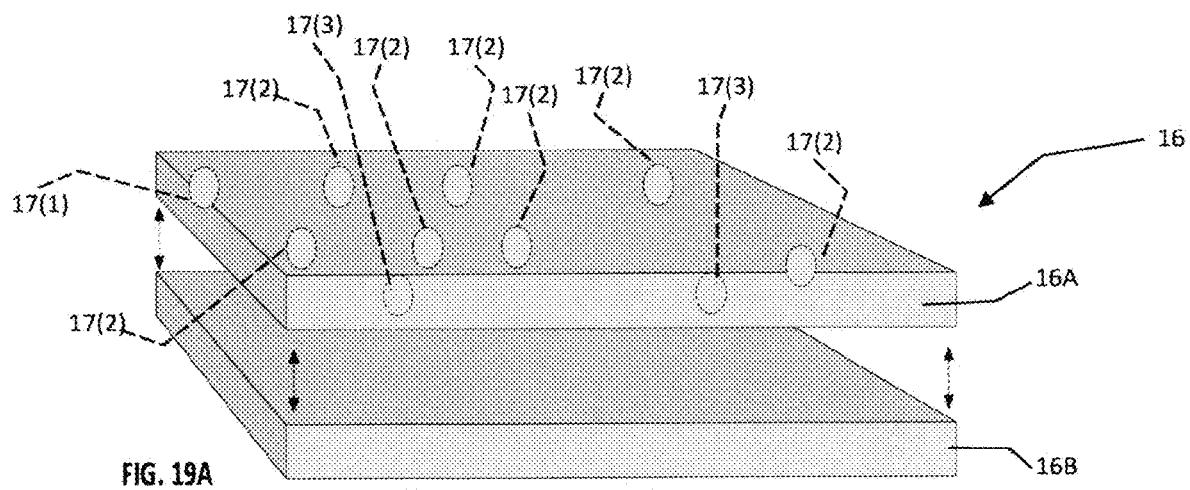
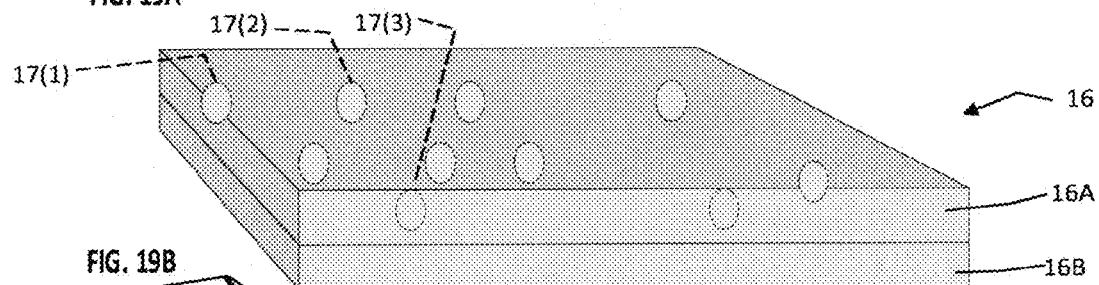
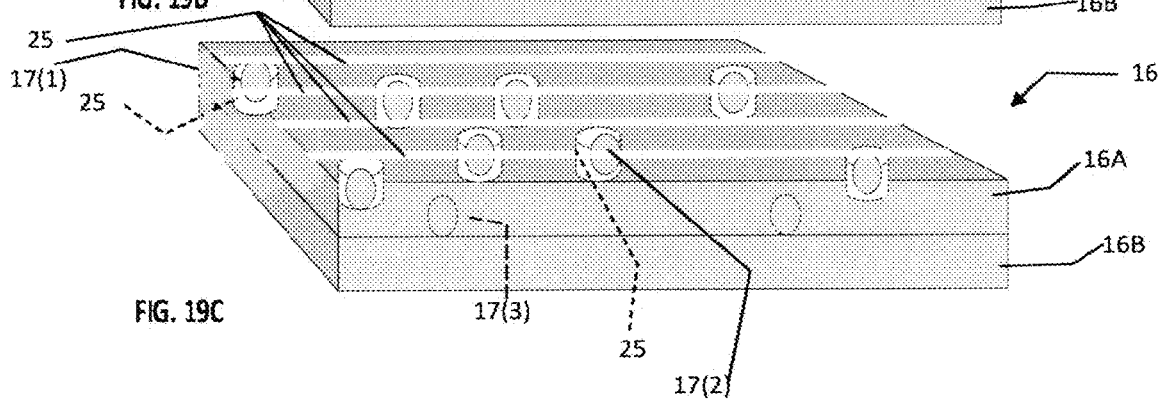
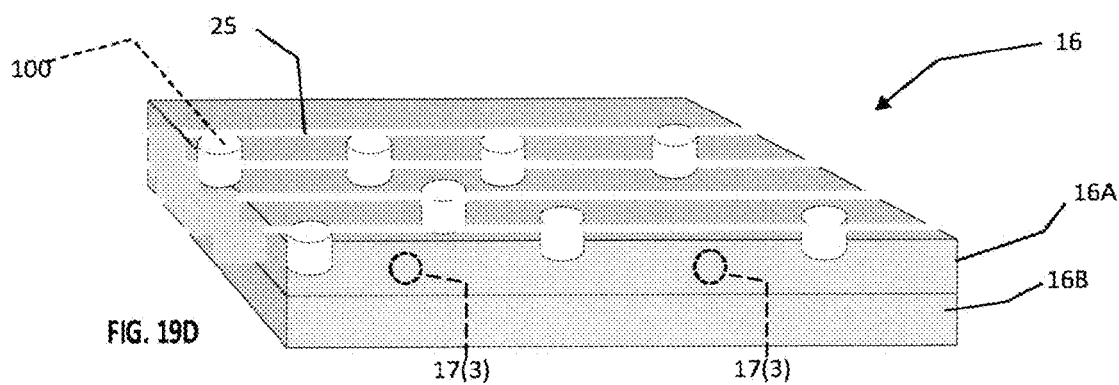

US 11,971,383 B1

ENHANCED 3D POROUS ARCHITECTURED ELECTROACTIVE DEVICES VIA IMPREGNATED POROGENS

CROSS-REFERENCE TO RELATED APPLICATIONS

This application claims the benefit of Provisional Application U.S. Ser. No. 62/769,953 filed on Nov. 20, 2018, all of which is herein incorporated by reference in its entirety.

GOVERNMENT RIGHTS

This invention was made with government support under USDA/NIFA Grant No. 2016-67021-25038 and USDA/NIFA Grant No. 2018-67011-27989. The Government has certain rights in this invention.

I. BACKGROUND OF THE INVENTION

A. Field of the Invention

The invention relates to electroactive materials and, in particular, to techniques for creating small scale, high resolution patterns on a wide variety of substrates from electroactive-material-based solutions having form and function beneficial to, inter alia, electrochemical sensing, capacitors, and other electromotive applications.

B. Related Art

Advances in solution-phase graphene patterning has provided a facile route for rapid, low-cost and scalable manufacturing of electrochemical devices, even on flexible substrates. While graphene possesses advantageous electrochemical properties of high surface area and fast heterogenous charge transport, these properties are attributed to the edge planes and defect sites, not the basal plane. Herein, we demonstrate enhancement of the electroactive nature of patterned solution-phase graphene by increasing the porosity and edge planes through the construction of a multidimensional architecture via salt impregnated inkjet maskless lithography (SIIML) and $CO_2$ laser annealing. Various sized macroscale pores (<25 to ~250 µm) are patterned directly in the graphene surface by incorporating porogens, salt crystals) in the graphene ink which act as hard templates for pore formation and are later dissolved in water. Subsequently, microsized pores (~100 nm to 2 µm in width) with edge plane defects are etched in the graphene lattice structure by laser annealing with a $CO_2$ laser, simultaneously improving electrical conductivity by nearly three orders of magnitude (sheet resistance decreases from >10 000 to ~50 $\Omega sq^{-1}$).

There is room for improvement in the ways to fabricate patterns of graphene-based or other electroactive-based materials with improved electrical properties.

II. SUMMARY OF THE INVENTION

In one aspect of the present invention, we demonstrate that a multidimensional porous graphene fabrication method can improve electrochemical device performance through design and manufacture of an electrochemical organophosphate biosensor that uses the enzyme acetylcholinesterase for detection. This pesticide biosensor exhibits enhanced sensitivity to acetylthiocholine compared to graphene without macropores (28.3 µA $nM^{-1}$ to 13.3 µA $nM^{-1}$) and when inhibited by organophosphate pesticides (paraoxon) has a wide linear range (10 nM to 500 nM), low limit of detection (0.6 nM), and high sensitivity (12.4 nA $nM^{-1}$). Moreover, this fabrication method is capable of patterning complex geometries [i.e. interdigitated electrodes (IDEs)] even on flexible surfaces as demonstrated by an IDE supercapacitor made of SIIML graphene on a heat sensitive polymer substrate. The supercapacitor demonstrates a high energy density of 0.25 mW h $cm^{-3}$ at a power density of 0.3 W $cm^{-3}$. These electrochemical devices demonstrate the benefit of using SIIML and $CO_2$ laser annealing for patterning graphene electrodes with a multidimensional porous surface even on flexible substrates and is therefore a platform technology which could be applied to a variety of different biosensors and other electrochemical devices.

In one example, a new manufacturing method called Salt Impregnated Inkjet Maskless Lithography (SIIML) is introduced and shown to enhance the electrochemical activity of patterned solution-phase graphene. Salt crystals mixed into the graphene ink act as hard templates or porogens for the subsequent creation of macroscale pores. After a solvent-based graphene liftoff process defines the printed graphene electrodes, a $CO_2$ laser removes the salt crystals to reveal the pores (100 nm-2 µm) and to increase the electrical conductivity of the graphene (~50 $\Omega sq^{-1}$). This three-dimensional hierarchy/architecture provides increased edge plane and defects in the graphene, which improves the catalytic activity and capacitance of patterned graphene. This work demonstrates how the patterned graphene can be functionalized to create a highly sensitive pesticide biosensor and high power/energy density electrochemical supercapacitor. While other researchers have also shown that increasing the surface area of graphene can improve electrochemical activity, few researchers have been able to demonstrate a manufacturing method to pattern high surface area graphene; for those who have, the material typically suffers from low conductivity. In addition, these high surface area, conductive graphene circuits could act as a platform technology for batteries, biofuel cells, electrochemical biosensors, and dye-sensitized solar cells as well as flexible and heat sensitive substrates for wearable technology.

Graphene has emerged as one of the most attractive electrocatalytic transduction materials due to its extraordinary electrical and thermal conductivity, high mechanical strength, biocompatibility, high carrier capacity/mobility, and potential high surface area.[1-3] Specifically, electrodes comprising graphene and graphene derivatives (graphene nanoparticles, reduced graphene oxides, oxidized graphene, functionalized graphene) have demonstrated high electrical conductivity and/or catalytic capability. For example, in the past decade graphene has been used for electrode materials in electrochemical devices such as supercapacitors,[4] batteries,[5] fuel cells,[6] cell electrode stimuli[7,8] and sensors.[9,10]

Graphene is typically produced by chemical vapor deposition (CVD) which can yield nearly pristine (defect-free) single or few layer 2D sheets.[11] In the context of electrochemistry, these 2D pristine sheets or basal plane geometry exhibit four orders of magnitude lower specific capacitance and seven orders of magnitude lower electron transfer rates than the edges planes or edge defect sites of the graphene.[12] Numerous methods have been used to increase the electrochemical surface area (ECSA) of graphene. For example, nanosphere lithography using self-assembly of polystyrene,[13] silica,[14] or $MnO_2$[15] nanospheres has been shown to etch nanopores into CVD grown graphene to increase the defect density in the lattice structure (more edge planes) and consequently improved the sensitivity of electrochemical sensors. Others have constructed three-dimensional CVD grown graphene foam out of a nickel scaffold,[16] polystyrene colloidal particles as a sacrificial template,[17] as well as various other manufacturing methods derived from chemical vapor deposition, hydrothermal methods, and sugar-blowing production.[18] While these methods significantly increase the ECSA of the graphene electrode, they often require clean room technology, and/or high temperature fabrication. Such complex fabrication protocols are hence expensive and not amenable to high-throughput manufacturing such as roll-to-roll fabrication.

Solution-phase graphene provides an attractive alternative to costly CVD grown graphene as it can be synthesized from low-cost graphite with mechanical/chemical exfoliation.[19,20] Various methods have been exploited to increase the ECSA of solution-phase graphene. For example, the "breath-figure" method uses moist gas that condenses on organic solution-phase graphene which results in the formation of highly controlled evaporated water droplet pores (~2 μm).[21,22] Others have electrochemically reduced graphene oxide which provides a simple, one-step procedure to create 3D porous graphene coatings with pores ranging between 1-10 μm between graphene flakes.[16] Colloidal nanoparticles were used as template scaffolding which produced a hollow free-standing 3D graphene structure (500 nm).[23] While each of these methods provide effective means for creating a highly porous 3D graphene architecture, they do not provide facile routes to pattern the solution-phase graphene into electrodes and in many cases are not stable (i.e., the architectures collapse in the air).[16]

Simple, low-cost methods such as inkjet,[24] aerosol,[25] and screen printing[26] provide simple fabrication methods for patterning solution-phase graphene into highly defined graphene electrodes; however, these graphene surfaces typically have little ECSA as graphene flakes are tightly compact exposing predominately their basal planes.[27] Various techniques have been employed to alter the graphene flake orientation, for example, Choi et al., incorporated nafion polymers into the graphene solution which made a hydrophobic (contact angle~161°) rough surface, however, the graphene film lacked conductivity ($>10$ K$\Omega$ sq$^{-1}$).[28] Hersam and coworkers used polymer-phase inversion to tailor the porosity of graphene, similarly, the increase in porosity lead to a decrease in conductivity (~1000 Sm$^{-1}$ at 15% glycerol).[29] Alternatively, we have demonstrated that secondary post-processing methods such as laser annealing can significantly increase the conductivity (~100 $\Omega$sq$^{-1}$)[10] while simultaneously enhancing the electroactive surface area of graphene by nano/micro structuring pores into the graphene by orientating superficial graphene flakes vertically.[10,30,31] However, these methods do not make macrosized pores in the graphene surface or micropores in the graphene lattice structure while retaining electrical conductivity. Macropores in the graphene surface facilitate enhanced diffusion of substrates towards and away from the active sites (defect sites and edge planes in the graphene). Therefore, adding the additional three-dimensional hierarchy/architects of different pore sizes, as exhibited in these developed electrodes for example, has been shown to result in higher electroactive surface area and enhanced catalytic activity,[32,33]

See references [10], [31], and [9] respectively, incorporated by reference herein, for more background.

Other aspects of the invention relate to methods and end products that follow SIML but with variations. Examples of variations include other solvating-porogens instead of salt, non-solvating porogens and ways to expose and remove non-solvating porogens instead of dissolving solvating porogens, and other functional applications than a biosensor.

A. Objects, Features, and Advantages

It is therefore a principal object, feature, or advantage of the present invention to present methods, apparatus, and systems which improve over or solve problems and deficiencies in the present state of the art.

Other objects, features, and advantages of the invention include methods, apparatus, and systems as above which:
a. result in electroactive materials in small, high-resolution patterns with enhanced characteristics, including electrical properties, including because of increased ECSA;
b. use porogens in formation of the pattern which then can be, at least in part, removed to form porogen pores or voids that create a micro-structured or -textured, or crater-like surface or superficial area that, inter alia, can increase ECSA of the patterned material;
c. with can, with at least graphene or graphene derivative or based materials, or carbon-based small-scale materials as the electroactive materials, produce films (e.g. <50 microns thick), foams and thick films (e.g. up to 50 microns in thickness), and other form factors of graphene or graphene derivative materials in scalable amounts, including in ways amenable to mass production (in the thicker format like foams and thick films the porogens would be dissolved leaving micron sized air gaps in the graphene to make a foam like structure). Thicker graphene layers would be made by spin coating multiple layers of graphene onto the surface of the substrate and the limit we have reached for performing this IML method is about 50 microns thick on a surface);
d. are economical compared to many if not most state of the art techniques;
e. are amenable to films or multilayered combinations, whether continuous or patterned form factors;
f. are amenable to a variety of substrates including but not limited to flexible or heat sensitive substrates.

These and other objects, features, aspects, and advantages of the invention will become more apparent with reference to the whole specification, including drawings and claims.

B. Aspects of the Invention

In one aspect of the invention, we demonstrate a facile manufacturing process of patterning solution-phase graphene electrodes with high electroactive surface area utilizing different orders of pore sizes via salt impregnated inkjet maskless lithography (SIIML) and $CO_2$ laser annealing. This technique modifies the newly developed IML method for rapid prototyping highly defined graphene films by incorporating salt crystals as porogens to increase the ECSA. Sieved salt powders have been demonstrated in the past to act as efficient porogens for 3D printed resins,[34-36] polymer-nanotube scaffolds for bone formation[37] and porous carbon powders for gas absorbance.[38] Similarly, we demonstrate that salt crystals can act as a hard template porogens for macrosize (<25 to ~250 μm) defects in 2D thin film electrochemical devices. We also demonstrate for the first time, the use of a $CO_2$ laser to anneal patterned solution-phased graphene which etches microsize (~100 nm-2 μm) pores in the graphene surface. This high ECSA graphene surface displayed enhanced electrochemical performance as demonstrated by an electrochemical pesticide biosensor with high sensitivity (12.4 nA nM$^{-1}$) and low limit of detection (0.6 nM) to paraoxon (a model organophosphate pesticide). Furthermore, we show that this multidimensional porous graphene surface is a platform technology that can be applied to electrochemical devices beyond biosensors, including energy storage, as demonstrated by an electrochemical supercapacitor fabricated via the SIIML process which portrays high energy and power density (0.25 mW h cm$^{-3}$ at 0.3 W cm$^{-3}$).

In another aspect of the present invention, the concepts summarized above regarding graphene-based materials can be extended to other electroactive materials. Non-limiting examples include metals, transition metals, conductive polymers, and elemental monolayers excluding carbon. In another aspect of the invention, a pattern that includes electroactive materials can be enhanced by impregnating a starting solution of electroactive materials and solvent with solvating porogens of soluble solid-phase particles. After reduction of the solution, at least a substantial number of the soluble solid-phase particles, at least at the surface of the pattern, are exposed. At least a substantial portion of some or all of the exposed solid-phase particles is dissolved by an appropriate solvent. This leaves a number of pores in the pattern. This enhances the pattern's electrical characteristics by, e.g., increasing its electrochemical surface area (ECSA).

In another aspect of the invention, a laser can be used to etch the pattern surface to expose solid-phase particles. In a further aspect of the invention using etching to expose, the laser can be controlled to effectively produce additional pores or features in the pattern to further enhance electrical characteristics of the pattern. Other methods and sub-systems can be used to expose impregnated porogens.

In another aspect of the invention, alternatives to solvating particles and/or laser exposure are possible. For example, non-solvating solid-phase particles could be impregnated into the pattern and dislodged from its surface to form pores or at least superficially microtexture or microstructure the material, which can inter alia increase ECSA. An example would be hard templates, such as microbeads, used as a non-dissolving porogen. Non-limiting examples are polymer microbeads made of, for example, polyethylene or polystyrene. These would then be exposed and dislodged, degraded, or otherwise influenced to remove at least some of them from at least at or near the surface of the electroactive material. In one non-limiting example the non-solvating particles could be removed by exposing them at the surface of the patterned electroactive material such as with a laser and then dislodging or degrading them to leave pores or microtexture or microstructures. Other ways are possible. Exposing and degrading can be by other techniques than a laser.

In one aspect of the invention, a method includes patterning a substrate with graphene-based or other electroactive-based solution that includes solid-phase particles as hard templates, reducing the solution, and processing the reduced solution to expose the particles at least at or near the surface of the reduced electroactive material. In one example using solid-phase particles are solvating, a solvent effective to dissolve at least substantially the exposed hard template particles leaves a three-dimensional (3D) porous architecture that can be beneficially used for a variety of applications, including but not limited to bio sensors and supercapacitors. In another example, the solid-phase particles are non-solvating and, once exposed, can be dislodged to leave pores. In one example exposure is by etching the surface of the pattern with a laser. In another example, exposure is by supplying thermal energy to the pattern sufficient to open up the pattern at a substantial number of solid-phase particles.

In another aspect of the invention, a system for fabricating includes scalable means for automatically or semi-automatically patterning a substrate of variable size and materials including but not limited to flexible or heat-sensitive materials, scalable means to pattern the electroactive-based solution and solid-phase particles, controllable and scalable means to reduce the solution on the substrate, scalable means to process the surface of the reduced solution to expose the particles, and scalable means to remove at least a substantial amount or portions of the exposed solid-state particles to leave a 3D porous architecture electroactive-based pattern on the substrate.

In another aspect, an end product includes a functionalized 3D porous architecture electroactive-based pattern on substrate as above-described.

III. BRIEF DESCRIPTION OF THE DRAWINGS

The patent or application file contains at least one drawing executed in color. Copies of this patent or patent application publication with color drawing(s) will be provided by the Office upon request and payment of the necessary fee.

The appended drawings include a variety of illustrations to assist in an understanding of aspects of the invention and include:

FIG. 1 is a schematic diagram depicting the fabrication process steps of SIIML graphene electrodes according to an exemplary embodiment of the present invention. (a) A sacrificial polymer layer is inkjet printed as the negative of the final pattern. (b) Concentrated graphene ink impregnated with salt crystals is spin-coated. (c) The entire surface is impinged with acetone to remove the sacrificial layer, patterning the graphene. (d) A $CO_2$ laser anneals the graphene which increases conductivity, etches micropores, and reveals the salt crystals. (e) Electrodes are finally rinsed with water to remove the salt porogen, making macrosized pores within the graphene surface.

FIG. 2 is a schematic diagram of ACHE biosensor depicting the functionalization strategy for pesticide biosensing using EDC/NHS according to an exemplary embodiment of the present invention. (a) From left to right: EDC reacts with carboxyl groups to make an O-acylisourea intermediate ester. NHS reacts to form a stable amine-reactive ester. Finally, NHS ester binds ACHE to graphene surface through available amines in the enzyme. (b) Basic operations of ACHE pesticide biosensor. From top to bottom: ACTH reacts with ACHE and produces acetic acid and thiocholine. Thiocholine (2×) is oxidized by the graphene electrode and produces dithiocholine and two electrons. Paraoxon (model pesticide/organophosphate) inhibits ACHE and prevents the catalysis of ACTH. Note: size not to scale.

FIG. 3 are illustrations of effects of $CO_2$ laser annealing graphene according to an exemplary embodiment of the present invention. (a) Electrode sheet resistance (blue) and electrochemical surface roughness (red) versus increasing laser power. (h) XPS of not annealed, 5.8 W, and 6.4 W laser annealed graphene. (c) Representative SEM of laser annealed graphene surfaces with various powers showing the initial welding of graphene flakes at low power and then etching through the surface making micronized pores at higher powers.

FIG. 4 are illustrations of effects of various size salt crystals for microscale pore formation according to an exemplary embodiment of the present invention. (a) SEM depicting various size salt pores made with decreasing size salt crystals. Bottom right: Magnification of <25 μm pore. (b) Graph demonstrated the effects of different size salt crystals to ECSA (red), sensitivity to 5 mm ACTH (green), and inhibition sensitivity due to 1 μM paraoxon (blue). Note: graph has been standardized to no salt pores for comparison.

FIG. 5 are illustrations of effects of various salt concretions in graphene ink according to an exemplary embodiment of the present invention. (a) Representative SEM depicting concentrations of salt forming sparse to dense pore arrays in the graphene. (b) Graph demonstrated the effects of different concentrations of salt for sensitivity to 5 mM ACHE (Black), and inhibition sensitivity due to 1 mM paraoxon (Red).

FIGS. 6A-F are illustrations of an ACHE pesticide biosensor characterization according to an exemplary embodiment of the present invention.

FIG. 6A: Photograph of patterned array (4×10) SIIML: graphene electrodes on flexible PET substrate.

FIG. 6B: Effect of applied potential to amperometric response of 1 mM ACTH.

FIG. 6C: Plot of inhibition (%) according to incubation time.

FIG. 6D: Sensitivity to ACTH for SIIML (blue) and IML (red), inset: current versus concentration.

FIG. 6E: Amperograms of pesticide ACHE biosensor after incubating with various concentrations of paraoxon. Buffer baseline (black), 10 nM (red), 50 nM (green), 100 nM (yellow), 500 nM (blue), 1 μM (pink), 5 μM (aqua blue), 10 μM (grey), 50 μM (brown).

FIG. 6F: Corresponding current versus concentration, inset: magnification showing linear sensing range.

FIGS. 7A-F are illustrations of electrochemical performance of a SIIML supercapacitor according to an exemplary embodiment of the present invention.

FIG. 7A: Photograph of patterned SIM, graphene electrode with schematic of supercapacitor design.

FIG. 7B: Cyclical voltammograms with increasing scan rates (50 mV s$^{-1}$ black to 1000 mV orange).

FIG. 7C: Scan rate versus current demonstrating linear relationship and enhanced capacitance of SIIML (red) over IML (blue).

FIG. 7D: Galvanostatic charge-discharge curves with different current densities (0.01 mA cm$^{-2}$—orange to 0.2 mA cm$^{-2}$—red), inset: magnification showing near triangular shapes at higher current densities.

FIG. 7E: Galvanostatic charge-discharge graph of single supercapacitor (black), three electrodes connected in series (blue), and three electrodes connected in parallel (red).

FIG. 7F: Ragone plot of SIIML (red) and BILL (blue) supercapacitor electrodes and various other carbon-based IDE supercapacitors; light green: inkjet printed single walled carbon nanotubes (SW-CNT),[63] brown: boron doped laser induced graphene (B-LIG),[69] pink: electrostatic spray deposited reduced graphene oxide/carbon nanotube (rGO/CNT),[70] yellow: electrochemically reduced graphene oxide (ERGO),[71] and dark green: methane plasma treated graphene oxide with gold collector (MPGO).[72]

FIG. 8 is an SEM of Salt impregnated pores into spin coated graphene ink according to an exemplary embodiment of the present invention: Left: Before laser annealing showing salt in completely coated in graphene flakes. Center: After thermal annealing and rinsing showing salt has been removed but pore is not opened. Left: After laser annealing showing etching of surface opening the pore into the surface of the graphene.

FIG. 9 is an SEM of graphene surface with increasing laser annealing powers (5 W to 6.4 W, raster rate fixed at 350 mm/s) and various magnifications (1500×, 5000×, and 15000×) according to an exemplary embodiment of the present invention. From not annealed to 5.8 W, graphene flakes are smoothed and welded together and from 5.8 W to 6.4 W, $CO_2$ laser begins to etch through the surface making microsized pores.

Figure 1:
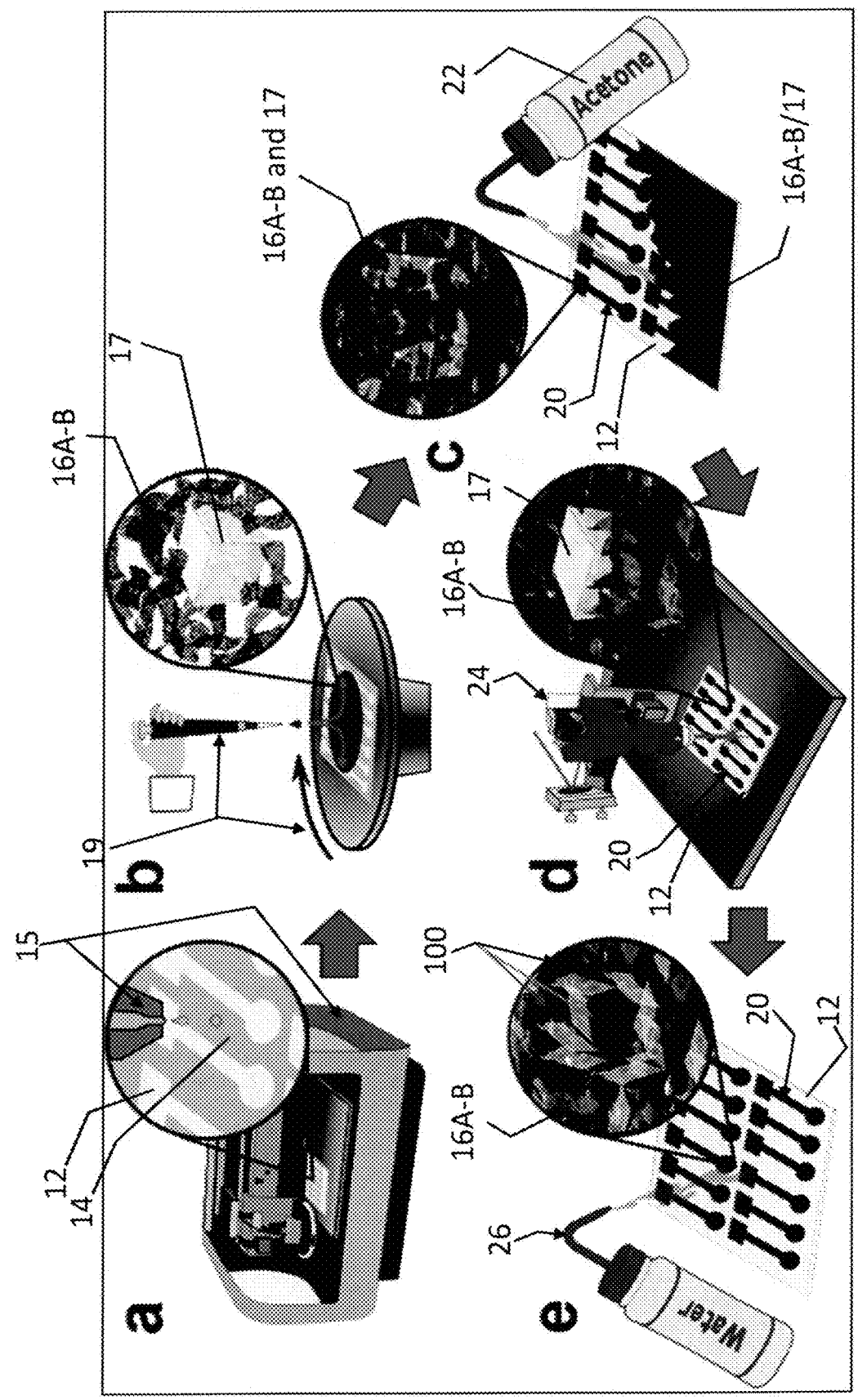

FIGS. 16A-I are excerpted frames from a movie that shows steps in patterning of Salt Impregnated Inkjet Maskless Lithography (SIIML) electrodes, sacrificial layer removal via acetone impingement revealing high resolution electrochemical electrodes according to an exemplary embodiment of the present invention. This is a visual depiction of the fabrication process of SIIML graphene electrodes. (a) Graphene film with salt porogens has been spin coated and post baked on top of inkjet printed sacrificial layer. (b) Surface has been impinged by acetone wash bottle removing sacrificial layer revealing patterned electrodes. Salt porogens remain as hard templates impregnated in the graphene surface. (c) A $CO_2$ laser anneals the graphene electrode which increases conductivity, etches micropores, and reveals the salt crystal porogens. (d) Electrodes are finally rinsed with water to remove salt crystals, opening up macrosized pores within the graphene surface.

FIGS. 17A-C are magnified images of SIIML graphene electrodes after IML process showing salt completely covered with graphene, laser annealing which etches surface revealing salt crystals, and washing which removes salt crystals opening macroscale pores in the surface of the graphene according to an exemplary embodiment of the present invention.

FIGS. 18A-B are images of a SIIML patterned graphene supercapacitor array powering red LED according to an exemplary embodiment of the present invention.

FIGS. 19A-D are diagrammatic illustrations of an exemplary embodiment according to the invention where the porogens are non-soluble (e.g. polymer spheres) impregnated into an electroactive layer (FIGS. 19A and B), at least some of them are exposed (FIG. 19C), and then at least some of the exposed non-soluble porogens are dislodged or removed leaving porogen pores in the electroactive material. FIGS. 19A-D also diagrammatically illustrate an exemplary embodiment where the impregnated layer of electroactive material is superposed or assembled over another layer of electroactive material which is not impregnated with porogens, such that exposure and removal may not remove all porogens from the top layer but the bottom layer is porogen free.

IV. BRIEF DESCRIPTION OF SELECTED REFERENCES

To assist in an understanding of the invention, the following references from the bibliography, infra, provide the following and are incorporated by reference:

Ref. [10]—Additional details about printed high resolution patterns.

Ref. [31] Additional details about printed high resolution patterns.

Ref. [9] Additional details about printed high resolution patterns.

Ref. [46] Additional details about more details on both biofunctionalization chemistry and biosensing.

Ref. [47] Additional details about more details on both biofunctionalization chemistry and biosensing Ref. [44] additional on chemical sensors, types, and operation.

Ref. [30] additional on super capacitors, types, and operation.

V. DETAILED DESCRIPTION OF EXEMPLARY EMBODIMENTS OF THE INVENTION

A. Overview

For a better understanding of the invention and its various aspects, several exemplary embodiments will now be described in detail. It is to be understood that these embodiments are neither exclusive nor inclusive of all forms and embodiments the invention can take. For example, variations obvious to those skilled in this art will be included within the invention.

For further example, the embodiments will focus on implementation into chemical sensors and supercapacitors. Aspects of the invention apply as well to other implementations, functionalizations, or the like.

The embodiments will focus on graphene as the electroactive material. However, aspects of the invention apply as well to its derivatives, including but not necessarily limited to graphene oxide, reduced graphene, and other graphene-related derivatives. Other possible materials include carbon-based materials. Non-limiting examples are graphene, carbon nanotubes, graphite, highly oriented pyrolytic graphite (HOPG), and others such as are known to those skilled in the art. Furthermore, other electroactive material can be used in analogous ways to those described for graphene and graphene-based materials. Most materials that could be inkjet printed and then sintered together to form a film would probably work. For example, other non-limiting electroactive materials could include gold, silver, platinum, conductive polymers, copper oxides, titanium dioxide, zinc oxide, tungsten oxide, iron, nickel) would work as well as a variety of 1 and 2D materials carbon nanotubes, transition metal dichalcogenide monolayers [$MoS_2$, $WS_2$, $MoSe_2$], graphene, Boron Nitride, Borophene, Silicene, Stanene, Phosphorene.

The embodiments will focus on salt crystals as the hard templates that can be impregnated into the graphene-based solution. However, this is one non-limiting example. Other solid-phase particles can be used in analogous ways with an appropriate solvent to remove them once exposed. In some examples the solid-phase particles are solvating porogens. They can be soluble in a solvent effective to remove at least a substantial portion of them when exposed. But in some aspects of the invention, the solid-phase particles are non-solvating porogens. They can be impregnated into the solution of electroactive material and its solvent for use as porogens, and after curing of the electroactive material exposed, and then exposed, degraded, dislodged and/or removed to leave pores or voids.

B. Generalized Invention

As indicated in the exemplary claims, aspects of the invention includes methods, systems, and products which include engineered 3D porous architecture into graphene-based or other electroactive-material-based patterns to improve performance of the graphene-based or other electroactive-based patterns. At a generalized level regarding an example of graphene-based patterns, the method impregnates a chosen graphene-based solution with soluble solid-phase particles of pre-configured size. The solution is reduced in a high resolution pattern on a substrate with the solid-phase particles acting as hard templates or porogens. The particles are exposed and dissolved. This leaves voids or pores where those particles used to be to create the 3D porous architecture in the reduced graphene-based material. As discussed herein, this engineered structure can be advantageously used for, inter alia, enhanced electroactivity for such things as bio sensing or supercapacitors. As indicated, instead of graphene or a graphene derivative as the electroactive material, other electroactive materials could be included in the starting solutions and impregnated with solid-phase porogens. As further indicated, the solid-phase porogens could be either solvating or non-solvating. In all these cases, the solid-phase particles are porogens. Once exposed, they can be removed to leave pores in the patterned electroactive-based material.

Systems and means can present substrates, make patterns, etch to expose the particles, and dissolve or otherwise remove (e.g. dislodge) the particles. One non-limiting technique and system to create the patterns is referred to as Inkjet Maskless Lithography (IML), as is further discussed in specific examples below. One non-limiting technique and system to expose the particles is a $CO_2$ or other laser operated under certain parameters, as is further discussed in specific examples below End products can include the fabricated patterned porous architecture substrates.

This invention introduces a facile method of creating high electroactive surface area of patterned electroactive-based material, e.g. graphene or graphene derivative or other, by using hard templates, e.g. salt crystals or other, for pore formation. This high surface area graphene could be used for a variety of applications and in particular electrochemical sensing and supercapacitors are shown. Enhanced electroactive devices with such high surface area graphene or other electroactive material are possible for those same or other uses or applications. Some key points regarding the technology are:

1. In the example of graphene as the patterned electroactive material and salt as a solvating porogen, highly defined pores can be patterned with different surface densities into graphene, these what will be referred to herein sometimes as "macro sized" pores can vary in diameter by using discrete sized salt crystals (ground using mortar and pedestal and sieved to various diameters, e.g. <25 μm to >250 μm). In the example of use of a laser to expose the hard template particles, additional micro sized pores (e.g. ~100 nm to ~2 μm) are formed by laser annealing. Other electroactive materials and porogens can be used in analogous ways to produce macro-sized pores. Other techniques to expose and/or remove the porogens are possible.

2. Pore formation via salt crystal or other hard templates in amenable to Inkjet Maskless Lithography which can pattern this porous graphene in highly defined graphene film electrodes even on flexible substrates. This process henceforth referred to as salt impregnated inkjet maskless lithography (SIIML). Such a process can be applied in analogous ways to patterns based on other electroactive materials.

3. SIIML is highly scalable and uses rapid prototyping process such as inkjet printing and spin coating; however, SIIML could also be use high throughput manufacturing such as roll-to-roll which is important for low cost electrochemical porous graphene electrodes. Additionally, SIIML uses low cost solution-phase graphene (mechanically or chemically exfoliated from low-cost graphite) instead of CVD grown graphene which eliminates the need for clean room technology. Other techniques of applying patterns to substrates, applying solutions, and finalizing a desired pattern on the substrate are possible.

4. Currently, few processes are able to pattern solution-phase graphene with high electrochemical surface area. Most are limited to secondary postprocessing such as laser annealing or chemically etching. Methods that directly pattern porous graphene such as polymer phase inversion significantly decrease conductivity when increasing the porosity of the graphene.

5. This invention includes, as one example, using a low-cost (e.g. $500), benchtop $CO_2$ laser (30 W) to anneal the graphene to improve its electrical conductivity. Note that this is the first reported use of a $CO_2$ laser for annealing solution phase graphene films. This laser can be used on graphene coated on thermally sensitive substrates (paper or polymers). This laser process etches holes/pore (e.g. ~100 nm-2 µm) in the graphene surface instead of "tuning" the graphene flake vertically as we have shown previously with a ND:YAG and diode laser. The invention can be applied in analogous ways to other electroactive materials with exposure and removal of hard templates by a variety of ways.

6. This process has been demonstrated to enhance the electrochemical surface area/activity of an ACHE biosensor with a limit of detection of paraoxon <10 nM and a graphene supercapacitor with high energy/power density. It can be used for these and other beneficial applications for other electroactive materials.

7. Analogous steps, with appropriate variations, can be used for other electroactive materials, other porogens including non-solvating, and other porogen exposure/removal techniques.

C. Specific Embodiment 1

To further help in understanding the principles of the generalized invention, more specific examples are discussed in detail below.

1. Introduction

The following are specific exemplary embodiments and examples of forms and aspects of the present invention. The following is substantially the contents of Hondred, Medintz, and Claussen, Enhanced electrochemical biosensor and supercaparitor with 31) porous architectured graphene via salt impregnated inkjet maskless lithography, *Nanoscale Horiz*, 2019, 4, 735-746, which is incorporated by reference herein in its entirety, including supplementary information available as of Oct. 30, 2019 at https://pubs.rsc.org/en/content/articlelanding/2019/nh/c8nh00377#!divAbstract.

2. Methods and Materials 2.1. Chemicals and Reagents

Completely chemically reduced single layer graphene oxide (referred to henceforth as graphene) was purchased from ACS Materials (GN1P0005). Sodium chloride (NaCl) was purchased from Sigma-Aldrich, ground using mortar and pestle, and filtered into different sizes with 8 in wire cloth sieves. Acetylcholinesterase (ACHE) from Electrophorus electricus was purchased from Sigma Aldrich as lyophilized powder (200-1000 units per mg) and was used without any further purification. ACHE ink aliquots were made by dissolving the enzyme (2 mg) in 1 mL of 50% glycerol and 50% 1× phosphate-buffer solution (0.1 M PBS, pH 7.0), aliquoted into 25 µL, and stored in a −80° C. freezer until use. All pesticides (including paraoxon) were obtained from Chem Service. All other chemicals and solvents were purchased from Sigma-Aldrich and were used without any other purification unless otherwise stated. Water was filtered through a B-Pure Water Purification system (resistivity, 18.2 $M\Omega\ cm^{-2}$).

2.2. Electrode Fabrication 2.2.1 Printing Graphene Via Salt Impregnated Inkjet Maskless Lithography (SIIML)

Graphene electrodes were manufactured by modifying the inkjet maskless lithography (IML) method published earlier.[10,31] A highly concentrated graphene ink was fabricated by probe sonicated 100 mg ethylcellulose, 100 mg nitrocellulose, and 200 mg graphene in a solution of 25 mL terpineol and 200 mL of acetone for 4 hours, followed by boiling off the acetone. Ethylcellulose and nitrocellulose have been shown to help suspend the graphene flakes in solvents, improve the adhesion of the graphene to the surface, and carbonize upon annealing which reducing flake to flake resistance. Sieved microsized salt crystals (<25 to ~250 µm) were then incorporated into the graphene ink which made macrosized pores into the patterned graphene surface, henceforth referred to as salt impregnated inkjet maskless lithography (SIIML). In summary, a sacrificial polymer layer (20% formaldehyde resin and 80% cyclohexanone) was inkjet printed using a Dimatix Material Printer (DMP-2850, 10 pL nozzles) onto heat treated polyethylene terephthalate (PET, [kemafoil, Coveme TSL W]). A highly concentrated graphene ink was spin-coated (1000 rpm for 30 s) over the patterned sacrificial layer and post-baked for 10 min under a heat gun (Steinel #HB1750K) at a distance of 18 inches. An additional layer of graphene ink was then spin-coated over the sample that included discrete-sized salt crystals (ground using mortar/pestle and sieved into distinct sizes, 25-50 µm unless noted otherwise). The graphene ink was typically used immediately, but only slight settling of salt was observed after a week and was easily vortex mixed back to a suspension for re-use. The substrate was then again post-baked to remove solvents and increase graphene adhesion, followed by impinging the entire surface with an acetone wash bottle to remove the sacrificial layer. This process created a highly defined electrode pattern with salt crystals impregnated within the surface.

2.2.2 $CO_2$ Laser Annealing

Figure 8:
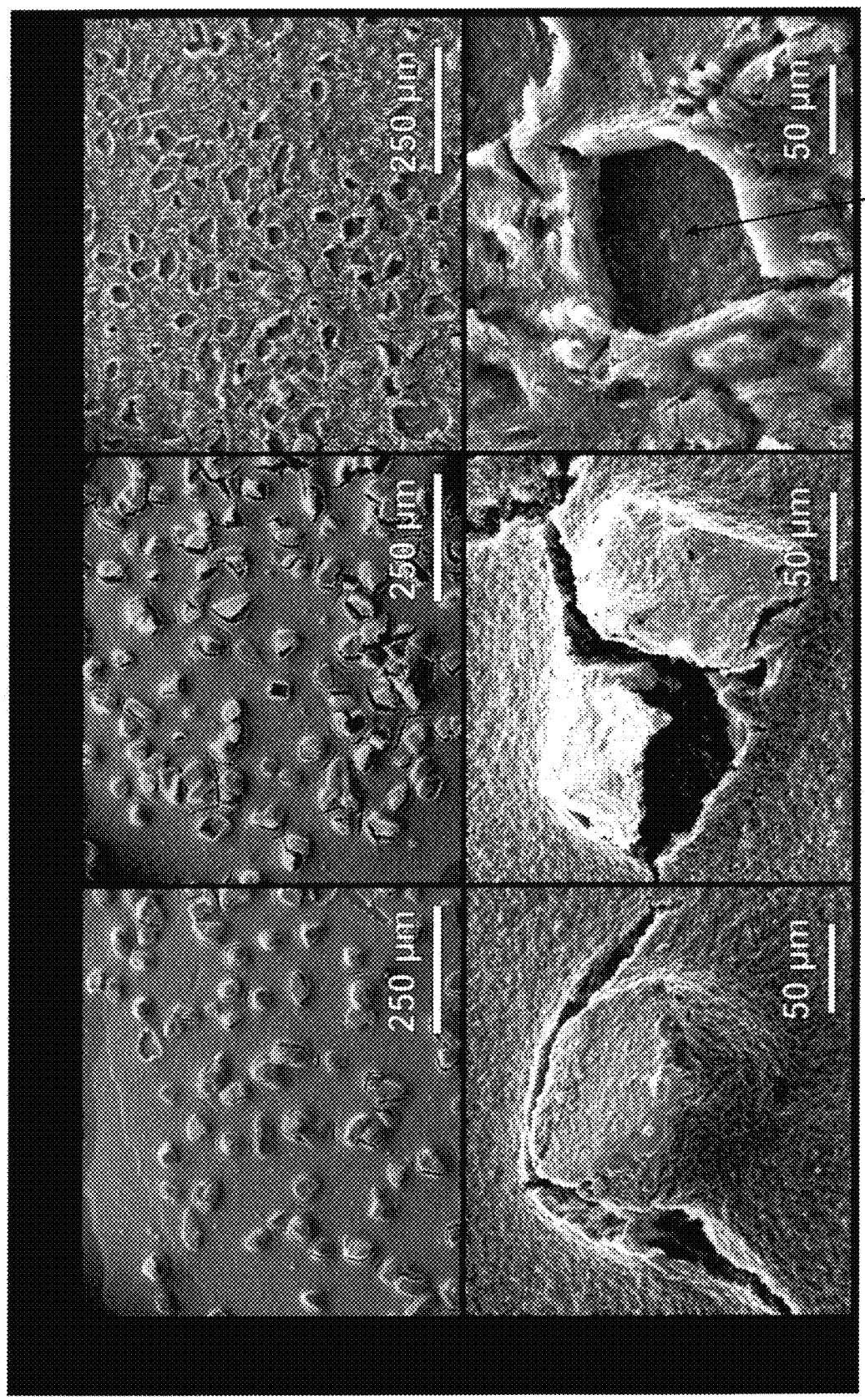
Figure 9:
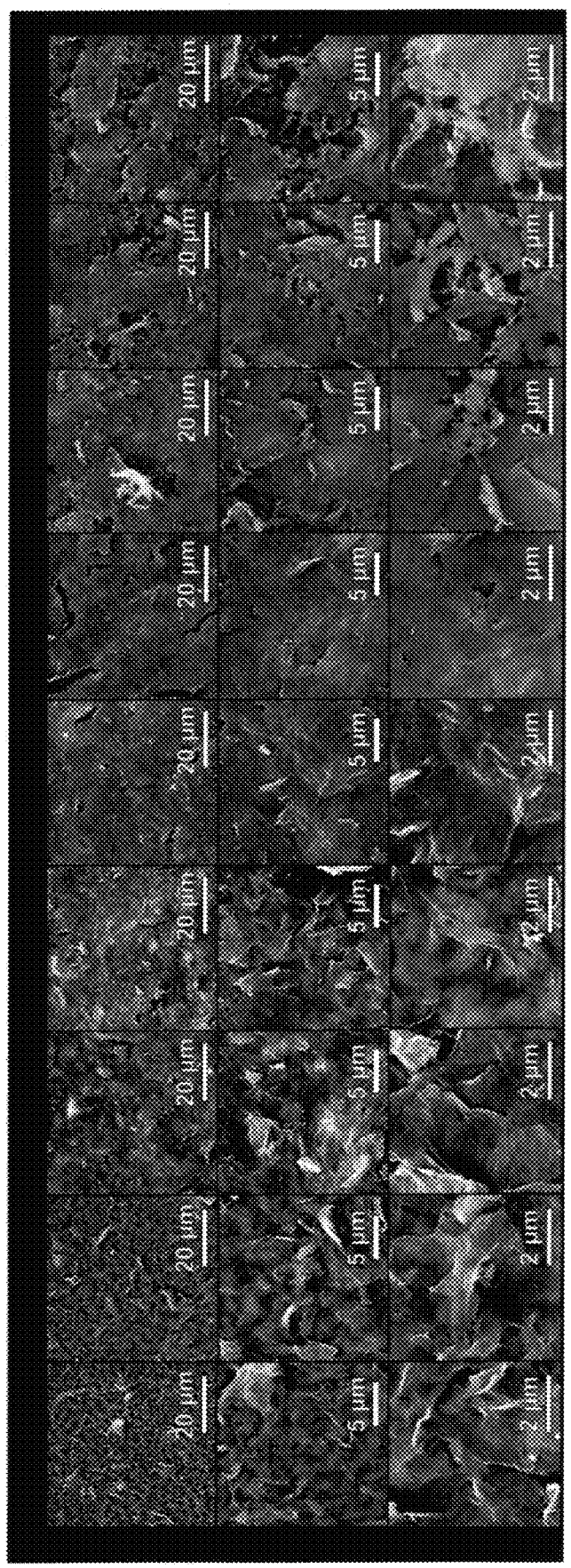

The SIIML graphene electrodes were laser annealed using a $CO_2$ laser engraver (Orion Motor Tech 40 W). The raster engraving rate was set to 350 mm $s^{-1}$ for all experiments, and the power of the engraver was set to 6.2% (estimated at 6.2 W) with a spot size ~150 unless otherwise specified. These settings were found to properly anneal the graphene (carbonize surfactants and "weld" flakes together)[9] which increased conductivity. Using a $CO_2$ laser to anneal and etch the surface of the graphene revealed the salt crystals, facilitating the "opening" of the macropore (ref no. 100 at FIG. 8, from Supplementary Information). Using a $CO_2$ laser also etched the individual graphene flakes making microsized pores (100 nm-2 µm) in graphene surface which further enhanced the catalytic abilities by providing additional edge defects (FIG. 9, from Supplementary Information).

2.3 Biosensor Design and Fabrication 2.3.1 ACHE Ink Preparation and Deposition

SIIML electrodes were functionalized with ACHE using 1-ethyl-3-(3-dimethylaminopropyl) carbodiimide and N-hydroxysuccinimide (EDC/NHS) chemistry, which facilitated the functionalization of carboxyl groups to the amines within the ACHE enzyme.[39] In summary, the $CO_2$ laser annealed SIIML electrodes were dipped in a solution of EDC/NHS mixture (50 mM EDC, 50 mM NHS) and incubated for 30 min on a tilter mixer. The electrodes were then rinsed with 1×PBS, excess water was blown off but not completely dried as the surface remained still "wetted", this allowed for easier pipetting onto the slightly hydrophobic graphene surface. Next, 5 µL of the pre-aliquoted ACHE solution was immediately pipetted onto the surface and incubated overnight. Electrodes were washed 3 times in 1×PBS to remove any unbound ACHE before testing. Note for final inhibition pesticide sensor, a diluted concentration (97%) of ACHE was immobilized on the electrode surface which provides a higher inhibition signal output. This is because less enzyme coverage equates to lower concentrations of pesticides that are needed to inhibit said enzyme and hence change the biosensor signal output.[40]

2.3.2 Electro-analytical Measurements

Figure 10:
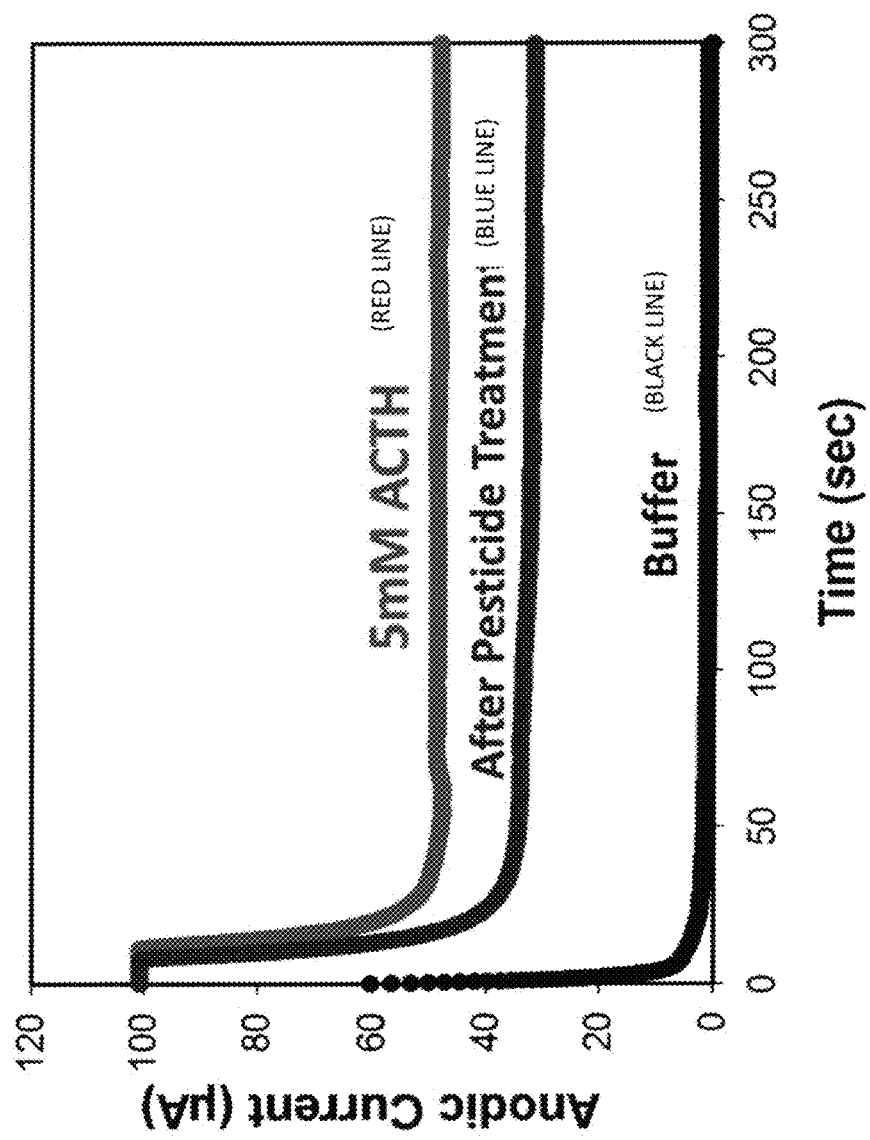
FIG. 10 is a representative amperometric graph depicting basic ACHE biosensor data extraction according to an exemplary embodiment of the present invention.

All electrochemical biosensor measurements and procedures were conducted on a CH instrument potentiostat (600E series) with a standard three electrode setup (single membrane Ag/AgCl reference electrode, platinum wire counter electrode, and $CO_2$ laser annealed SIIML graphene working electrode). Unless specified, each test was performed with 15 mL of 1×PBS buffer. For pesticide sensing, the biosensor was first tested in buffer to achieve baseline and ensure that solution did not contain contaminates that oxidize at 400 mV. The sensor was then tested in 5 mM ACTH to acquire a base sensitivity to ACTH. The biosensor was then placed into the aqueous test solution with the pesticide for a minimum of 500 s. During this incubation step, the pesticide diffuses to and permanently binds to ACHE, preventing it from catalyzing ACTH and therefore the product thiocholine from oxidizing on the electrode surface. The sensor is then rinsed with buffer and retested in the same 5 mM ACTH to acquire the decrease in amperometric response (referred to henceforth as inhibition sensitivity), see representative amperometric graph (FIG. 10, from Supplementary Information).

2.4 Supercapacitor Design and Fabrication 2.4.1 SIIML Graphene Supercapacitors Fabrication Graphene supercapacitors were designed similar to the SIIML graphene biosensor transduction layer, however, the rotation rate of the spin-coating process was increased from 1000 rpm to 2000 rpm so a thinner layer of graphene (~1.5 µm per layer) was deposited. A thinner layer (3 µm, verified through ion milling through sample and measuring cross-sectional height using SEM) was used in order to increase the overall power and energy density by using a smaller supercapacitor volume. A dry gel electrolyte was used for the supercapacitor consisting of poly(vinyl alcohol) and phosphoric acid ($PVA/H_3PO_4$).[29] In Short, 6 mL of DI water was mixed with 3 mL isopropol alcohol (IPA) and 1 mL concentrated $H_3PO_4$. The solution was then placed on a hotplate (80° C.) and 1 g PVA (poly(vinyl alcohol)) was slowly added until completely dissolved. A 25 µL aliquot of the solution was then pipetted onto each of the IDEs, which were placed in a dessicator for one hour to remove any air bubbles and ensure that the electrolyte properly wetted the porous graphene electrode. Finally, the electrodes were dried in ambient air overnight.

2.4.2 Electrochemical Supercapacitor Characterization

The SIIML and IML (no salt) graphene supercapacitors were characterized by cyclic voltammetry (CV) and galvanostatic charge-discharge (potentiometry) experiments with two electrode (shorting counter and reference) setup.[41] Capacitance at different current densities were calculated using the discharge curves obtained from galvanostatic graphs and eqn (1).

$$C = I \times \Delta t / \Delta U \tag{1}$$

where I is the applied current (amps), $\Delta t$ is the discharge time (s), and $\Delta U$ is the discharge voltage after self-discharge (IR drop of the electrode) is removed. Similarly aerial surface area capacitance (eqn (2)) and volumetric capacitance (eqn (3)) are calculated by dividing the capacitance by the aerial surface area (A=0.25 cm 2) and the total volume of the IDE (V=0.000075 cm 3), this includes active electrode area and space between electrodes $$C_\lambda = C/A \tag{2}$$

$$C_\lambda = C/V \tag{3}$$

The volumetric energy density ($E_V$) and power density ($P_V$) were calculated using eqn (4) and (5).

$$E_v = \frac{C_v \times \Delta U^2}{2 \times 3600 \times V} \tag{4}$$

$$P_v = \frac{C_v \times \Delta U^2}{2 \times V \times \Delta t} \tag{5}$$

2.5 Electrochemical Surface Area (ECSA) Calculations

Figure 11:
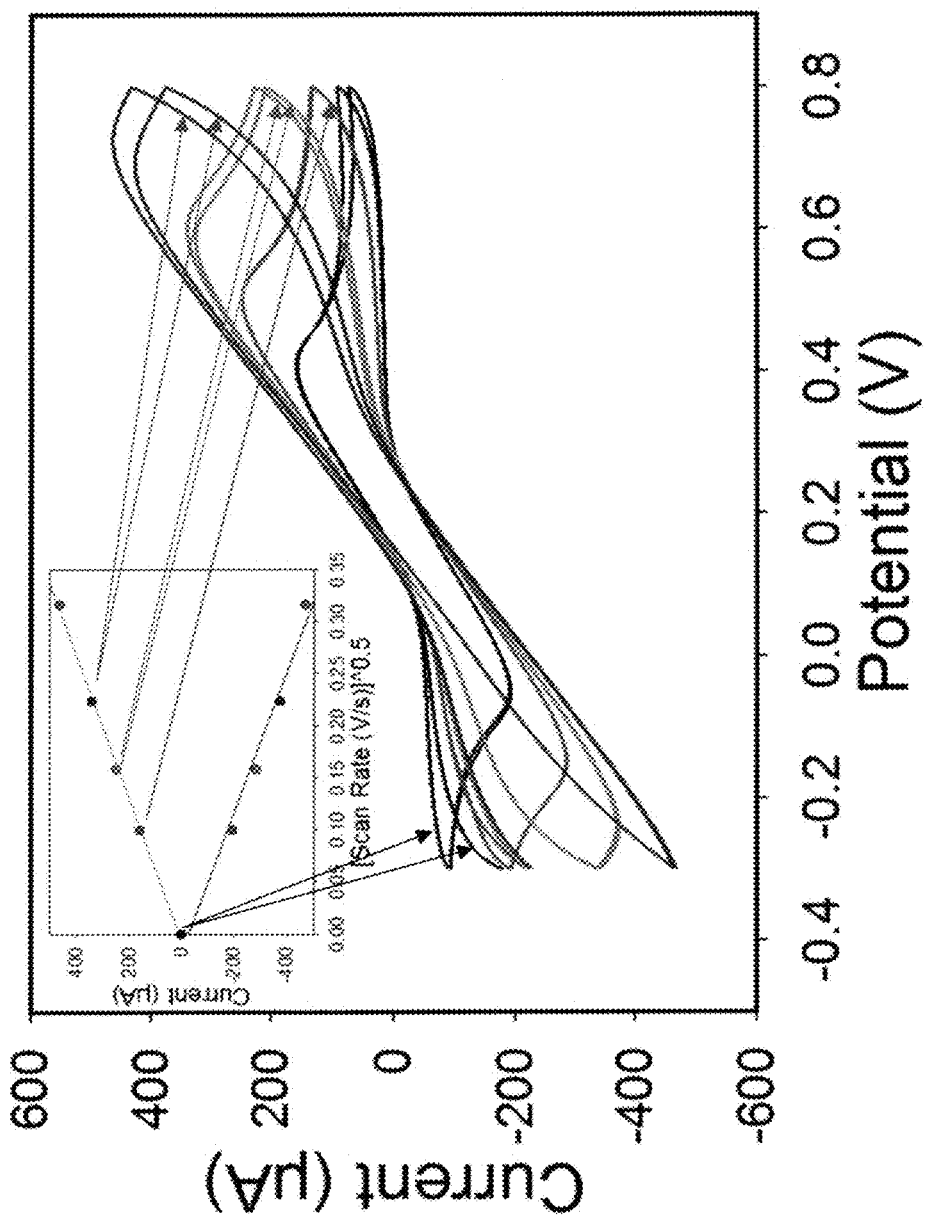
FIG. 11 is a representative cyclic voltammetry of SIIML graphene electrodes in 5 mM ferro/ferricyanide with various scan rates (5-50 mV/s) according to an exemplary embodiment of the present invention. Inset: Randles-Sevcik plot: anodic and cathodic currents vs. with square root of scan rate.

All ECSA experiments were conducted in 5 mM ferri/ferrocyanide in 1×PBS. CVs were conducted with three different scan rates (25, 50, and 100 mV s$^{-1}$) and were used to calculate the ECSA using the Randle-Sevcik equation (eqn (6)),[42,43] refer to representative graphs, FIG. 11 from Supplementary Information).

$$I_p = 2.69 \times 10^5 \, AD^{1/2} n^{3/2} v^{1/2} C \tag{6}$$

where A is the effective electroactive surface area (cm$^2$), D is the diffusion coefficient (7.6×10$^{-6}$ cm$^2$ s$^{-1}$), n is the number of electrons in the Faradaic reaction (n=1), v is the scan rate (V s$^{-1}$), C is the concentration of the bulk redox species (5 mM), and $I_p$ is the current at the oxidation peak. Note: the width between the anodic and cathodic peak often increased with higher scan rates which is often seen in very porous materials.[10]

2.6 Field Emission SEM Images

Field emissions scanning electron microscopy (FESEM) images were acquired using a FEI Quanta 250 FESEM. All images were magnified to 500×, 1500×, 5000×, or 15 000× using backscattering electrons, spot size of 3.0, and with a 10 kV potential. A 2 nm conductive coating of iridium was evenly coated over all samples with a turbo-pump sputter coater to improve surface imaging by preventing surface charging and hinders electrons from penetrating into the carbon material leading to poor surface contrast.

3. Results and Discussion 3.1 Biosensor Design and Optimization 3.1.1 Overview of SIIML of Graphene Electrode Fabrication Highly electroactive graphene transduction electrodes were fabricated by a modification to the newly developed IML process[10,31] which utilizes solution-phase graphene instead of CVD grown graphene eliminating the need for high temperature annealing (>1000° C.); the latter is costly and requires silicon wafer substrates which are insufficient for large scale roll-to-roll production.[44] This manufacturing method, coined salt impregnated inkjet maskless lithography (SIIML), incorporates salt crystal as porogens in the graphene ink during IML manufacturing creating macrosized pores in the graphene. Additionally, $CO_2$ laser annealing is employed which creates microsized pores in the surface of the graphene.

An exemplary method 10 according to the invention is diagrammatically illustrated at FIG. 1. First, a polymer sacrificial layer 14 is inkjet printed (ref no. 15) onto a disposable, low-cost, and flexible substrate 12 (PET), FIG. 1a. A highly concentrated graphene ink 16A is then spin-coated (ref no. 19) over the entire polymer sacrificial layer 14, followed by an additional graphene ink layer 16B impregnated with salt crystals 17. The entire sample 12/14/16A-B/17 is then post-baked with a heat-gun (not shown) to remove solvents and increase graphene adhesion to the substrates 12, FIG. 1b. As the salt crystals are ionic solids, they do not ionize in the non-polar organic solvent and when patterned form a hard template (porogen) for macrosized pores. The entire graphene surface 16A-B/17 is then impinged by an acetone wash bottle 22 which removes the underlying polymer sacrificial layer 14, patterning a highly-defined graphene electrode 20, FIG. 1c and FIGS. 16A-I from Movie from Supplementary Information). As acetone is not highly polar, the salt remains in its crystalline form as a hard template beneath the graphene surface. The graphene is then treated with a $CO_2$ laser 24 which anneals the surface, removes remaining solvents, carbonizes surfactants, and "welds" graphene flakes together.[9] The $CO_2$ laser also etches micropores into the graphene surface enhancing electrochemical activity by producing additional edge planes in the graphene surface. Furthermore, laser annealing also etches the graphene surface revealing the salt crystals, opening the surface for pore formation, FIG. 1d and FIG. 8. Finally, the electrode 20 is rinsed with DI water 26 which removes the salt porogen crystals, forming macrostructured pores 100 in the graphene surface, FIG. 1e and FIGS. 17A-C from Movie from Supplementary Information). These macropores improve electrochemical sensing by providing increased analyte diffusion rates and increased ECSA.

3.1.2 Overview of Pesticide Biosensor Mechanism and Fabrication mentioned and discussed in more details later, laser annealing graphene in ambient air conditions creates a high ECSA but also provides This immobilization strategy (EDC/NHS) was chosen as it has been widely studied, covalently crosslinks with "zero order" length to carboxylic functional groups, is water soluble (no prior organic solvent dissolution necessary) and provides excellent subsequent stability to enzymes.[46] First, EDC reacts with carboxyl groups (formed through laser annealing) to make an O-acylisourea intermediate ester. Second, to increase stability of this short-lived ester, NHS is added to form a stable amine-reactive NHS ester, which increases immobilization efficiency of EDC coupling reaction.[47] Finally, ACHE is then bound to the ester by a free amine in the enzyme, FIG. 2a.

Figure 2:
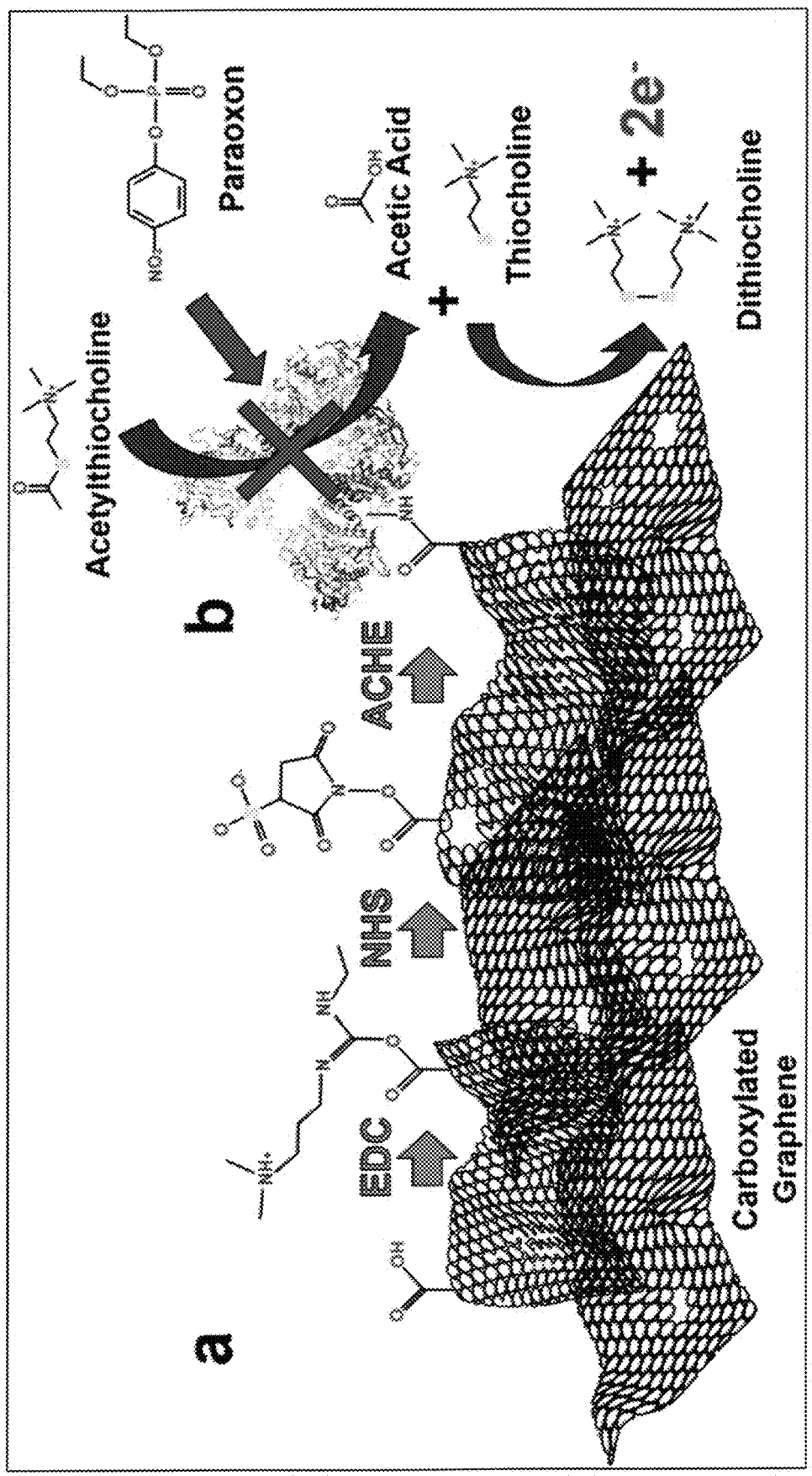
Figure 12:
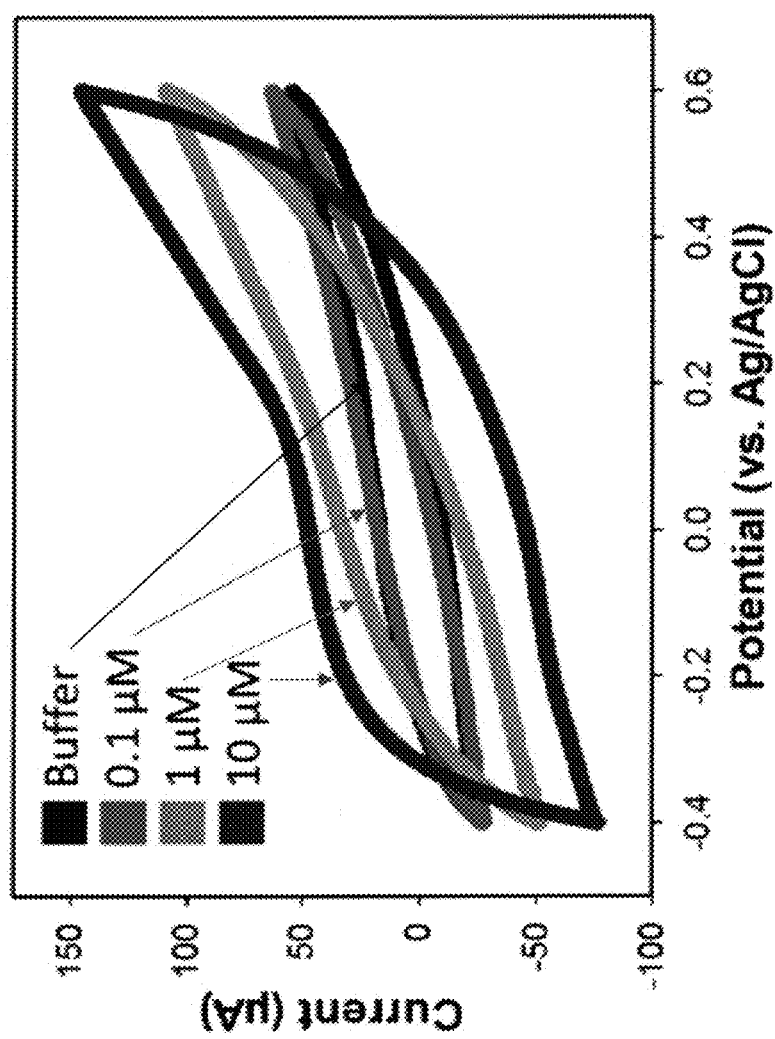
FIG. 12 is a cyclical voltammetry showing increase in ACTH concentration according to an exemplary embodiment of the present invention.

The use of ACHE for inhibited pesticide biosensing has been demonstrated many times in the literature, but for clarity, FIG. 2b illustrates its basic mechanism. The biosensor operates by hydrolyzing the molecule ACTH which produces acetic acid and thiocholine. Two thiocholine molecules are oxidized at the graphene surface at an applied potential of 400 mV, FIG. 12 from Supplementary Information; this reaction produces dithiocholine and two electrons. The thiocholine oxidation reaction is used as a baseline amperometric signal for sensing the inhibition of ACHE by pesticides. As increasing concentrations of pesticides are added to the solution, more ACHE is inhibited which prevents the formation of thiocholine, consequently this reduces the oxidation and amperometric current (see representative amperometric graphs in FIG. 10.

3.1.3 Laser Annealing Process

Figure 3:
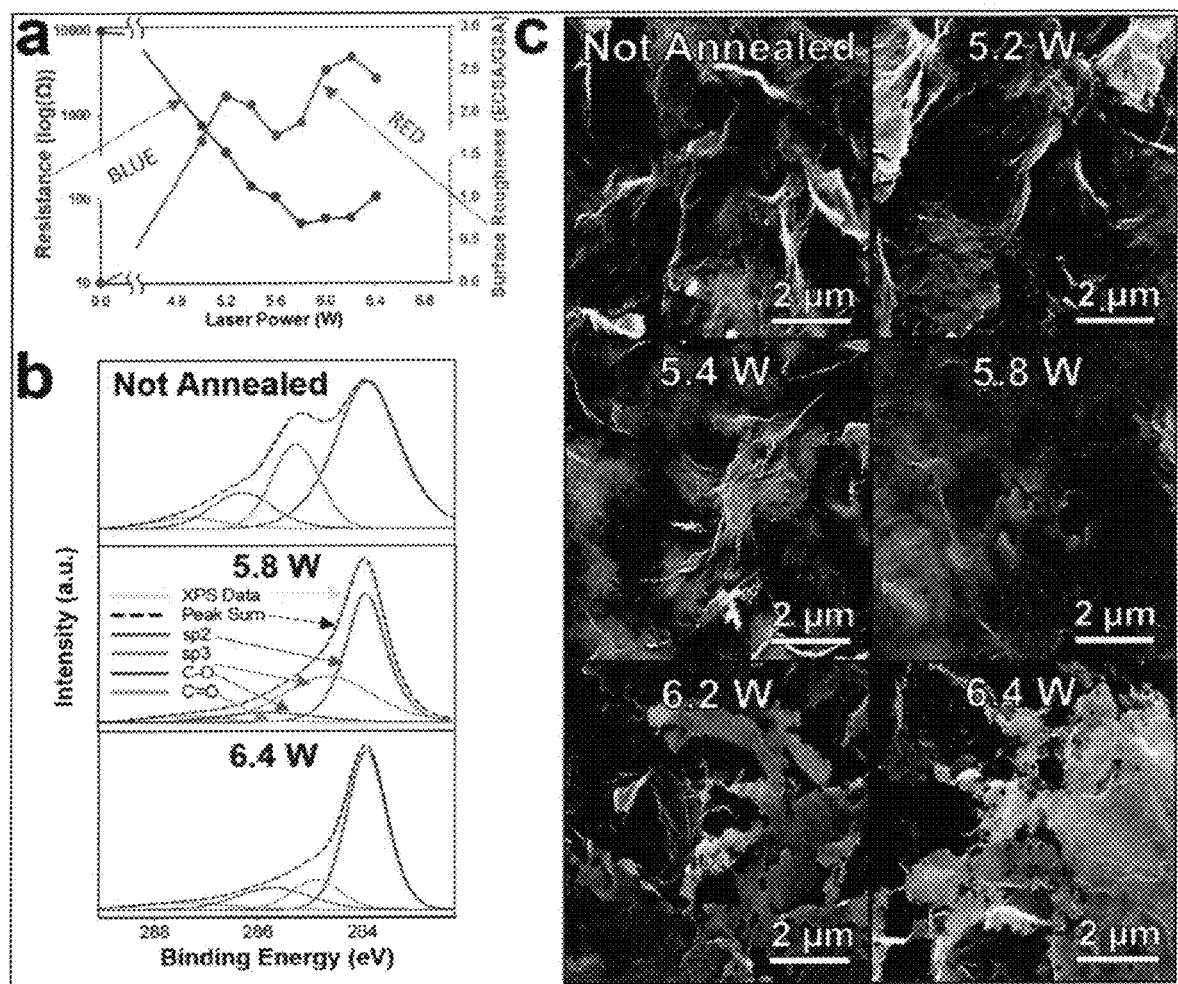

Herein, we demonstrate for the first-time laser annealing solution-phase printed graphene with a $CO_2$ laser. Similar to our previously published work with a Nd:YAG[9,48] and diode laser,[10,31] annealing the SIIML graphene with a $CO_2$ laser also significantly increased the conductivity by "welding" individual graphene flakes together and carbonizing the surfactants (ethyl/nitrocellulose) which reduces flake-to-flake resistance. The power of the $CO_2$ laser was incrementally increased from 5% to 6.4% (estimated as 5-6.4 W) which significantly lowered the sheet resistance of the graphene nearly 3 orders of magnitude (>10 000 $\Omega sq^{-1}$ to ~50 $\Omega sq^{-1}$) (FIG. 3a (blue)). We further confirm the carbonizing of the surfactants by XPS which shows a decrease in the $sp^3$ peak (green) which we attribute to ethyl/nitrocellulose, FIG. 3b. Interestingly, unlike the diode laser or the Nd:YAG,[9,10,31] the $CO_2$ laser does not alter the graphene flake orientation; rather, it fuses graphene flakes together (5 W till 5.8 W) increasing the conductivity (~10 $k\Omega sq^{-1}$, to −50 $\Omega sq^{-1}$, FIG. 3a (blue)), then etches through the surface making microsize pores (FIG. 3c). The surface roughness (electrochemical surface area/geometric surface area) of the laser annealed graphene begins to increase (FIG. 3a (red)) as the resistance of the electrode decreases. The not annealed patterned graphene initially has a negligible surface roughness and high electrical resistance. When laser annealing at a power of 5.2 W the graphene surface roughness increased to 2.2. However, as the laser power increased past 5.2 W the graphene flakes begin to "weld" together making a flat plane which decreases the ECSA (surface roughness of 1.7 at 5.6 W) due to decreases in available edge planes. Further increasing the laser power not only "welds" the graphene flakes together promoting even higher conductivity but starts to etch through the basal planes of the graphene which leads to increased edge plane defects by making microsize pores (100 nm-2 μm) in the graphene surface and consequently increasing the electrochemical surface roughness (2.6 at a power of 6.2 W). The conductivity and surface area both decrease after 6.2 W as the graphene is etched through the surface and the substrate begins to degrade. Therefore, for all further experiments the $CO_2$ laser was set to 6.2 W with a 350 mm $s^{-1}$ raster rate.

Figure 13:
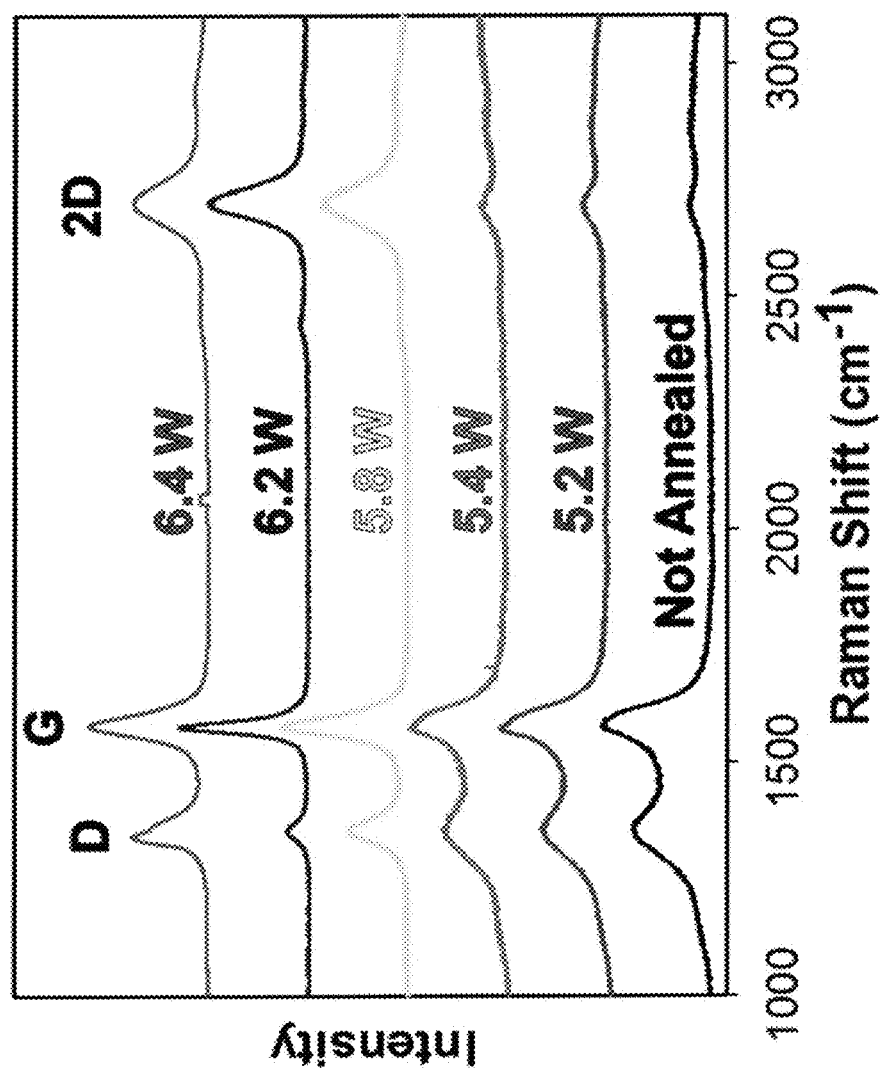
FIG. 13 is a Raman spectra of not annealed graphene and increasing $CO_2$ laser powers according to an exemplary embodiment of the present invention.

Raman spectroscopy was employed to analyze the atomic structure of the printed graphene and the effect of $CO_2$ laser annealing. FIG. 13 from Supplementary Information displays the Raman spectra collected from not annealed and increasing laser power annealed graphene (5.2-6.4 W) with a backscattering geometry, 1064 nm Nd:YAG laser and spot size of 1 mm. Note that the spectra has been standardized so all samples have consistent G peak heights. The not annealed printed graphene displayed distinct D and G peaks which are characteristic for graphene and graphitic samples. However, the sharp 2D peak, typically associated with graphene is not visible. The loss of the 2D peak is probably due to the high concentration of surfactants within the printed graphene sample and possible impurities/functional groups on the graphene surface. However, as the laser power increases from 5.2 W to 6.2 W the 2D peak develops, indicating the formation of a graphene like structure by energetic photon irradiation. Furthermore, as the laser intensity increases, there is a decrease in (ID/IG) ratio (from 0.72 for not annealed graphene to 0.17 for 6.2 W) which suggests that the printed graphene forms a higher degree in edge-induced defects, which are conducive towards enhanced electrochemical reactivity.[9,49] Additionally as the laser power increases there is an increase in $(I_{2D}/I_G)$ ratio (from 0.23 for not annealed graphene to 0.78 for annealed graphene with a laser power of 6.2 W) which correlates with reported multilayer graphene structures.[50] At a laser power of 6.4 W, the ratios reverse as the samples are etching through the surface and there are possible formation of van der Waals bonds into more a graphitic nature. In summary, the emergence of a symmetric 2D peak with an increase in $(I_G/I_D)$ and $(I_{2D}/I_G)$ ratio at higher laser powers demonstrates the carbon surface is more nanostructured or nanotextured with a higher amount of edge defects and the $sp^2$ honeycomb lattice of the surface becomes more favorable to classification as multilayered graphene.

It is interesting that we do not see a significant increase in graphene oxidation (FIG. 3b) as we are laser annealing in ambient oxygen atmosphere as seen by our previous work with a diode laser.[31] Instead there is approximately a consistent small oxide layer formed across all laser powers. These oxide functional groups are most likely superficial as oxidizing deep into the graphene electrode would decrease the electrode conductivity (not seen in FIG. 3a), which may partially explain the lower sheet resistance of $CO_2$ laser annealing (~50 $\Omega sq^{-1}$) compared to using a diode laser (~100 $\Omega sq^{-1}$).[10] In any case, the oxidation groups and defects in the graphene surface provides effective functionalization locations for both biomolecules or even nanoparticle nucleation locations, as we have shown previously.[9,10,31]

3.1.4 Salt Impregnation Process

Figure 14:
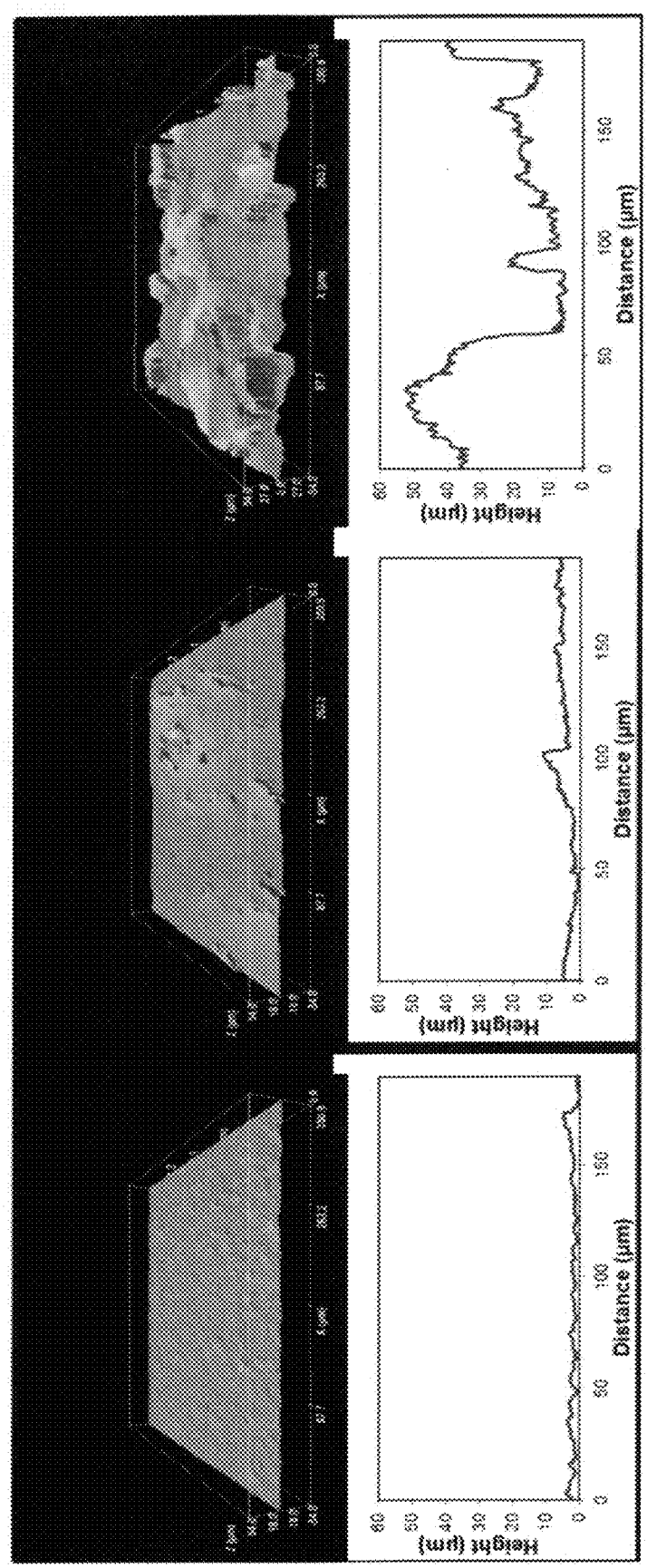
FIG. 14 is a confocal microscopy photos of not annealed graphene, laser annealed graphene, and macroporous SIIML graphene along with corresponding surface profiles according to an exemplary embodiment of the present invention.

The ECSA of the graphene electrodes was enhanced by incorporating macrosized pores via salt crystals in the graphene ink. Distinct sized salt crystals (ground using mortar and pestle and sieved into different sizes) were incorporated directly into the second layer of spin-coated graphene ink. Once dried, these salt crystals acted as porogens (hard templates) for macrosized pore formations in the graphene surface, and were subsequently removed by washing with DI water, (see FIGS. 16A-I and 17A-C, Movie excerpts from Supplementary Information). Inks with various size salt crystals (100-250 μm, 75-100 μm, 50-75 μm, 25-50 μm, and <25 μm, based on sieve mesh size) were made and cast with IML to better characterize the microstructuring and electrochemical enhancement of SIIML. The surfaces were imaged with SEM, FIG. 4a, displaying the distinct pore structure which is controlled by the size of the salt crystals used. An electrode with no salt incorporated into the second spin-coated layer was used as a control sample and exhibit a relatively smooth surface with limited surface structures (apart from micropores formed from the laser annealing), FIG. 4a and FIG. 14 from Supplementary Information. As the salt crystal size decreases, a denser pore array is formed due to a higher salt suspension stability of the ink and the salt is able to form a tighter array when spin-coated on the surface.

Figure 4:
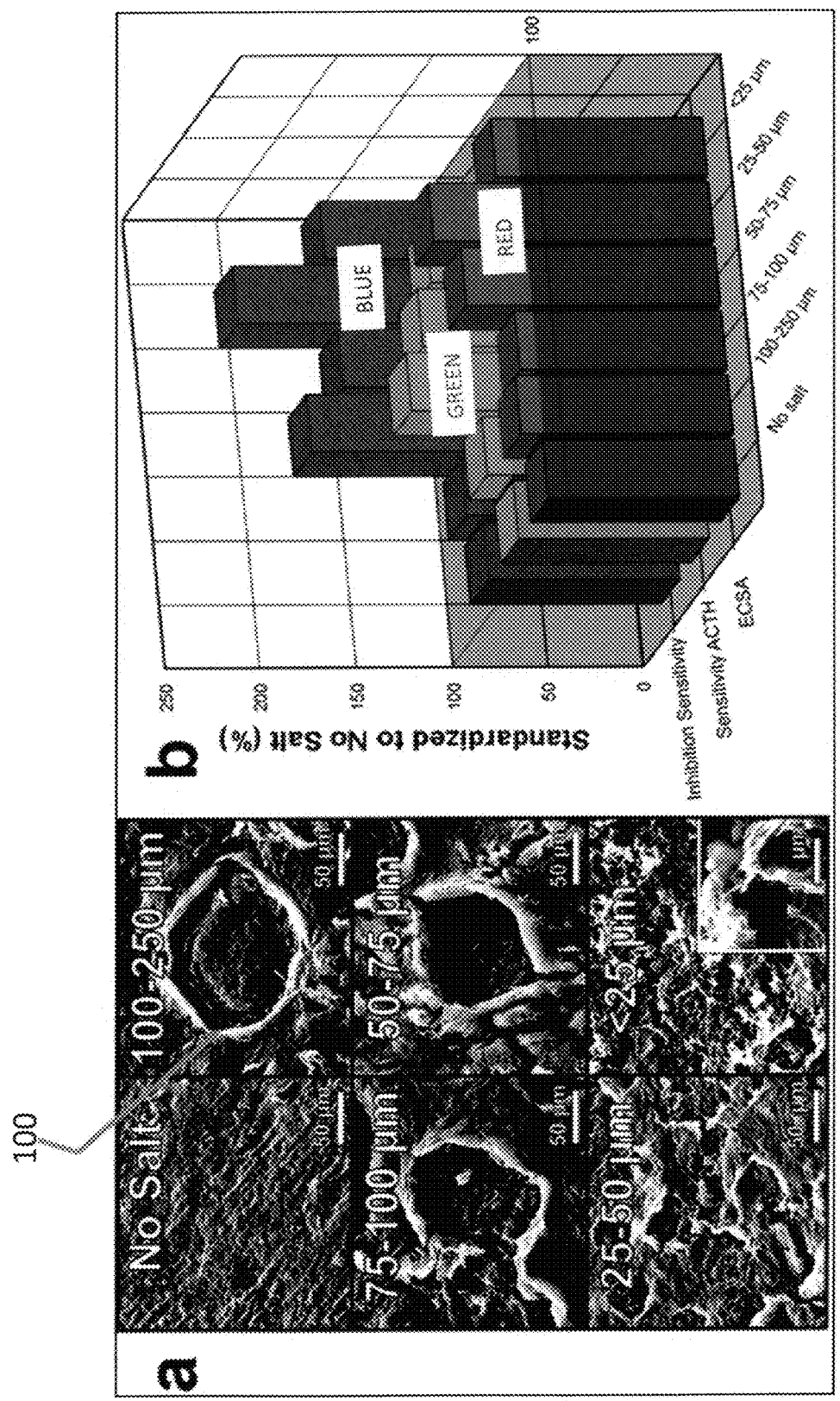

This tighter pore array as well as the increased "surface-to-volume" effect (smaller pores will have higher surface area per vacancy ratio) results in an increase in surface area as the size of the pores decrease, FIG. 4b (red). This effect is clearly seen by an over 50% increase in ECSA of electrodes made with 25-50 μm pores compared to electrodes made without salt pores. Interesting, after the pore size decrease below 25 μm, there is a significant decrease in ECSA. While it is not completely understood, we speculate that the size is approaching the microporous size made by laser annealing and is therefore mitigating the effect of one or the other. Additionally, this decrease in ECSA could be from the decrease in perpendicular diffusion of substrate into the electrode which would decrease the electroactivity of the substrate.

Increasing the EC SA of the graphene by incorporating pores significantly enhanced the electroactivity of the electrode by providing additional sites for oxidation or reduction of the substrate.[9] Moreover, the higher surface area of the porous graphene also provides additional binding locations for enzymes immobilization, which allow for improved substrate diffusion kinetics and consequently enhanced catalysis.[10] Both of these effects improve the performance of the biosensor which increases its sensitivity to the analyte of interest. To test this, the electrodes were placed in a concentrated solution (5 mM) of ACTH with a working potential of 400 mV (versus Ag/AgCl). When ACTH reacts with ACHE, thiocholine is produced which oxidizes at the electrode. The corresponding increase in current due to the sensitivity to ACTH was graphed, FIG. 4b (green). As the size of the pores decrease and the ECSA increases, there is a general increase in sensitivity to ACTH as expected. Variations from this trend (150% for 75-100 μm and 133% for 25-50 μm), are likely due to manufacturing errors (enzyme loading differences), experimental setup (sensors did not full equalize to baseline), or random/systematic errors. These results are further demonstrated by SIIML graphene biosensor with 25-50 μm being over 2 times more sensitive to the ACHE than without salt pores, FIG. 4b (blue). For all further experiments, 25-50 μm salt particles were used as they exhibited the highest ECSA and was the most sensitive to paraoxon.

Figure 5:
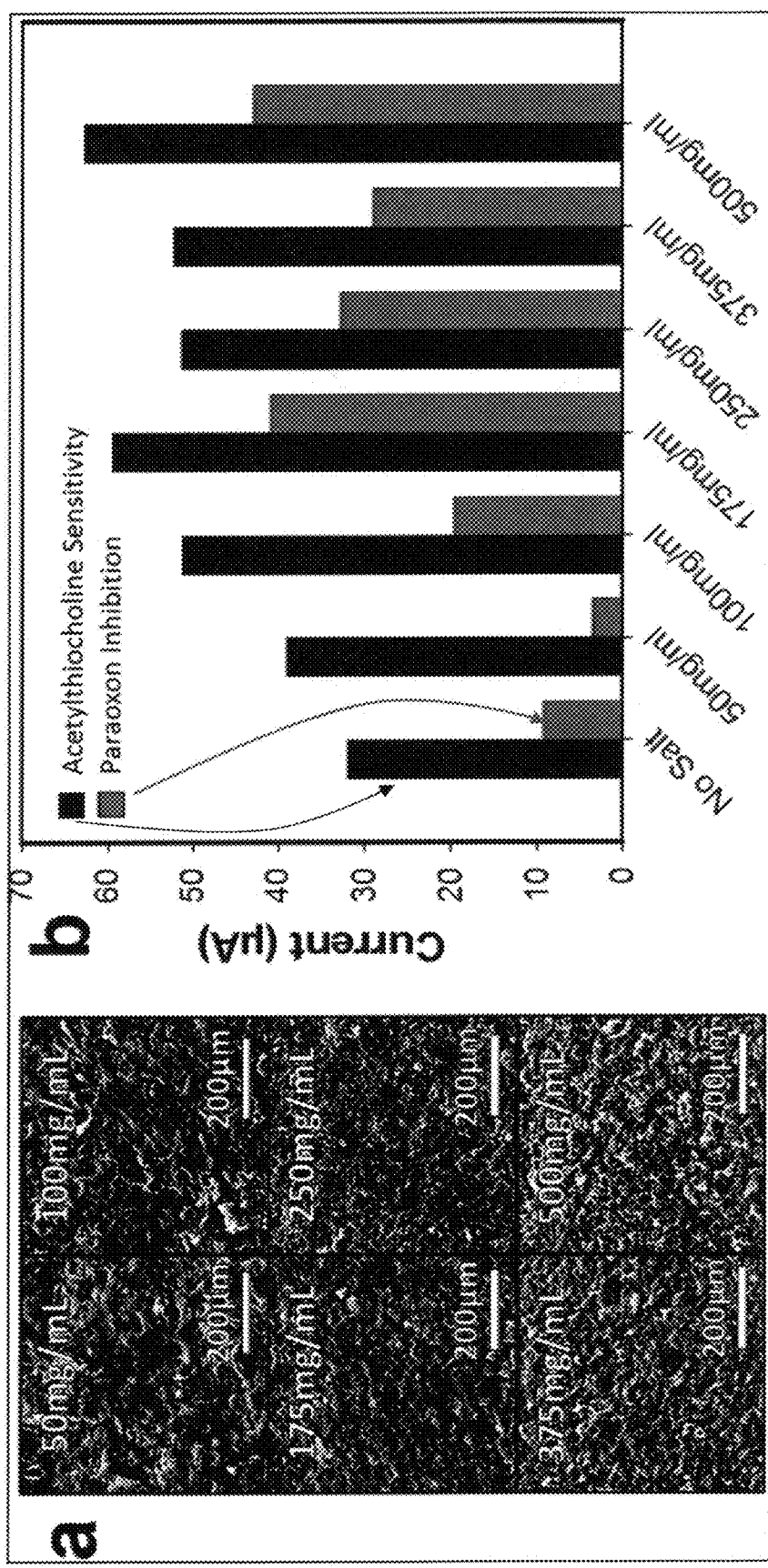

The concentration of the 25-50 μm salt/graphene ink suspension was varied to improve the pore array density of the graphene surface, FIG. 5a. As the salt concentration increased, the pores in the graphene surface on average come closer together forming a denser pore array. At 50 mg $mL^{-1}$, the pores are fairly far apart, and a sparse array is formed (roughly estimated by visibly counting pores in SEM, ~75-125 pores per cm). When the concentration was increased to 250 mg $mL^{-1}$ a network of pores are formed (~300-500 pores per cm), and at 500 mg $mL^{-1}$ a very dense array of pores is present (~500-750 pores per cm). Note that as the concentration of salt increases and the salt packs closer together, the pore structures are harder to distinguish due to overlap. Additionally, as the salt concentration increases, the viscosity of the graphene ink also increases. At 500 mg $mL^{-1}$, the ink is much more viscous (making it more difficult to spin-coat) and so a thicker layer of graphene may have been applied which results in the salt not all lying flat against the bottom surface causing salt porogen overlap, FIG. 14 from Supplementary Information.

As the pore structure in the graphene becomes denser, the biosensor electrode (functionalized with ACHE), becomes more sensitive to ACTH (FIG. 5b), however, it appears that after 175 mg mL$^{-1}$, the anodic current relatively plateaus. Interesting, this trend is not completely observed with the inhibition sensitivity of paraoxon and after 175 mg mL$^{-1}$ the sensitivity begins to decrease. This observation is not easily explained, but we speculate that the higher surface area increased the loading of the enzyme on the graphene, resulting in more enzyme that needed to be inhibited. As the concentration of 175 mg mL$^{-1}$ yielded a porous graphene biosensor with the most sensitivity to ACTH and the signal response was most inhibited by paraoxon, all further experiments were conducted with this salt concentration.

3.2 Biosensor Performance Characterization

Figure 6A:
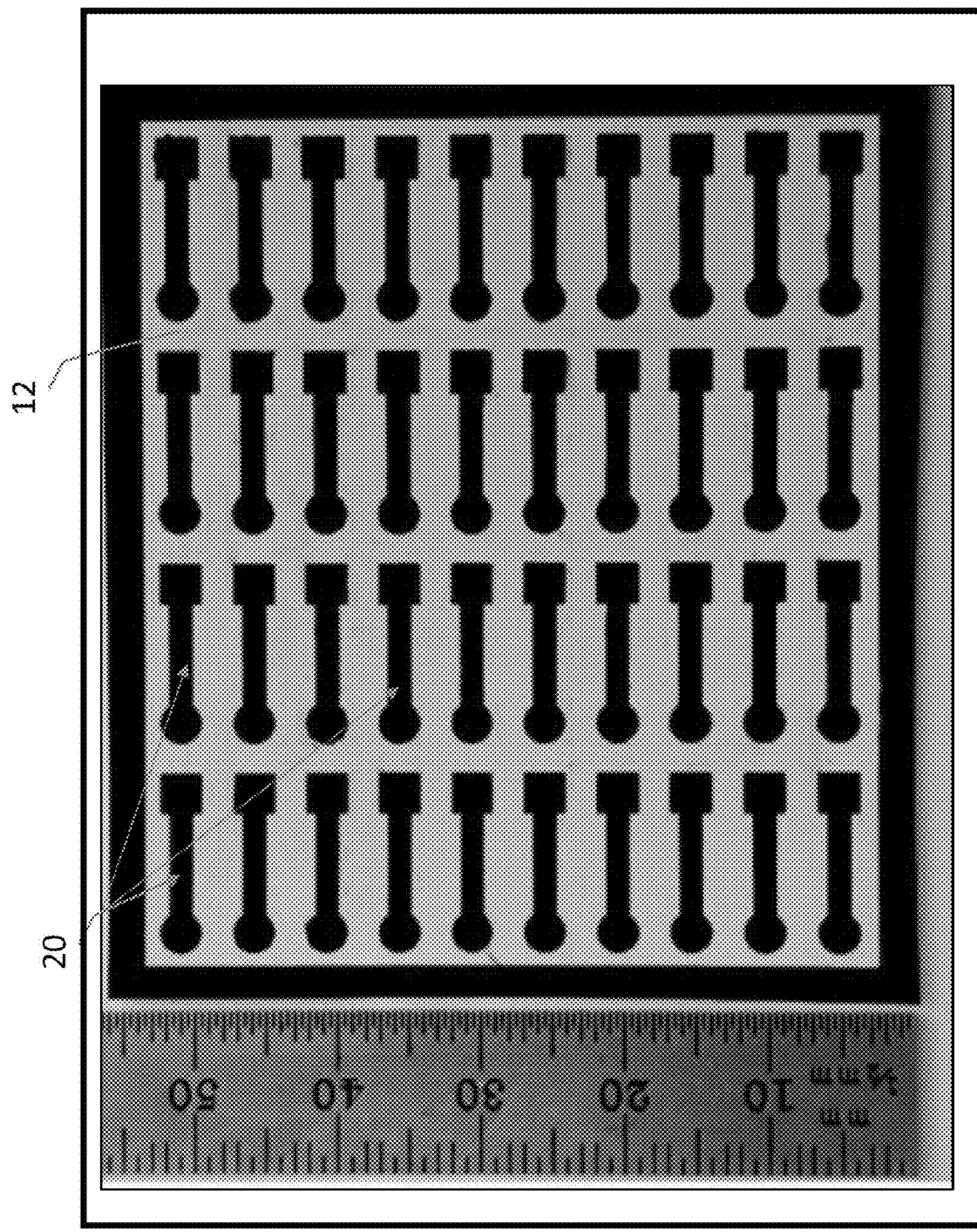
Figure 6B:
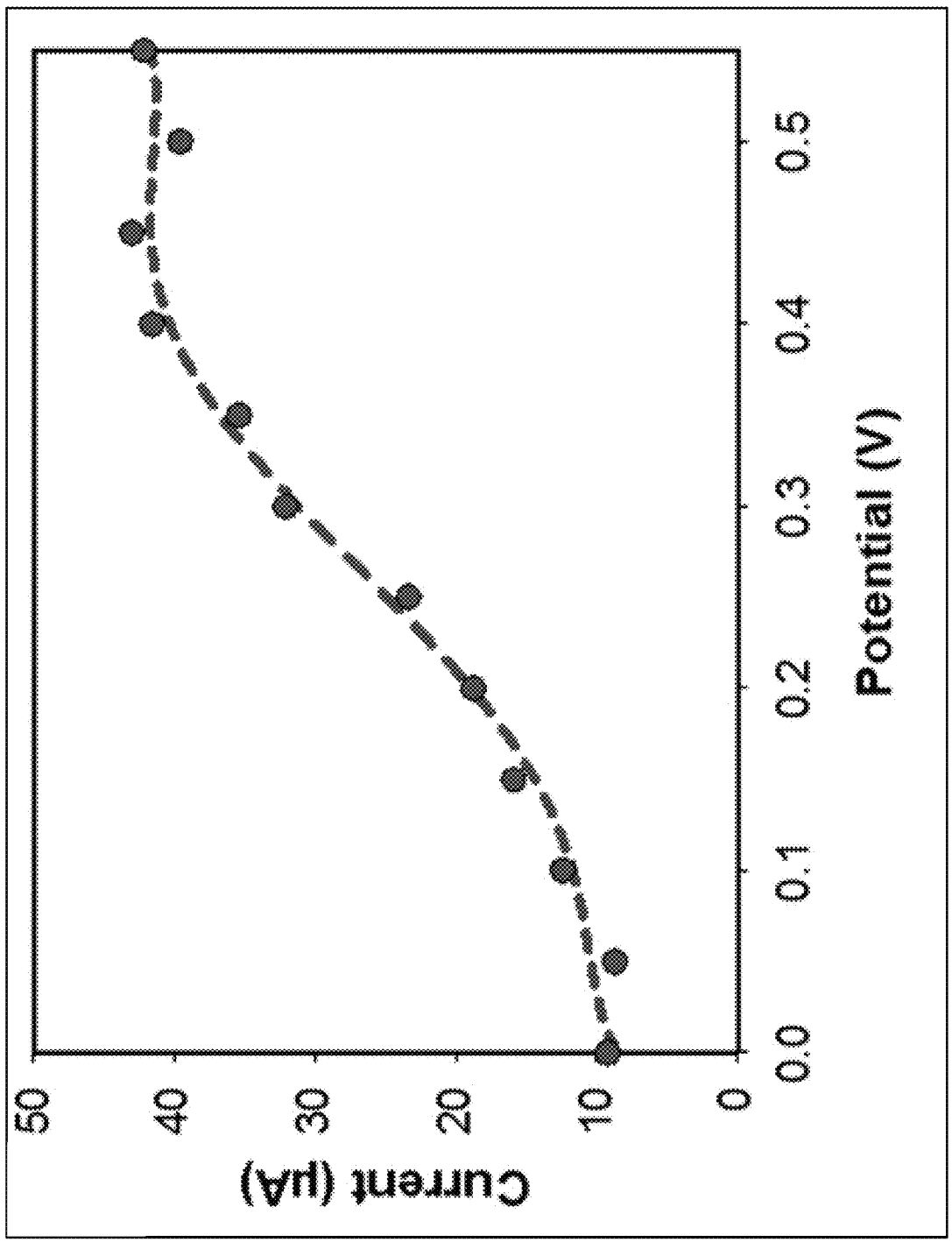

The electrochemical activity of SIM, graphene electrodes was demonstrated by manufacturing a pesticide biosensor using ACHE and refined parameters shown previously (6.2 W $CO_2$ laser annealing, 50-75 μm salt pores, and 175 mg mL$^{-1}$ salt concentration). First, an array (4×10) of 3 mm diameter disk electrodes (ref no. 20) were manufactured using the procedure outlined in the Overview SIIML Graphene Electrode Fabrication (FIG. 6a). A lacquer was then pipetted onto the stem of the electrode to isolate the working area (3 mm diameter disk) and biofunctionalization was carried out as described in the Overview Pesticide Biosensor Fabrication. The ACHE pesticide sensor was placed in a saturated solution (5 mM) of ACTH and amperometric current was recorded with changing potentials (FIG. 6b). When the potential reached 200 mV (versus Ag/AgCl) there was an increase in anodic current due to the oxidation of thiocholine. This oxidation current increases as the applied potential approaches 400 mV then plateaus, therefore, an applied potential of 400 mV was chosen for the ACHE biosensor. This observation is in good agreement with CV scans that show an oxidation peak around 400 mV (FIG. 12 from Supplementary Information) and similarly reported in the literature.[51,52]

Figure 6C:
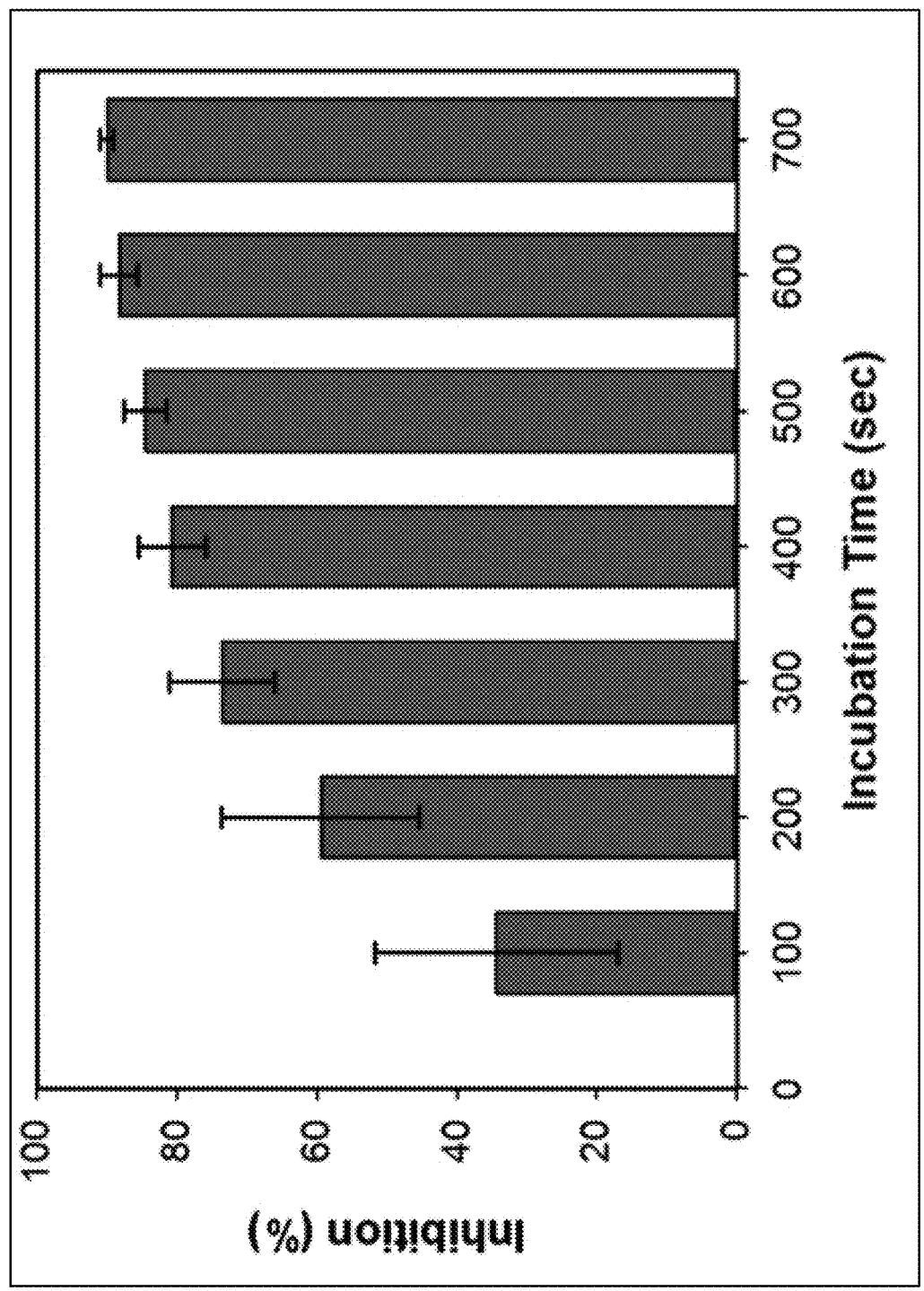

ACHE pesticide biosensors rely on the inhibition of the enzyme (paraoxon irreversibly binds to ACHE which prevents ACTH from catalyzing and hence thiocholine from oxidizing). Therefore, to test the amount of time required for organophosphates to diffuse to the electrode surface and bind to ACHE, we incubated the sensors in 1 μM of paraoxon and recorded the decrease in amperometric oxidation current (which correlates directly with the percent of ACHE inhibited), FIG. 6c. After 100 seconds, there is roughly 50% inhibition of the sensor with large standard deviations; however, after 500 seconds, there is about 90% inhibition with low standard deviation and minimal change over the next couple of hundred seconds. Therefore, an incubation time of 500 seconds was used as a minimal time for sensor operation.

Figure 6D:
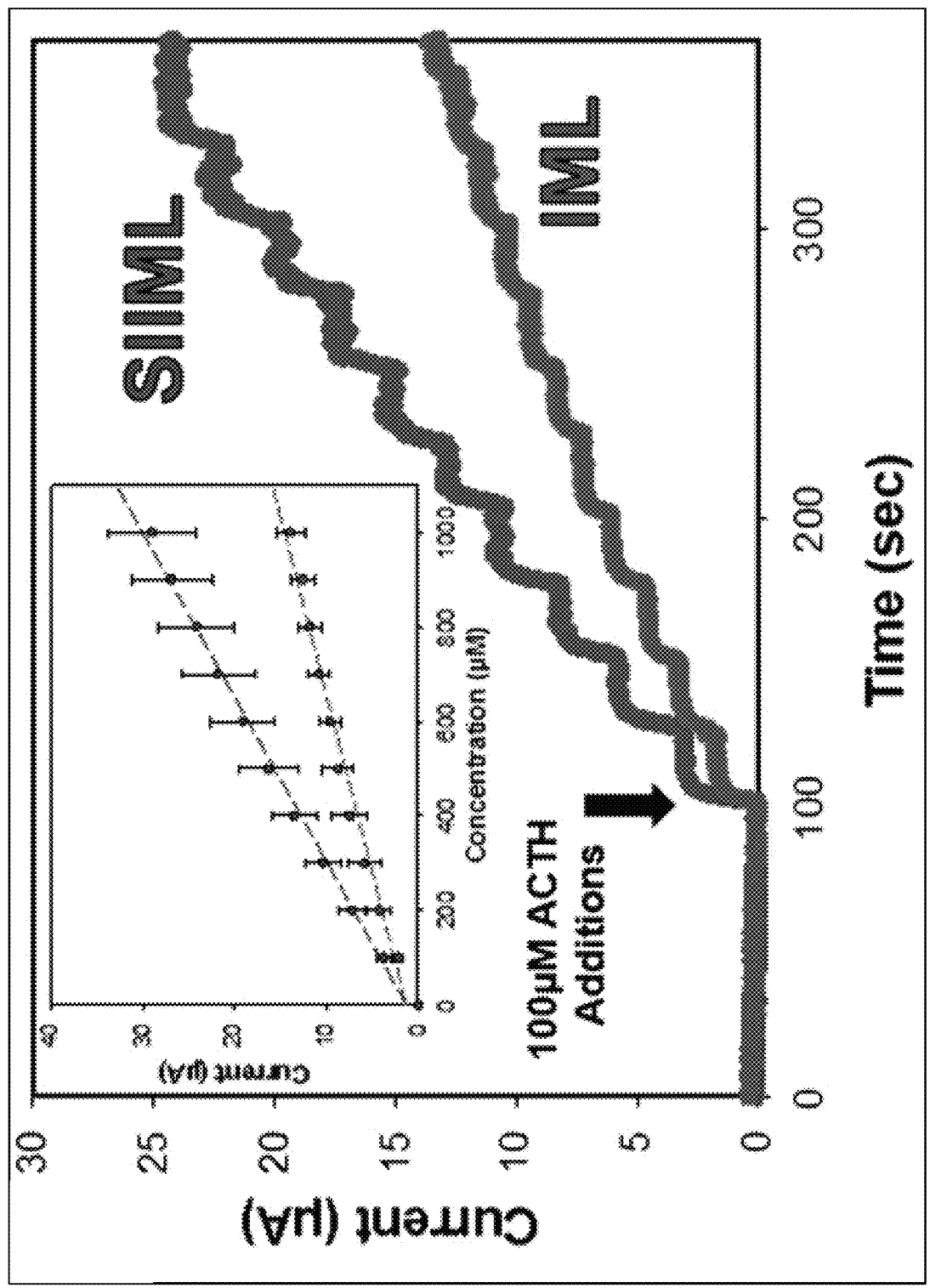

Graphene electrodes were made with (SIIML) and without salt pores (IML) for comparison. Increasing concentrations of ACTH (100 μM additions) were spiked into a buffer solution and the amperometric anodic current was recorded for both SIIML and IML. The electrodes containing salt pores had a sensitivity to ACTH of 28.3 μA nM$^{-1}$ while the electrodes without salt pores had a sensitivity of ~13.3 μA nM$^{-1}$, FIG. 6d.

Figure 6E:
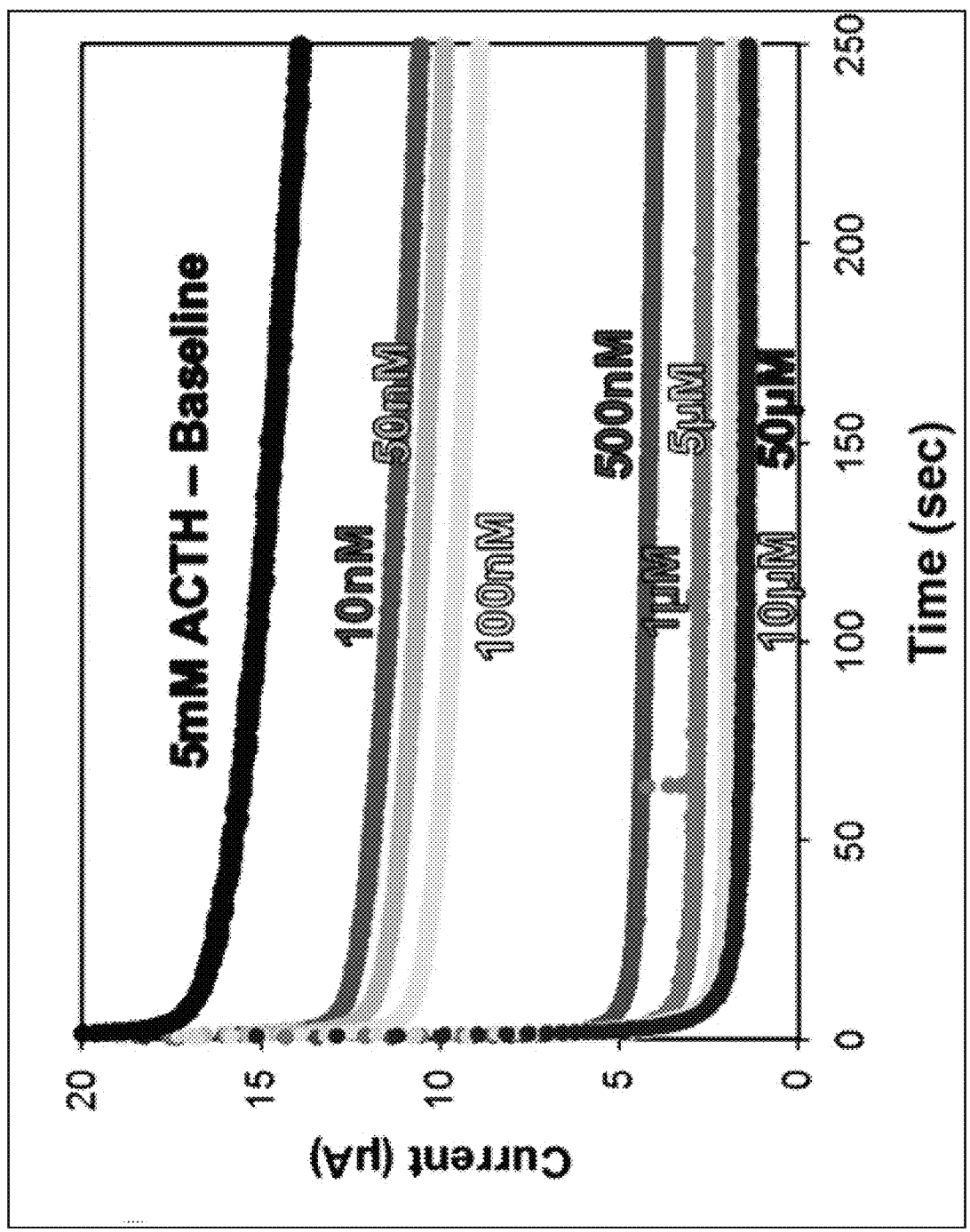
Figure 6F:
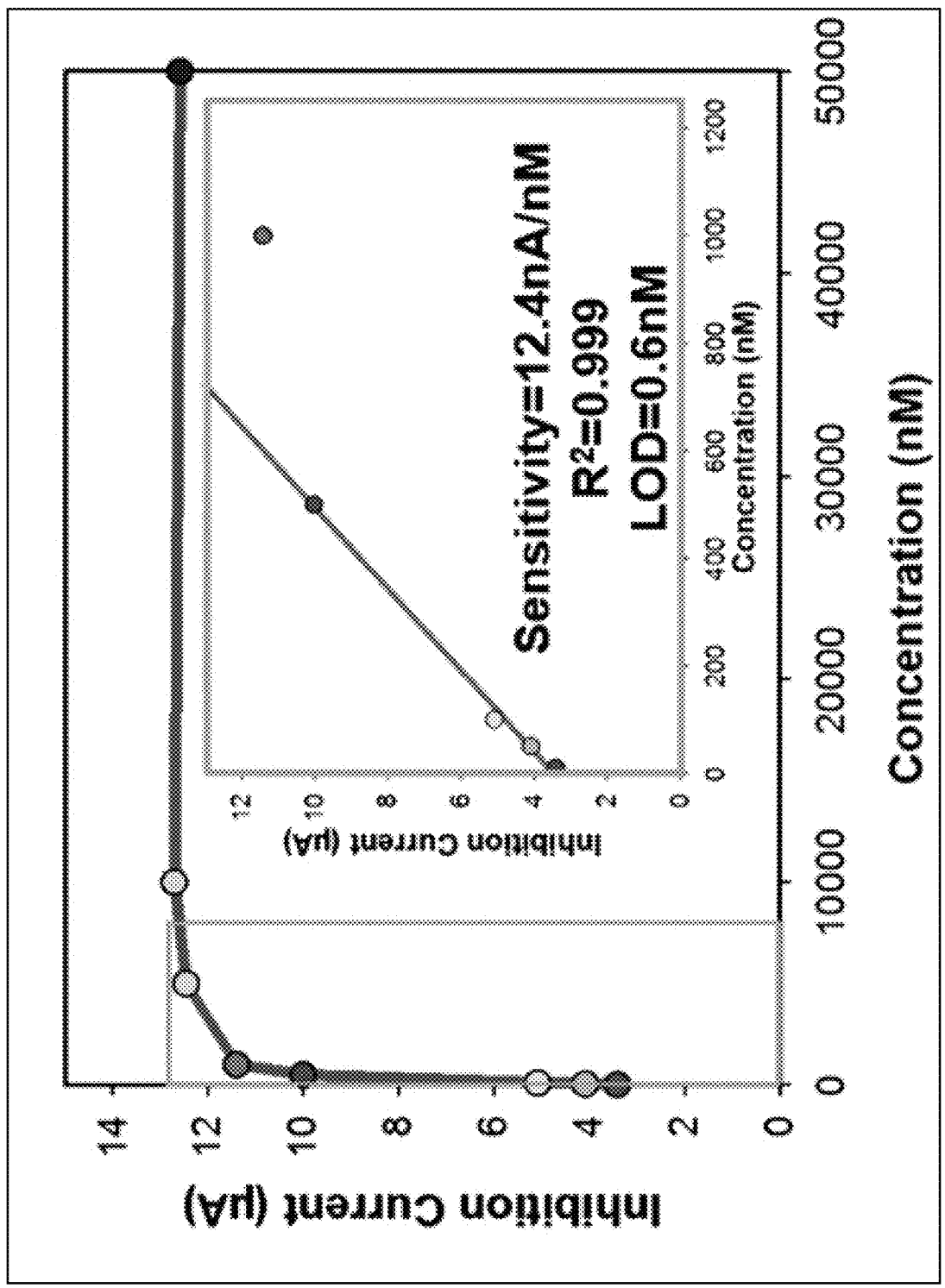

Finally, the SIIML were tested for pesticide sensing with paraoxon (a model organophosphate pesticide). It should be noted here that a diluted concentration of ACHE was applied to these pesticide biosensors (~2 U per sensor) as having a smaller concentration of enzyme results in higher sensitivity due to less enzyme that needs to be inhibited.[40] An amperometric baseline of eight different SIIML ACHE pesticide biosensors were recorded in 5 mM ACTH which had an anodic current of 13.84±0.3 μA. Each of the sensors were then placed in different concentrations of paraoxon (10 nM-50 μM) and incubated for a minimum of 5 min, and then placed back in the same 5 mM ACTH solution (FIG. 6e). The concentration versus inhibition current (decrease in anodic current) was graphed (FIG. 6f) and showed a linear region up to 500 nM and then a plateau region shortly thereafter. The sensitivity of the linear region was calculated to be 12.4 nA nM$^{-1}$ with a limit of detection of 0.6 nM (LOD=3 noise per signal, noise defined as standard deviation of three electrodes without ACHE). Therefore, our sensor has a limit of detection below the tolerable drinking water equivalence level of the United States and Canada EPA (24 nM and 170 nM, respectively).[53,54] There are many reported ACHE biosensors with lower limit of detection, even as low as 0.4 μM;[55] however, these biosensors often employ complex methods to enhance their sensitivity and reduce noise such as metal nanoparticles,[56,57] multilayer carbon nanotube-modified glassy carbon electrodes,[55] co-enzymes,[58] flow cells[55,59] or microelectrodes.[60]

3.3 Supercapacitor Performance Characterization

Figure 7A:
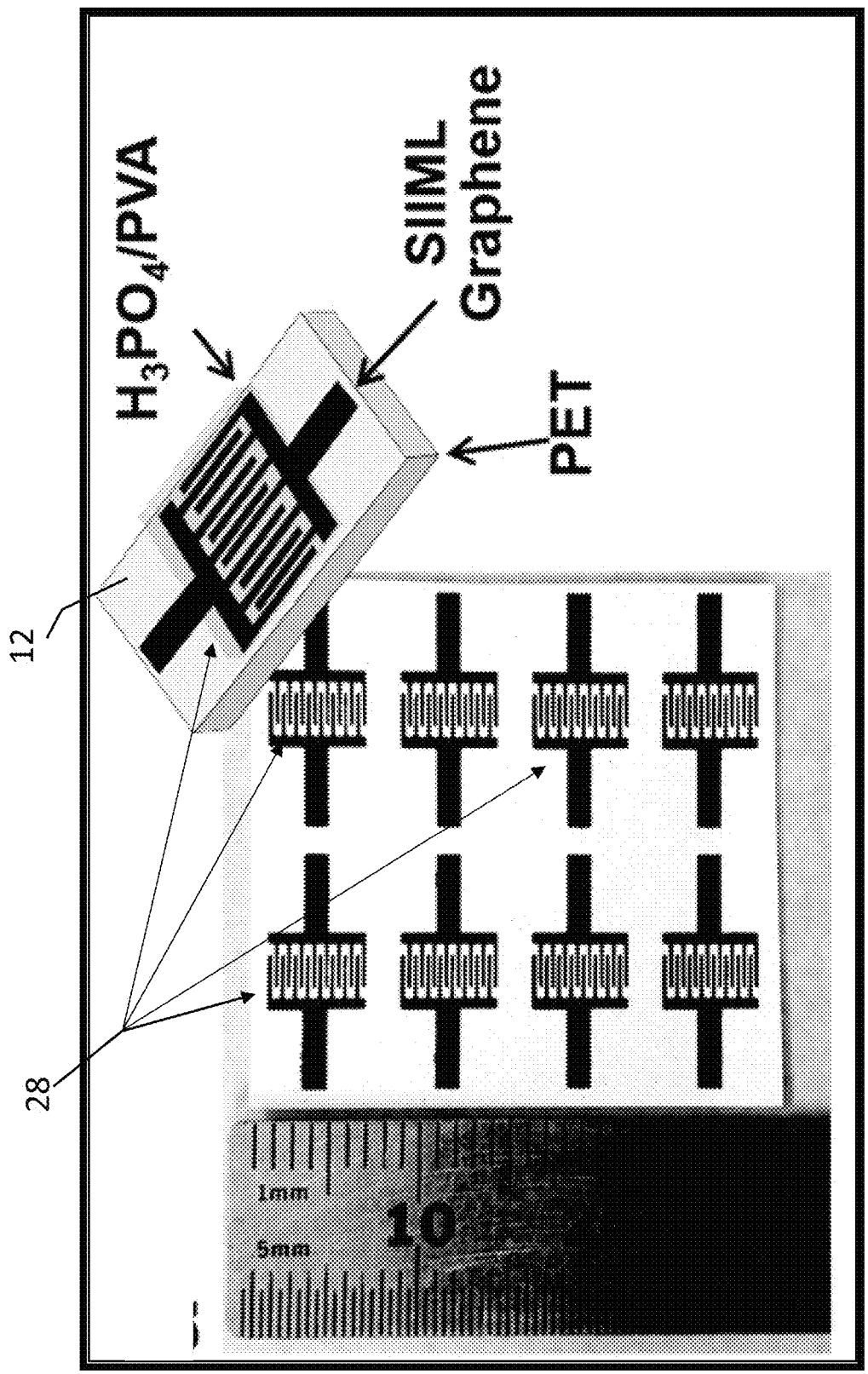
Figure 7B:
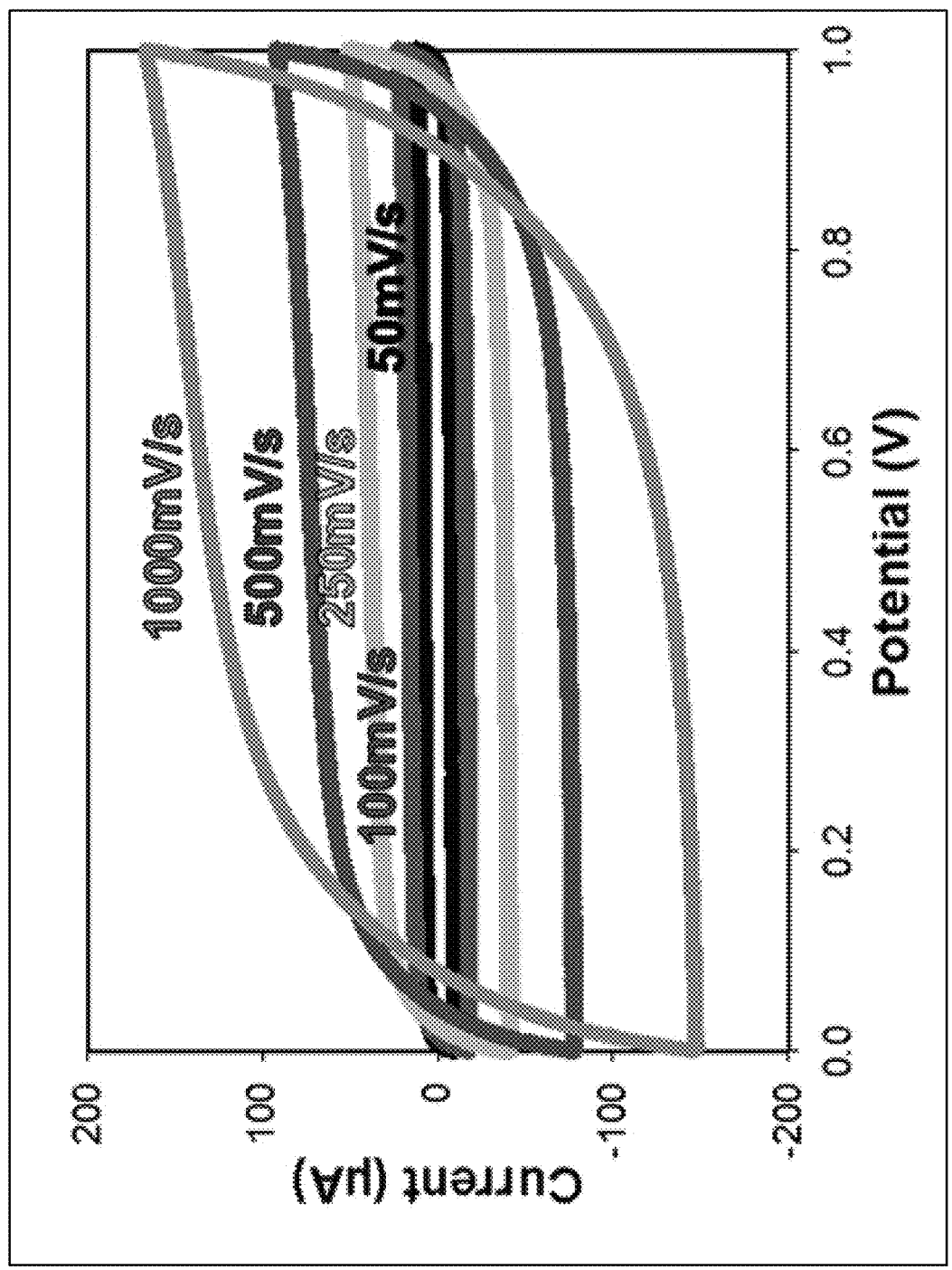
Figure 7C:
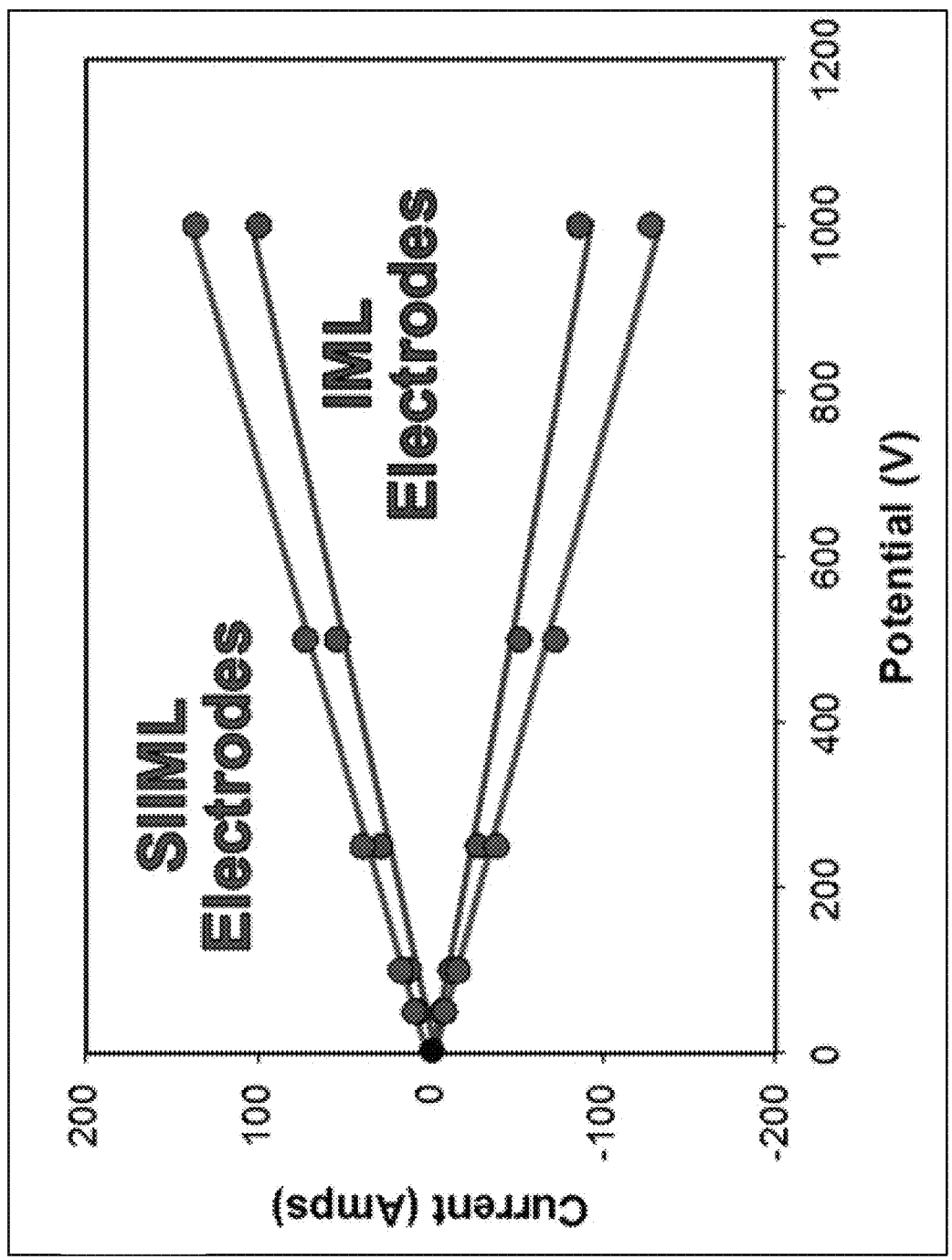
Figure 7D:
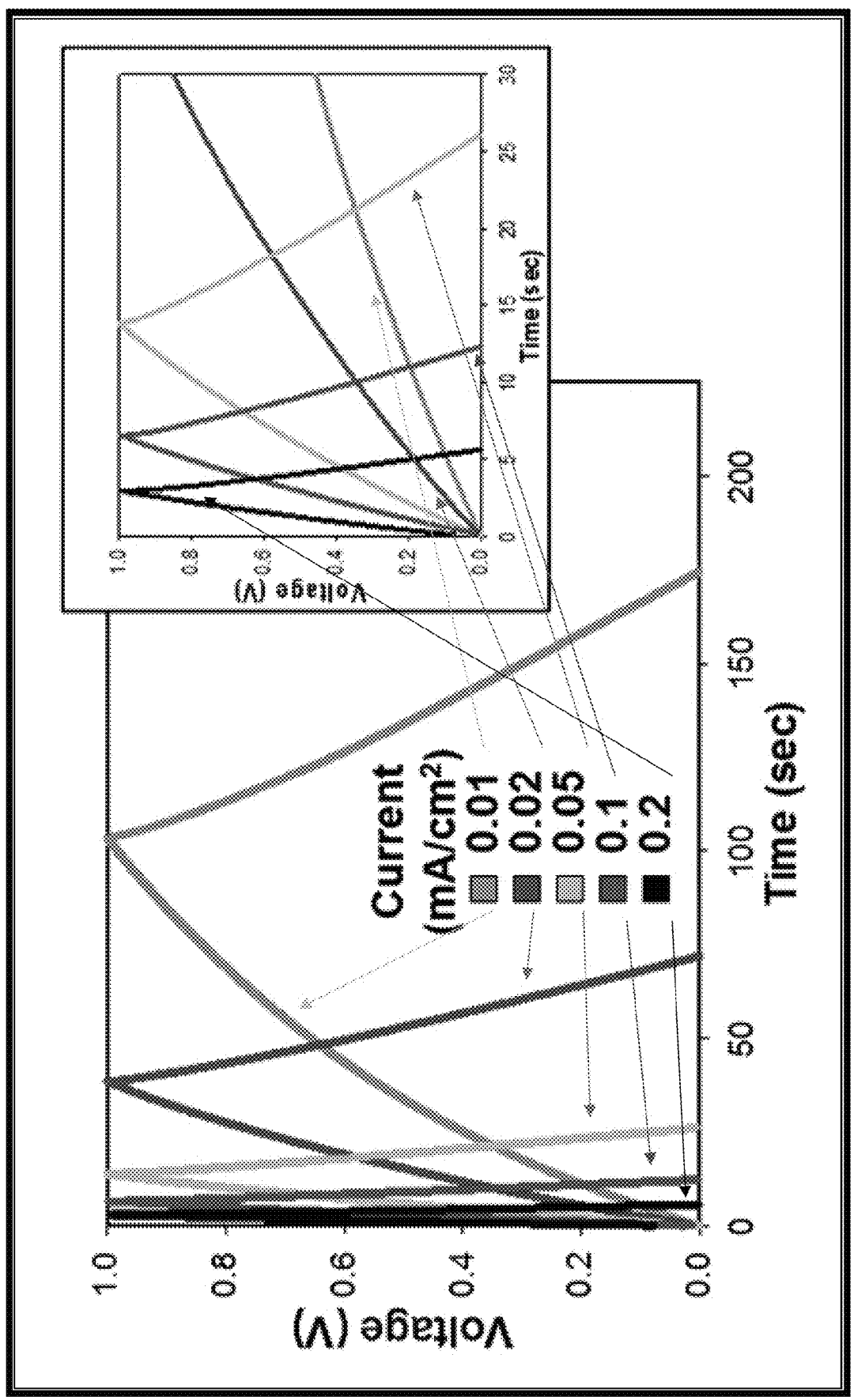
Figure 15:
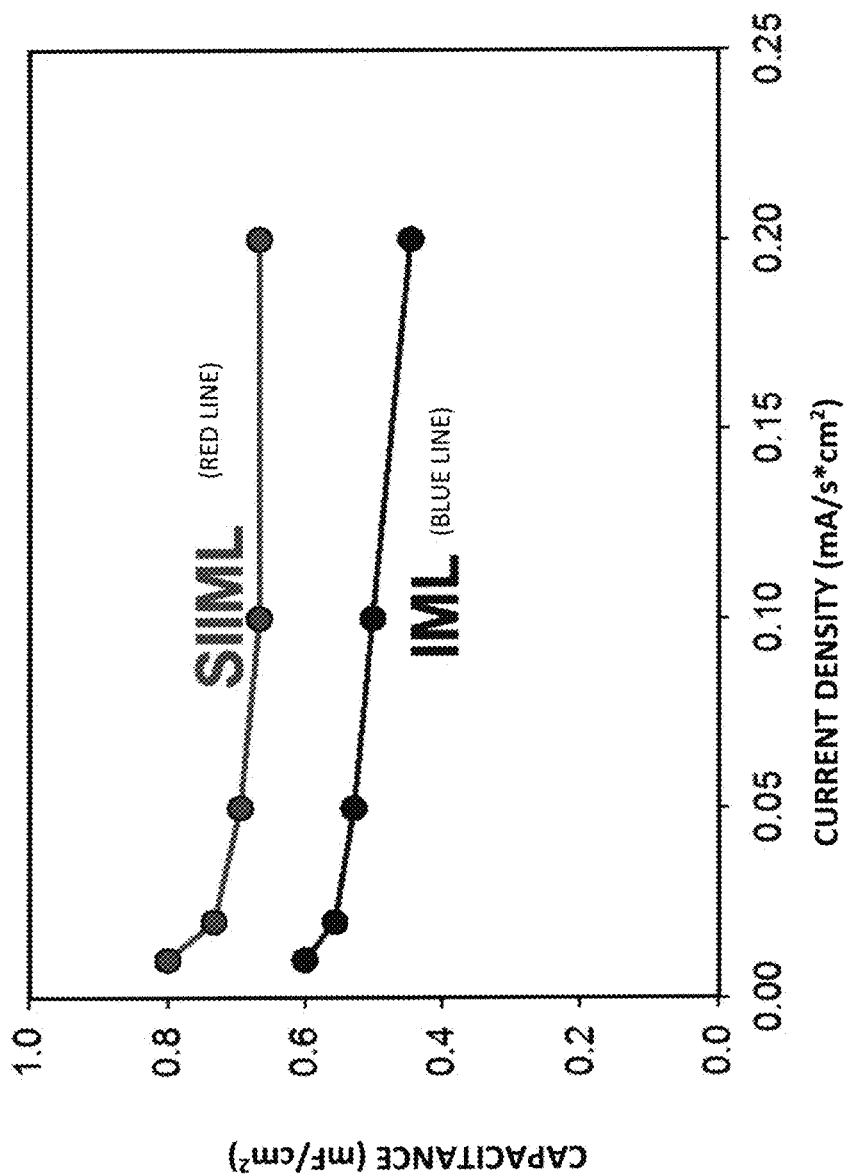
FIG. 15 is a calculated capacitance of supercapacitors from galvanostatic discharge of SIIML and IML (without salt) of supercapacitor devices according to an exemplary embodiment of the present invention.

To further demonstrate the enhanced electrochemical activity of SIIML electrodes, supercapacitors were designed. Supercapacitors offer promising energy storage opportunities for on-chip devices as they can be fabricated directly in line with the electronics.[61] Supercapacitors store energy at the interface of the electrode and electrolyte; therefore, increasing the ECSA and conductivity of the electrode improves the efficiency and capacitance of the supercapacitor.[62] Interdigitated electrodes (IDEs) (see ref no. 28) were designed and patterned using the procedures outlined in the Overview SIIML Graphene Electrode Fabrication, and an array (2×4) of IDEs were patterned, FIG. 7a. The SIIML graphene IDEs were then coated with PVA/$H_3PO_4$ gel which acts as a dry gel electrolyte. The performance of the SIIML graphene supercapacitor was first examined with CVs of various scan rates (50 mV s$^{-1}$—black to 1000 mV s$^{-1}$—orange), FIG. 7b. The CVs show a rectangular shape at low scan rates and only begin to distort in shape at very high scan rates (1000 mV s$^{-1}$) due to internal resistance. The capacitive current (due to double layer charging) of the SIIML graphene electrodes was extracted from the CVs and compared with IML graphene with no salt. The graphene with salt pores displayed enhanced double layer capacitance (37%) current as portrayed in FIG. 7c. Galvanostatic charge-discharge profiles of the SIIML were then graphed which shows relatively symmetric triangular shape, but slowly loses symmetry at very low charging densities (0.01 mA cm$^{-2}$). Based on the discharge rates, the capacitance was calculated and graphed versus the current density, FIG. 15 from Supplementary Information. On average, the SIIML graphene had ~30% more capacitance than the devices without salt (IML).

Figure 7E:
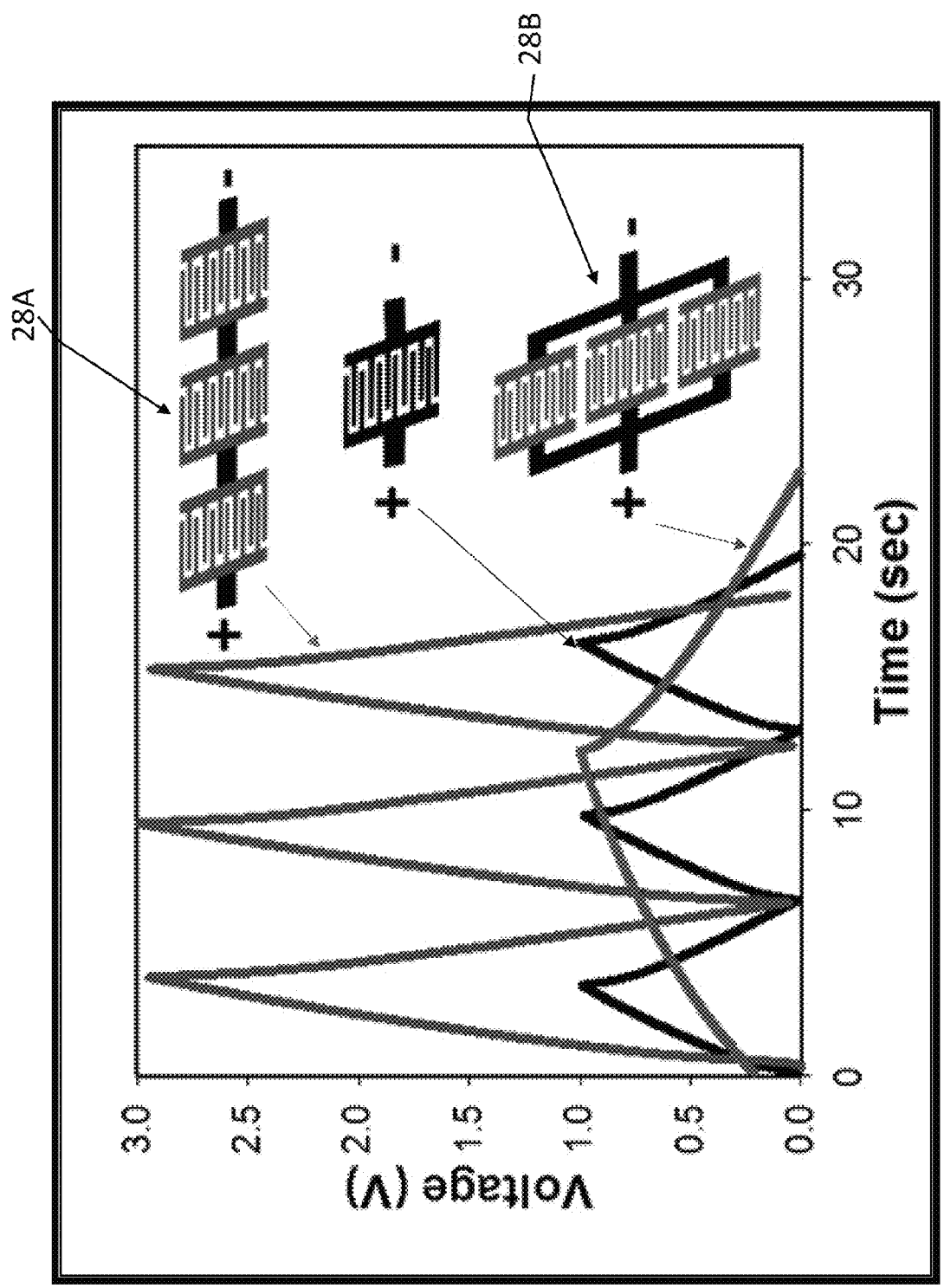
Figure 7F:
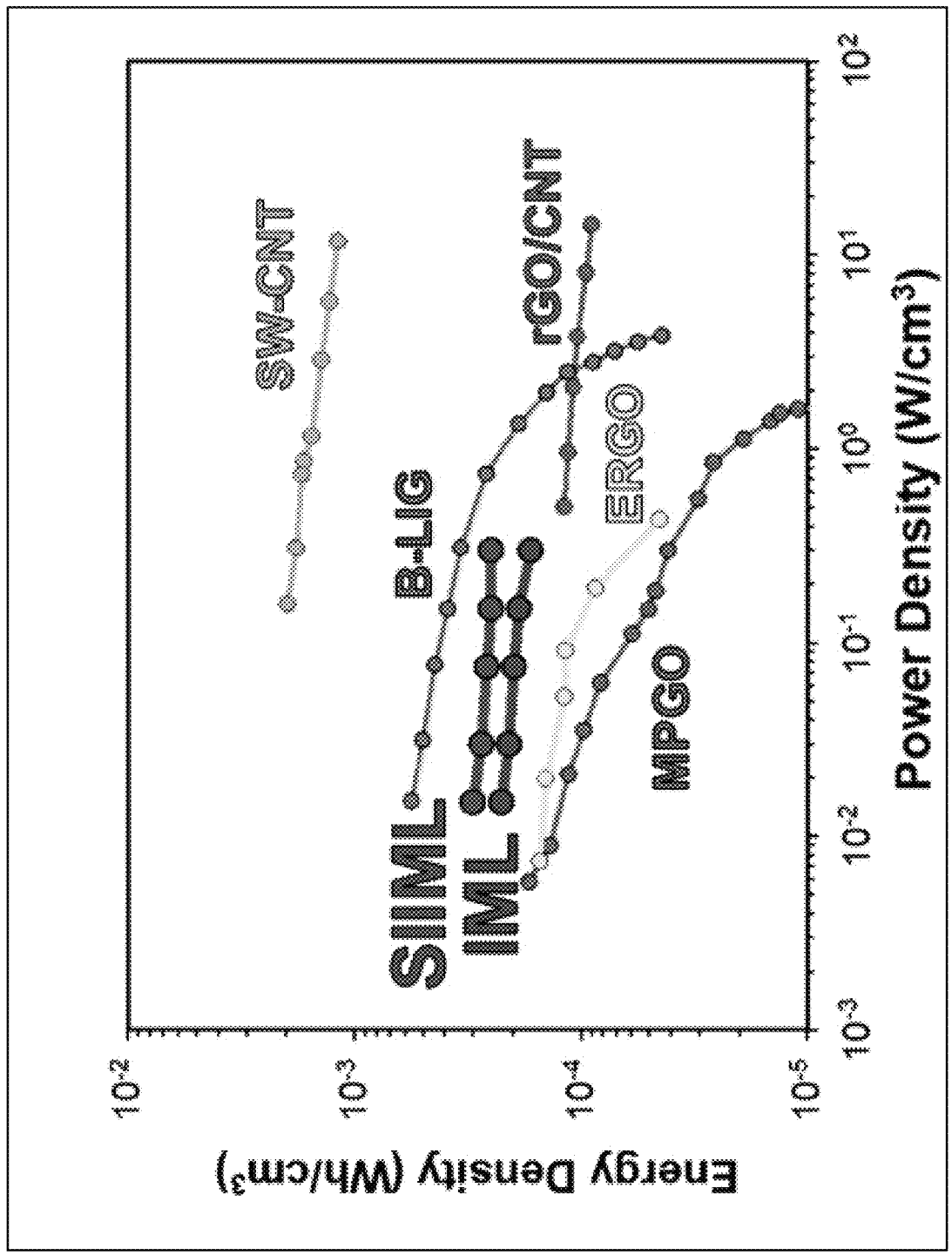

Multiple supercapacitors 28A can be connected in series (to boost voltage capabilities) or in parallel (to increase energy storage density) as illustrated and graphed in FIG. 7e. When three electrodes are connected in series (blue) the voltage window increased by a factor of three with roughly the same charge-discharge times. In contrast, when three electrodes are connected in parallel (ref no. 28B), the charge-discharge times increase by a factor of three with the voltage window remaining constant. Therefore, these supercapacitors could easily be patterned in series or parallel to adapt for a specific application. To demonstrate that SIIML graphene patterning process for supercapacitor use, an array of supercapacitors were fabricated (3 in series and 5 in parallel) and were used to power a red LED (drop voltage ~1.8 V). After charging the supercapacitor to 3 V, the LED was tested across the supercapacitor array and illuminated multiple times before the supercapacitor's voltage decreased below 1.8 V, see Movie S3 (ESI†).

Finally, the SIIML graphene and IML graphene (no salt) energy density and power density were extracted from the galvanostatic discharge and graphed on a Ragone plot (FIG. 7I).[63,64] The graphene electrodes that contained salt pores demonstrated higher energy density due to the increase in ECSA which stored more charge at the graphene/electrolyte interface. Both the SIIML and the IML graphene interdigitated electrodes compared favorably with other carbon-based supercapacitors IDEs reported in the literature, with the SIIML outperforming the IML electrode (energy density of 0.25 mW h cm$^{-3}$ and 0.17 W h cm$^{-3}$ at a power density of 0.3 W cm$^{-3}$, respectively). Note that supercapacitors are strongly dependent on the electrolyte used, and by using a more efficient electrolyte, a higher energy and power density could be obtained.[65-68]

4. Conclusions

In conclusion, a micromanufacturing technique for enhancing the electrocatalytic activity of patterned solution-phase graphene was demonstrated with the use of a modified IML technique. This technique creates a multiscale porous architecture in the graphene surface. Macrosized pores (25-50 μm) are formed by utilizing salt crystals as porogens (hard templates) in the graphene ink while patterning, referred to as salt impregnated inkjet maskless lithography (SIIML). Additionally, microsized pores (100 nm-2 μm) are etched into the graphene surface through $CO_2$ laser annealing, even on flexible heat sensitive substrates (PET). We demonstrate that SIIML is an effective tool for enhancing the electrochemical activity of graphene by fabrication of an electrochemical pesticide biosensor, which utilizes ACHE. Graphene electrodes with macrosized pores through salt impregnation outperformed their non macropore counterparts (sensitivity to ACTH of 28.3 μA nM$^{-1}$ to 13.3 μA nM$^{-1}$). The final SIIML graphene ACHE sensor had a wide linear sensing range (10 nM to 500 nM), low limit of detection (0.6 nM), and high sensitivity (12.4 nA nM$^{-1}$) to paraoxon which is below the tolerable drinking limit reported by the EPA.[53] Furthermore, we demonstrate that this method can fabricated complex geometries such as interdigitated electrodes for use in other non-biosensing related applications (i.e., an electrochemical supercapacitor). Critically, the SIIML graphene outperformed non-macroporous graphene by demonstrating ~30% higher capacitance. The SIIML supercapacitor demonstrated excellent energy density of 0.25 mW h cm$^{-3}$ at a power density of 0.3 W cm$^{-3}$, which was comparable to other carbon-based supercapacitors reported in literature. Both the electrochemical biosensor and supercapacitor demonstrate that increasing the electrochemical surface area of solution-phase printed graphene electrodes via SIIML and $CO_2$ laser annealing improves the performance of these electrochemical devices. Moreover, these manufacture techniques (SIIML and $CO_2$ laser annealing) are amenable to thermally sensitive and flexible substrate materials; therefore, this method could be adapted to wearable technology for energy storage or textile-based biosensors[5,73-75] as well as for potential creation of flexible supercapacitors on paper-based substrates.[76] Finally, this high ECSA graphene transduction electrode can act as a platform technology for additional electrochemical sensors or supercapacitors, as well other electrochemical devices such as batteries,[77] biofuel cells,[78] dye sensitive solar cells,[79] or electrode stimuli.[8,48]

Associated Supplementary Content

Supporting Information is set forth in the drawings at FIGS. 8-15, 16A-I, 17A-C, and 18A-B, and referenced in the sections above.

REFERENCES

1. R. Raccichini, A. Varzi, S. Passerini and B. Scrosati, Nat. Mater., 2015, 14, 271.
2. S. L. Burrs, M. Bhargava, R. Sidhu, J. Kiernan-Lewis, C. Gomes, J. C. Claussen and E. S. McLamore, Biosens. Bioelectron., 2016, 85, 479-487.
3. F. Bonaccorso, L. Colombo, G. Yu, M. Stoller, V. Tozzini, A. C. Ferrari, R. S. Ruoff and V. Pellegrini, Science, 2015, 347, 1246501.
4. H. Yang, S. Kannappan, A. S. Pandian, J.-H. Jang, Y. S. Lee and W. Lu, Nanotechnology, 2017, 28, 445401.
5. K. Share, A. P. Cohn, R. Carter, B. Rogers and C. L. Pint, ACS Nano, 2016, 10, 9738 9744.
6. M. Liu, R. Zhang and W. Chen, Chem. Rev., 2014, 114, 5117-5160.
7. M. Uz, S. R. Das, S. Ding, D. S. Sakaguchi, J. C. Claussen and S. K. Mallapragada, Adv. Healthcare Mater., 2018, 1701046.
8. S. R. Das, M. Uz, S. Ding, M. T. Lentner, J. A. Hondred, A. A. Cargill, D. S. Sakaguchi, S. Mallapragada and J. C. Claussen, Adv. Healthcare Mater., 2017, 6, 1601087.
9. S. R. Das, Q. Nian, A. A. Cargill, J. A. Hondred, S. Ding, M. Saei, G. J. Cheng and J. C. Claussen, Nanoscale, 2016, 8, 15870-15879 RSC.
10. J. A. Hondred, J. C. Breger, N. J. Alves, S. A. Trammell, S. A. Walper, I. L. Medintz and J. C. Claussen, ACS Appl. Mater. Interfaces, 2018, 10, 11125-11134.
11. J. Pang, R. G. Mendes, P. S. Wrobel, M. D. Wlodarski, H. Q. Ta, L. Zhao, L. Giebeler, B. Trzebicka, T. Gemming, L. Fu, Z. Liu, J. Eckert, A. Bachmatiuk and M. H. RiAmmeli, ACS Nano, 2017, 11, 1946-1956.
12. W. Yuan, Y. Zhou, Y. Li, C. Li, H. Peng, J. Zhang, Z. Liu, L. Dai and G. Shi, Sci. Rep., 2013, 3, 2248.
13. R. K. Paul, S. Badhulika, N. M. Saucedo and A. Mulchandani, Anal. Chem., 2012, 84, 8171-8178.
14. X. Cong, T. Yu, Z. H. Ni, L. Liu, Z. X. Shen and W. Huang, J. Mater. Chem. C, 2009, 113, 6529-6532.
15. Z. Fan, Q. Zhao, T. Li, J. Yan, Y. Ren, J. Feng and T. Wei, Carbon, 2012, 50, 1699 1703.
16. X. Dong, X. Wang, L. Wang, H. Song, H. Zhang, W. Huang and P. Chen, ACS Appl. Mater. Interfaces, 2012, 4, 3129-3133.
17. G. Choi, M. Yang, W. H. Hong, J. W. Choi and Y. S. Huh, ACS Nano, 2012, 6, 4020 4028.
18. K. Olszowska, J. Pang, P. S. Wrobel, L. Zhao, H. Q. Ta, Z. Liu, B. Trzebicka, A. Bachmatiuk and M. H. Rummeli, Synth. Met., 2017, 234, 53-85.
19. A. A. Green and M. C. Hersam, Nano Lett., 2009, 9, 4031-4036.
20. D. Li, W.-Y. Lai, Y.-Z. Zhang and W. Huang, Adv. Mater., 2018, 30, 1704738.
21. H. Ma, P. Gao, D. Fan, B. Du, J. Hao and Q. Wei, New J. Chem., 2013, 37, 1307-1311 RSC.
22. S. H. Lee, H. W. Kim, J. O. Hwang, W. J. Lee, J. Kwon, C. W. Bielawski, R. S. Ruoff and S. O. Kim, Angew. Chem., 2010, 122, 10282-10286 23. J. L. Vickery, A. J. Patil and S. Mann, Adv. Mater., 2009, 21, 2180-2184.

24. Q. He, S. R. Das, N. T. Garland, D. Jing, J. A. Hondred, A. A. Cargill, S. Ding, C. Karunakaran and J. C. Claussen, ACS Appl. Mater. Interfaces, 2017, 9, 12719-12727.
25. E. Jabari and E. Toyserkani, Carbon, 2015, 91, 321-329.
26. W. J. Hyun, E. B. Secor, M. C. Hersam, C. D. Frisbie and L. F. Francis, Adv. Mater., 2015, 27, 109-115.
27. B. Secor, T. Z. Gao, A. E. Islam, R. Rao, S. G. Wallace, J. Zhu, K. W. Putz, B. Maruyama and M. C. Hersam, Chem. Mater., 2017, 29, 2332-2340.
28. G. Choi and H. S. Park, J. Phys. Chem. C, 2012, 116, 3207-3211.
29. B. Secor, M. H. Dos Santos, S. G. Wallace, N. P. Bradshaw and M. C. Hersam, J. Phys. Chem. C, 2018, 122, 13745-13750.
30. J. Li, V. Mishukova and M. Ostling, Appl. Phys. Lett., 2016, 109, 123901 CrossRef.
31. J. A. Hondred, L. R. Stromberg, C. L. Mosher and J. C. Claussen, ACS Nano, 2017, 11, 9836-9845.
32. P. Trogadas, V. Ramani, P. Strasser, T. F. Fuller and M. O. Coppens, Angew. Chem., Int. Ed., 2016, 55, 122-148.
33. B. Zhao and M. M. Collinson, Chem. Mater., 2010, 22, 4312-4319 CrossRef CAS.
34. Y. S. Nam, J. J. Yoon and T. G. Park, J. Biomed. Mater. Res., 2000, 53, 1-7.
35. J. Zhang, L. Wu, D. Jing and J. Ding, Polymer, 2005, 46, 4979-4985.
36. X. Mu, T. Bertron, C. Dunn, H. Qiao, J. Wu, Z. Zhao, C. Saldana and H. J. Qi, Mater. Horiz., 2017, 4, 442-449 RSC.
37. X. Shi, B. Sitharaman, Q. P. Pham, F. Liang, K. Wu, W. E. Billups, L. J. Wilson and A. G. Mikos, Biomaterials, 2007, 28, 4078-4090.
38. S. E. Skrabalak and K. S. Suslick, J. Am. Chem. Soc., 2006, 128, 12642-12643.
39. I. V. Pavlidis, M. Patila, U. T. Bornscheuer, D. Gournis and H. Stamatis, Trends Biotechnol., 2014, 32, 312-320.
40. M. Kesik, F. E. Kanik, J. Turan, M. Kolb, S. Timur, M. Bahadir and L. Toppare, Sens. Actuators, B, 2014, 205, 39-49.
41. Y. Yang, H. Fei, G. Ruan, C. Xiang and J. M. Tour, Adv. Mater., 2014, 26, 8163-8168.
42. J. C. Claussen, M. S. Artiles, E. S. McLamore, S. Mohanty, J. Shi, J. L. Rickus, T. S. Fisher and D. M. Porterfield, J. Mater. Chem., 2011, 21, 11224-11231 RSC.
43. A. J. Bard and L. R. Faulkner, Fundamentals and Applications, Wiley, New York, 2001.
44. J. C. Claussen, A. Kumar, D. B. Jaroch, M. H. Khawaja, A. B. Hibbard, D. M. Porterfield and T. S. Fisher, Adv. Funct. Mater., 2012, 22, 3399-3405.
45. C. Fernandez-Sanchez, E. Pellicer, J. Orozco, C. Jimenez-Jorquera, L. M. Lechuga and E. Mendoza, Nanotechnology, 2009, 20, 335501.
46. A. Pedrosa, S. Paliwal, S. Balasubramanian, D. Nepal, V. Davis, J. Wild, E. Ramanculov and A. Simonian, Colloids Surf, B, 2010, 77, 69-74.
47. J. V. Staros, R. W. Wright and D. M. Swingle, Anal. Biochem., 1986, 156, 220-222.
48. S. R. Das, M. Uz, S. Ding, M. T. Lentner, J. A. Hondred, A. A. Cargill, D. S. Sakaguchi, S. Mallapragada and J. C. Claussen, Adv. Funct. Mater., 2017, 6, 1601087.
49. Y. Hernandez, V. Nicolosi, M. Lotya, F. M. Blighe, Z. Sun, S. De, I. T. McGovern, B. Holland, M. Byrne and Y. K. Gun'Ko, Nat. Nanotechnol., 2008, 3, 563.
50. R. Wong, A. A. Ali, K. Yasui and A. M. Hashim, Nanoscale Res. Lett., 2015, 10, 233.
51. N. F. M. Rodrigues, S. Y. Neto, R. D. C. S. Luz, F. S. Damos and H. Yamanaka, Biosensors, 2018, 8, 16.
52. M.-P. Bucur, B. Bucur and G.-L. Radu, Sensors, 2013, 13, 1603-1613.
53. 2018 Edition of the Drinking Water Standards and Health Advisories, DOI: https://www.epa.gov/sites/production/files/2018-03/documents/dwtable2018.pdf.
54. Parathion, DOI: Government of Canada Publications http://publications.gc.ca/Collection/H48-10-1-64-1991E.pdf.
55. G. Liu and Y. Lin, Anal. Chem., 2006, 78, 835-843.
56. N. Chauhan and C. S. Pundir, Anal. Chim. Acta, 2011, 701, 66-74.
57. D. Du, S. Chen, J. Cai and A. Zhang, Biosens. Bioelectron., 2007, 23, 130-134.
58. X. Sun and X. Wang, Biosens. Bioelectron., 2010, 25, 2611-2614.
59. V. B. Kandimalla and H. Ju, Chem.—Eur. J., 2006, 12, 1074-1080.
60. K. A. Law and S. P. J. Higson, Biosens. Bioelectron., 2005, 20, 1914-1924.
61. M. F. El-Kady and R. B. Kaner, Nat. Commun., 2013, 4, 1475.
62. H.-J. Choi, S.-M. Jung, J.-M. Seo, D. W. Chang, L. Dai and J.-B. Baek, Nano Energy, 2012, 1, 534-551.
63. B. Chen, Y. Jiang, X. Tang, Y. Pan and S. Hu, ACS Appl. Mater. Interfaces, 2017, 9, 28433-28440.
64. A. J. Bard, L. R. Faulkner, J. Leddy and C. G. Zoski, Electrochemical methods: fundamentals and applications, Wiley, New York, 1980.
65. W. Zuo, R. Li, C. Zhou, Y. Li, J. Xia and J. Liu, Adv. Sci., 2017, 4, 1600539.
66. M. Galifiski, A. Lewandowski and I. Stepniak, Electrochim. Acta, 2006, 51, 5567 5580.
67. M. D. Stoller, S. Park, Y. Zhu, J. An and R. S. Ruoff, Nano Lett., 2008, 8, 3498-3502.
68. J. Huang, B. G. Sumpter and V. Meunier, Chemistry, 2008, 14, 6614-6626.
69. Z. Peng, R. Ye, J. A. Mann, D. Zakhidov, Y. Li, P. R. Smalley, J. Lin and J. M. Tour, ACS Nano, 2015, 9, 5868-5875.
70. M. Beidaghi and C. Wang, Adv. Funct. Mater., 2012, 22, 4501-4510.
71. B. Xie, C. Yang, Z. Zhang, P. Zou, Z. Lin, G. Shi, Q. Yang, F. Kang and C.-P. Wong, ACS Nano, 2015, 9, 5636-5645.
72. Z. S. Wu, K. Parvez, X. Feng and K. Miillen, Nat. Commun., 2013, 4, 2487.
73. R. K. Mishra, A. Martin, T. Nakagawa, A. Barfidokht, X. Lu, J. R. Sempionatto, K. M. Lyu, A. Karajic, M. M. Musameh and I. L. Kyratzis, Biosens. Bioelectron., 2018, 101, 227-234.
74. M. C. Chuang, J. R. Windmiller, P. Santhosh, G. V. Ramirez, M. Galik, T. Y. Chou and J. Wang, Electroanalysis, 2010, 22, 2511-2518.
75. K. Jost, D. Stenger, C. R. Perez, J. K. McDonough, K. Lian, Y. Gogotsi and G. Dion, Energy Environ. Sci., 2013, 6, 2698-2705 RSC.
76. Y.-Z. Zhang, Y. Wang, T. Cheng, W.-Y. Lai, H. Pang and W. Huang, Chem. Soc. Rev., 2015, 44, 5181-5199 RSC.
77. H. Kim, K.-Y. Park, J. Hong and K. Kang, Sci. Rep., 2014, 4, 5278.
78. C. Liu, S. Alwarappan, Z. Chen, X. Kong and C.-Z. Li, Biosens. Bioelectron., 2010, 25, 1829-1833.
79. N. G. Sahoo, Y. Pan, L. Li and S. H. Chan, Adv. Mater., 2012, 24, 4203-4210.

D. Supplemental Information

FIGS. 8 to 15, 16A-I, 17A-C, and 18A-B provide additional discussion and details regarding aspects of the invention. A summary of what each illustrates is set forth in the Brief Description of the Drawings section, supra.

FIGS. 16A-I, 17A-C, and 18A-B are each a set of selected frames from three Movies found in full at the Supplementary Information to *Nanoscale Horiz.*, 2019, 4, 735-746, and incorporated by reference herein. Each is referenced from time in the Detailed Description section supra. Further summaries of the movies are as follows:

Movie excerpts FIGS. 16A-I: Patterning of Salt Impregnated Inkjet Maskless Lithography (SIIML) electrodes, sacrificial layer removal via acetone impingement revealing high resolution electrochemical electrodes. Note how a coated substrate containing a negative of the ultimate pattern is the starting material. In this lab set-up demonstration, the coated substrate is placed in the liquid bath and agitated gently by hand. The coating that is adhered to the substrate remains in place on the substrate, but the coating over the negative pattern lifts off. The final frames show removal from the liquid bath, washing, and then the end product of a high-resolution positive pattern on the substrate.

Movie excerpts FIGS. 17A-C: SIIML graphene electrodes after IML process showing salt completely covered with graphene, laser annealing which etches surface revealing salt crystals, and washing which removes salt crystals opening macroscale pores in the surface of the graphene.

Movie excerpts FIGS. 18A-B: Images show high resolution relatively complex positive pattern (here supercapacitor circuit 28) produced from a method like that of FIGS. 16A-I, and proof of concept of efficacy of the pattern 28 as an electrical circuit to power an LED 30 (shown in FIG. 18A with its opposite leads 31L and R separated from supercapacitor circuit 28; and how LED 30 turns on with leads 31R and L in electrical contact with circuit 28 in FIG. 18B).

E. Specific Example 2—Non-Solvating Porogens

In another embodiment according to the invention, 3D porous architectured electroactive devices or structures fabricated by impregnated porogens can use non-solvating porogens as hard templates. Non-limiting examples of non-solvating porogens can include polymer micro-beads. Non-limiting types of polymers can include polyethylene or polystyrene.

The use of these types of porogens could basically parallel the solvating porogens discussed above, except for variations appropriate for non-solvating materials. For example, removal of the non-solvating porogens would not be by dissolving them in a solvent. It could be by any number of techniques. Non-limiting examples include exposing and removing by degrading, microtexturing, or etching into the surface of the reduced electroactive material.

One specific non-limiting example is illustrated with reference to the highly-diagrammatic illustrations of FIGS. 19A-D. Like the example of salt particles as hard template but solvating, porogens, in this example, non-solvating porogens 17 could be impregnated in a distributed fashion in the electroactive material 16 (e.g. graphene or graphene-based or other). See FIGS. 19A-B where non-solvating porogens 17 are diagrammatically shown in dashed lines to indicate they are at least generally randomly dispersed inside layer 16A of reduced electroactive material 16. It is to be noted that some porogens 17 (see ref. nos. 17(1)) can be at or near side margins of layer 16A, some porogens 17(2) can be at or near surface of layer 16, and some porogens 17(3) can be towards the middle interior of, or lower, in layer 16A (i.e. not at or near the surface of 16A, or at least further from the surface than 17(1) and 17(2)).

A process would be performed to expose at least porogens 17(2), and likely 17(1), that are sufficiently near the surface of layer 16A. One example could be similar to the use of laser 24 in FIG. 1 at least in the sense of etching the surface of layer 16A to expose at least some portion of some of porogens 17(2). It might also expose at least some porogens 17(1) at the side margins of layer 16A, at least if porogens 17(1) are sufficiently near the surface of layer 16A to be exposed by laser etching. See FIG. 19C which diagrammatically illustrates exposure of certain porogens 17(1) and 17(2) by using solid lines for those particles and opening to them in the layer 16A surface as etches 25 shown diagrammatic as lines across the surface of 16A. A laser such as laser 24 of Specific Embodiment 1 could be controlled to scan at least a substantial part of the surface of layer 16A, etch it where its path goes on the surface, and then expose a substantial number of porogens 17(1) and/or 17(2).

Producing layer 16A with impregnated porogens 17 could be essentially the same as with Specific Embodiment 1 above, or it could be other techniques. However, instead of solvating porogens, these non-solvating porogens of Example 2 could be mixed in solution with electroactive material, the mixture cast, applied, or otherwise deposited onto a substrate, and then the cast mixture reduced in place into an electroactive material impregnated with the non-solvating porogens and adhered to the substrate. Like Specific Embodiment 1, the electroactive material/non-solvating porogen mixture can be patterned on a substrate according to design or need (the electrode shapes of FIG. 1 being one non-limiting example). Patterns can be small scale (see examples in Specific Embodiment 1 and in incorporated by reference references). They can also vary from small line width to larger widths depending on need or desire. They can be in any of a variety of form factors. Scalable fabrication techniques are well known or available to create efficiently and relatively economically monolithic, repeating, interconnected, or other patterns. And then curing or reducing the coated solution/mixture can be similar to Specific Embodiment 1 or as needed to produce a layer 16A impregnated with non-solvating porogens as in FIGS. 19A and B. The techniques to cure or reduce can vary according to need or desire. The formulation s of the solutions of electroactive and non-solvating porogens (e.g. types, sizes, and concentrations of each) can be varied by the designer.

Once exposed, the exposed non-solvating porogens 17(1) and/or 17(2) can be removed. One way is basically the same as the etching with laser 24 discussed in Specific Embodiment 1 above. They can be washed out once exposed. They could be degraded. Etching is one non-limited way. This way basically etches/degrades the top layer of graphene to release the porogens. We demonstrated one of the thermal methods in Specific Embodiment 1 above with the laser method. Other methods could achieve similar results.

Thus, it is to be understood there could be a variety of ways to expose and dislodge/remove non-solvating porogens. One technique to physically dislodge at least a substantial number of such non-soluble porogens, at least at or near the surface of the top layer of electroactive material, is etching or degrading that surface in a manner effective to release a substantial number of these hard template porogens is thermal treatment by a laser. Other thermal treatments are possible. Chemical and dry etching are possible, as are heating/annealing. Several specific non-limiting examples are as follows: thermal treatment for example by laser, oven heating, photonic, heating/annealing or by chemical etching methods with solutions of low concentrations of acids/solvents (e.g., nitric acid, hydrocholoric acid, etc.) or with dry etching (e.g., O2 plasma). These etching methods can be controlled to effectively expose and degrade the non-solvating porogens without materially effecting the functionality of the electroactive material. For example, in the case of a patterned electrical circuit of graphene, such etching methods would be controlled to sufficiently degrade the superficial layer of graphene to release embedded porogens but are not sufficiently strong to degrade the underlying graphene circuit. As will be appreciated, removal may also involve or add other steps. For example, one way could be to wash or spray (see FIG. 1 step e) the surface of layer 16A in a manner which further dislodges or releases, and thus removes at least a substantial number of the exposed porogens 17(1) and/or 17(2).

As can be appreciated, as with Specific Embodiment 1, whatever technique is used to remove exposed porogens may not remove all exposed porogens. And it would not remove unexposed porogens such as 17(3) of FIGS. 19A-D. But these techniques could expose and remove sufficient porogens 17 from the cured/reduced electroactive material 16 to create a cratered, microtextured, or microstructure surface similar to that discussed with respect to Specific Embodiment 1 above. This can, inter alia, increase ECSA as one benefit. For example, layer 16A in FIG. 19D would end up with a number of pores 100 where the removed porogens 17 used to be. This would result in a layer 16A being at least superficially cratered or microtextured. But, as mentioned, layer 16A may not be devoid of all porogens. This is not required.

FIGS. 19A-D illustrate a further variation according to the invention. The porogen impregnated layer 16A could be formed, added, or superposed over a layer 16B of electroactive material (reduced, cured) that is not impregnated with porogens. As shown in FIGS. 19A-D, a sandwich or laminated structure of layers 16A and B could have layer 16A processed as discussed above (e.g., porogens exposed and removed). There would be a layer (16A) with engineered pores 100 and a layer without (16B). Collectively, this can increase ECSA over the same two layers without such engineered pores.

As mentioned, whether the technique of Specific Embodiment 1 or 2, the resulting structure may not be devoid of all porogens or portions of porogens. Either technique might result in not all exposed porogens or parts thereof being released/removed. And, as illustrated in FIGS. 19A-D, some impregnated porogens may not be exposed and therefore would not be removed. As such some of this porogen material would be left in place. As can be appreciated, the material of either the solvating or non-solvating porogens described in the Specific Embodiments 1 and 2 may not be conducive to optimal electroactive/conductive properties of the structure. Therefore, in one specific example of the invention, the porogens are added just to a second layer of the electroactive material (like layer 16A in FIGS. 19A-D) but not in a first layer (like layer 16B in FIGS. 19A-D). Therefore, if some of the porogens or portions thereof remain in the second layer and are not removed, they are not in a first or underlying layer of electroactive material, and will not affect or have negligible effect on overall electrical conductivity or performance of the overall structure of both layers (e.g. its electrical performance as a circuit or sensor). This two layer approach is not required but could be beneficial at least in certain embodiments. For example, it might be beneficial with non-solvating porogens as it might be more difficult to remove them than solvating porogens.

F. Options and Alternatives

Those skilled in this technical field will appreciate that the invention can take many forms and embodiments. Some have been mentioned in the descriptions above. Those described above are by example only.

By way of further example, note the following:

1. Substrates

This can vary according to need or desire. One of the features of the invention is that it can be applied to a relatively wide variety, including those that are flexible or heat-sensitive. Non-limiting examples are:

Silicon-based.
Paper.
Polymer-based.

As will be appreciated, the designer can select according to need or desire.

2. Graphene or Graphene Derivatives and Other Electroactive Materials

This can vary according to need or desire. One of the features of the invention is that it can be applied to a relatively wide variety of electroactive materials, including graphene but also graphene derivatives. Non-limiting examples are:

graphene,
graphene-oxide,
gold,
silver,
platinum,
conductive polymers,
copper oxides,
titanium dioxide,
zinc oxide,
tungsten oxide, iron, nickel), and
a variety of 1D and 2D materials that would form an inkjet printed film work too (e.g. carbon nanotubes, Transition metal dichalcogenide monolayers [$MoS_2$, $WS_2$, $MoSe_2$], graphene, boron nitride, borophene, silicene, stanene, phosphorene).

Other examples are mentioned elsewhere herein.

3. Hard Templates

This can vary according to need or desire. One of the features of the invention is that it can be applied to a relatively wide variety of solvating particles, including salt crystals. Non-limiting examples are:

Salt crystals (solvent is water).
Sugar crystals (solvent is water).
Others are mentioned elsewhere herein.

It can be beneficial that the hard templates do not dissolve in organics but do in water (e.g. polymers that do not dissolve in organics but do in water). For example, at least in some implementations of the invention, ionizable crystals could be the best porogen as they do not dissolve in acetone during IML liftoff (act as hard templates for annealing) but can be easily removed by a polar solvent after. In at least one sense, the hard templates are porogens in the context of any of a mass of particles, of a specified shape and size, used to make pores in molded structures which are dissolved away after the structure has set.

As mentioned earlier, porogens/hard templates/solid-phase particles could also be non-solvating. Such non-solvating porogens could have natural or engineered form factors, sizes, and numbers useful with the methods and systems of the present invention. Such non-solvating particles would be effective to be impregnated into at least one of the electroactive materials that could be used with the invention, and substantially survive any processing steps to expose them and remove them (e.g. laser energy, heat, etc.).

In one example, removal of such non-solvating porogens could be by etching/degradation with a laser. Alternatives are possible.

4. Patterning

This can vary according to need or desire. One of the features of the invention is that it can be implemented in a number of ways. Non-limiting examples are:

IML (see bibliography references 10 and 31).

As will be appreciated, a number of ways to pattern the electroactive material are possible. Some additional examples are described at Hondred et al., 'High-Resolution Graphene Films for Electrochemical Sensing via Inkjet Maskless Lithography' ACS Nano 2017, 11, 10, 9836-9845, incorporated by reference herein and bibliography ref #31. For example, a first layer on the polymer could be removed via a 'lift-off' method so that high resolution graphene patterns are created (down to 20 micron line resolution). This produces a high resolution patterning that can them be populated by electroactive material that, in turn, retains this high resolution for all sorts of miniature, micro, or smaller form factors.

5. Etching

This can vary according to need or desire. One of the features of the invention is that it can be applied to a relatively wide variety, including $CO_2$ laser as the etcher. Non-limiting examples are:

$CO_2$ laser.

Other lasers with controllable power.

Other etching techniques are possible. Non-limiting examples are thermal or photonic annealing could work as well.

6. Macropores, Micropores, and Nanopores

As will be appreciated by those skilled in this technological area, as used herein, the terms "macropores", "micropores", and "nanopores" are used to sometimes connote generally scale (nanopores having generally nanoscale diameters, micropores having generally microscale diameters, and macropores having greater than generally microscale diameters). But they are sometimes also used in a relative sense, namely, as used herein nanopores are generally smaller than micropores which are generally smaller than macropores.

Furthermore, the term pore is used in the general sense of a formed void by a porogen and/or a defect in a layer or several layers or foam in the sense of departure from a smooth or continuous surface or cross-section.

It is to be understood that nanopores and side/edge defects can arise simply out of the nature of graphene, which is composed of many nanoscale graphene flakes. When deposited in a film or coating, because the film or coating is the nanoscale flakes, discontinuities like pores, spaces, or edges, are likewise generally nanoscale.

Techniques that can affect such things as size and uniformity of pores can be designed or developed according to need or design. For example, if one is able to better control size of the hard template, then the size of the porogen pores or micropores would be better controlled as well. By way of another example, the application of the solution with hard templates to a substrate can also affect or determine the nanopores or defects between flakes, if graphene-based materials are combined in solution with the hard templates. A specific example is application of the graphene/hard template solution with spin coating. The nature of the spin coating of nanoscale flakes can be adjusted to make the nanoscale pores or defects more exact.

As discussed above, one aspect according to the invention is the use of porogens as hard templates in an electroactive-material-based pattern. Removal of the porogens leaves porogen pores, craters, or the like (in some of the examples on average micro-sized pores or voids). This increases ECSA of the pattern. As indicated above, the aspects of the invention can take many forms and embodiments. The invention is not limited to the specific exemplary embodiments herein. For example, variations obvious to those skilled in the art are included.

What is claimed is:

1. A method of fabricating high resolution patterns with engineered three-dimensional (3D) porous electroactive architecture from electroactive-material-based solutions comprising:
   a. providing a solution of an electroactive material solute and a solvent for the electroactive material;
   b. adding solid-phase particles to the solution to function as porogens to create a solution-phase ink;
   c. patterning the solution-phase ink with the added solid-phase particles on a substrate;
   d. removing at least substantially the electroactive material solvent from the patterned solution-phase ink to reduce the patterned solution-phase ink to a pattern of substantially the electroactive material impregnated with the solid-phase particles as hard templates, the pattern having a thickness and a surface;
   e. exposing at least portions of at least some of the solid-phase particles at the surface of the pattern to expose the solid-phase particles in the pattern without substantially changing the porogen arrangement in the pattern, wherein the exposing comprises controlling power, scan rate, and spot size of a laser relative to the pattern in a manner effective to both (i) etch the pattern along the surface of the formed pattern and (ii) anneal the pattern to additionally produce the engineered 3D porous electroactive architecture with additional pores, voids, and/or edge plane defects;
   f. removing at least some of the exposed solid-phase particles to leave the porogen pores where the removed solid-phase particles existed as hard templates prior to being removed to create an engineered 3D porous electroactive architecture in the pattern; and
   g. functionalizing the engineered 3D porous electroactive architecture.

2. The method of claim 1 wherein the electroactive material comprises 1D or 2D graphene or graphene derivatives.

3. The method of claim 1 wherein the electroactive material comprises one or more of 2D:
   a. metal;
   b. transition metal;
   c. conductive polymer;
   d. elemental monolayer excluding carbon material;
   e. graphite or graphite-based material; and
   f. carbon-based material.

4. The method of claim 1 wherein:
   a. the solid-phase particles are soluble; and
   b. the removing of at least some of the exposed solid-phase particles comprises:
      i. dissolving at least some of the exposed solid-phase particles with a solid-phase particle solvent.

5. The method of claim 4 wherein the solid-phase particles and the solid-state particle solvent comprise respectively:
   a. salt crystals and water;
   b. sugar crystals and water;
   c. polymers that do not dissolve in organics but do in water and water; or d. ionizable crystals as porogens that do not dissolve in the solvent during liftoff, acting as hard templates for annealing, but can be removed by a polar solvent after and a polar solvent.

6. The method of claim 1 wherein:
a. the solid-phase particles are non-solvating; and
b. the removing at least some of the exposed non-solvating solid-state particles comprises:
   i. dislodging by thermal treatment or annealing by laser, etching by the laser, oven heating, photonic treatment, heating/annealing, chemical etching methods with solutions of low concentrations of acids/solvents, or with dry etching to sufficiently degrade a superficial layer of the reduced electroactive material to release embedded porogens but not sufficiently strong to degrade underlying reduced electroactive material.

7. The method of claim 1 wherein the solid-phase particles comprise diameters in the approximate range of 25-250 μm diameter to produce the porogen pores in the pattern.

8. The method of claim 1 wherein the exposing comprises etching by a laser directed across the surface of the reduced patterned solution-phase ink and operated at a power, scan rate, and spot size to etch the pattern to, once the solid-phase particles are removed, produce porogen pores from the removed hard templates on the approximate order of 25 μm to 250 μm in diameter.

9. The method of claim 8 further comprising:
a. controlling the laser relative to the pattern to anneal the pattern to additionally produce additional pores, voids, and/or edge plane defects smaller than the porogen pores into the pattern;
b. wherein the additional pores, voids, and/or edge plane defects are on the approximate order of 2 μm or smaller in diameter.

10. The method of claim 1 wherein the exposing comprises heating the surface of the pattern with thermal energy effective to open up the surface at or near at least several solid-phase particles.

11. The method of claim 1 in a manner effective to enhance electro chemical surface area (ECSA) of the pattern.

12. The method of claim 1 wherein the engineered 3D porous electroactive architecture comprises an electrochemical surface area (ECSA) in an approximate range of 30 $mm^2$ to 65 $mm^2$.

13. The method of claim 1 in a manner effective to improve electrical properties of the pattern.

14. The method of claim 13 wherein the electroactive material is graphene or a graphene derivative and the improved electrical properties comprise on the approximate order of 10 KΩ to on approximate order of 1052.

15. The method of claim 1 further comprising implementing the engineered 3D porous electroactive architecture into:
a. electrode-based sensors;
b. supercapacitors;
c. batteries;
d. dye sensitive solar cells;
e. electrodes;
f. wearable or flexible electronics; or
g. textile-based electronics and biosensors.

16. The method of claim 1 wherein the step of patterning the solution-phase ink comprises:
a. creating a sacrificial negative of the pattern on the substrate, the negative of the pattern having negative pattern 3D features; and
b. adding the solution-phase ink with solid-phase particles on and between 3D features of the negative before reducing the solution-phase ink.

17. The method of claim 16 wherein the sacrificial negative of the pattern is:
a. inkjet printed; and
b. a sacrificial material.

18. The method of claim 16 wherein:
a. the solution-phase ink with the solid phase particles is applied after a first layer of solution without the solid phase particles is applied and reduced into a first layer;
b. the first layer is coated over the sacrificial negative of the pattern and the substrate around the sacrificial negative of the pattern; and
c. the first layer is baked in place to remove the solvent of the electroactive material and improve adherence of the electroactive material to the substrate.

19. The method of claim 18 further comprising removing the sacrificial negative of the pattern prior to the exposing step.

20. The method of claim 1 used to pattern electrodes on the substrate comprising:
a. forming a negative of the pattern for plural electrode shapes on the substrate with sacrificial material;
b. coating the negative and the substrate around the negative pattern with the solution-phase ink;
c. reducing the solution-phase ink to substantially the electroactive material and the solid phase particles;
d. removing the negative pattern to reveal the pattern of the plural electrode shapes;
e. annealing the pattern to expose openings to the solid phase particles;
f. removing the solid phase particles and opening up at least some of the porogen pores in the pattern.

21. The method of claim 1 used to pattern a supercapacitor on the substrate by:
a. forming a negative of plural IDE shapes on the substrate with sacrificial material;
b. coating the negative of plural IDE shapes and the substrate around the negative of plural IDE shapes with the solution-phase ink;
c. reducing the solution-phase ink to substantially the electroactive material and the solid phase particles;
d. removing the negative to reveal the pattern of the plural IDE shapes;
e. annealing the pattern to expose openings to at least some of the solid-phase particles;
f. removing at least some of the solid-phase particles and opening up the porogen pores in the pattern;
g. coating the pattern of plural IDE shapes with a dry electrolyte; and
h. electrically connecting the IDE shapes in series or parallel.

22. A method of making an electroactive circuit comprising:
a. forming on a substrate a pattern of solution-phase ink including electroactive material impregnated with solid-phase porogen particles, the formed pattern having a surface, and;
b. exposing at the surface of the formed pattern at least some of the solid-phase porogen particles without substantially changing the porogen arrangement in the pattern, wherein the exposing comprises controlling power, scan rate, and spot size of a laser relative to the pattern in a manner effective to both (i) etch the pattern along the surface of the formed pattern and (ii) anneal the pattern to additionally produce the engineered 3D porous electroactive architecture with additional pores, voids, and/or edge plane defects; and c. removing at least portions of the at least some exposed solid-phase porogen particles to leave porogen pores to increase the ECSA of the formed pattern.

23. The method of claim 22 further comprising operating the laser to also etch additional pores, voids, or defects and/or 3D edge plane defects smaller than the porogen pores, in the formed pattern.

24. The method of claim 22 wherein the removing at least some of the exposed solid-state particles comprises at least one of:

a. dislodging by thermal treatment or annealing by laser,
b. etching by the laser,
c. oven heating,
d. photonic treatment,
e. heating/annealing,
f. chemical etching methods with solutions of low concentrations of acids/solvents, or
g. dry etching to sufficiently degrade a superficial layer of the reduced electroactive material to release embedded porogens but not sufficiently strong to degrade underlying reduced electroactive material.

* * * * *